US012584023B2

(12) United States Patent
Kori et al.

(10) Patent No.: US 12,584,023 B2
(45) Date of Patent: Mar. 24, 2026

(54) COMPOSITION FOR FORMING ORGANIC FILM, PATTERNING PROCESS, AND COMPOUND

(71) Applicant: SHIN-ETSU CHEMICAL CO., LTD., Tokyo (JP)

(72) Inventors: Daisuke Kori, Joetsu (JP); Shohei Iwamori, Joetsu (JP)

(73) Assignee: Shin-Etsu Chemical Co., LTD., Tokyo (JP)

( * ) Notice: Subject to any disclaimer, the term of this patent is extended or adjusted under 35 U.S.C. 154(b) by 470 days.

(21) Appl. No.: 18/169,280

(22) Filed: Feb. 15, 2023

(65) Prior Publication Data

US 2023/0280655 A1 Sep. 7, 2023

(30) Foreign Application Priority Data

Mar. 3, 2022 (JP) ................................ 2022-033006

(51) Int. Cl.
*C09D 4/00* (2006.01)
*C07C 43/215* (2006.01)
(Continued)

(52) U.S. Cl.
CPC ............. *C09D 4/00* (2013.01); *G03F 7/0048* (2013.01); *G03F 7/0752* (2013.01); *G03F 7/091* (2013.01);
(Continued)

(58) Field of Classification Search
CPC ........................................................ C09D 4/00
See application file for complete search history.

(56) References Cited

U.S. PATENT DOCUMENTS 11,917,843 B2 * 2/2024 Ji ......................... C07D 519/00
2002/0106909 A1 8/2002 Kato et al.
(Continued)

FOREIGN PATENT DOCUMENTS

JP H06-118651 A 4/1994
JP 2002-334869 A 11/2002
(Continued)

OTHER PUBLICATIONS

Machine translation of JP 2006-076995 (no date) (Year: 0000).*
(Continued)

*Primary Examiner* — Amanda C. Walke
(74) *Attorney, Agent, or Firm* — Oliff PLC

(57) ABSTRACT

A composition for forming an organic film, including: a compound represented by the following general formula (1); and an organic solvent, wherein in the general formula (1), X represents any one group of X1 to X3 represented by the following general formulae (2), (3), and (5), and two or more kinds of X are optionally used in combination, wherein in the general formula (3), W represents a carbon atom or a nitrogen atom; "n1" represents 0 or 1; "n2" represents an integer of 1 to 3; and $R_1$ independently represents any one of groups represented by the following general formula (4),
(Continued)

and wherein in the general formula (5), $R_2$ represents a hydrogen atom or an alkyl group having 1 to 4 carbon atoms; and $R_3$ represents any one of the following groups.

(1)

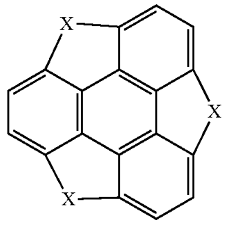

(2)

X1 =

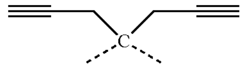

(3)

X2 =

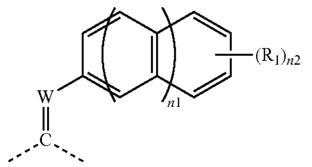

(4)

$R_1$ =

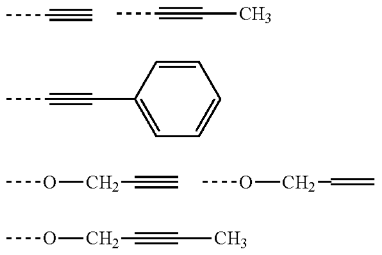

(5)

X3 =

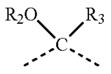

$R_3$ =

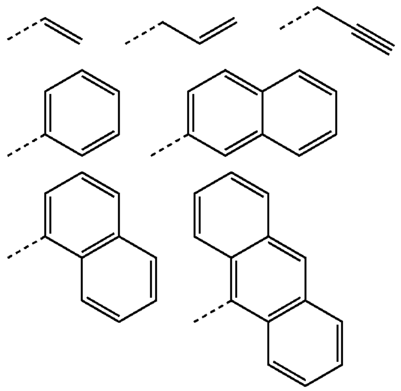

-continued

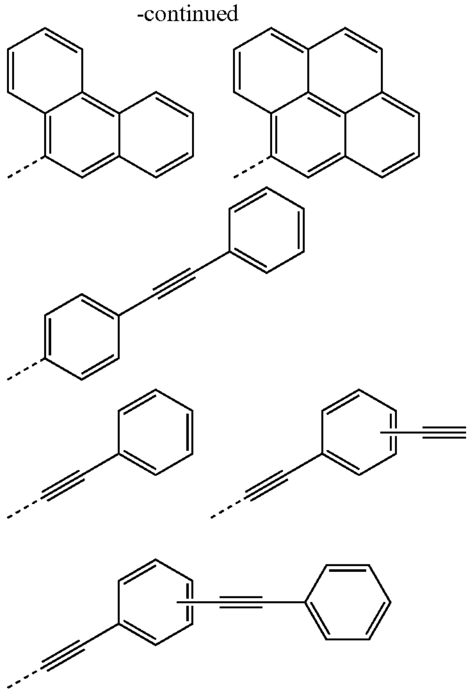

20 Claims, 2 Drawing Sheets

(51) Int. Cl.

| | |
|---|---|
| ***G03F 7/004*** | (2006.01) |
| ***G03F 7/075*** | (2006.01) |
| ***G03F 7/09*** | (2006.01) |
| ***G03F 7/16*** | (2006.01) |
| ***G03F 7/20*** | (2006.01) |
| ***G03F 7/26*** | (2006.01) |

(52) U.S. Cl.

CPC ............ *G03F 7/167* (2013.01); *G03F 7/2004* (2013.01); *G03F 7/2016* (2013.01); *G03F 7/2043* (2013.01); *G03F 7/26* (2013.01)

(56) References Cited

U.S. PATENT DOCUMENTS

| | | | | |
|---|---|---|---|---|
| 2005/0255712 | A1 | 11/2005 | Kato et al. | |
| 2006/0019195 | A1 | 1/2006 | Hatakeyama et al. | |
| 2006/0204891 | A1 | 9/2006 | Hatakeyama | |
| 2009/0274978 | A1 | 11/2009 | Ohashi et al. | |
| 2010/0035181 | A1 | 2/2010 | Sakaguchi et al. | |
| 2010/0099044 | A1 | 4/2010 | Hatakeyama et al. | |
| 2013/0302990 | A1 | 11/2013 | Watanabe et al. | |
| 2014/0246400 | A1 | 9/2014 | Higashihara et al. | |
| 2016/0016872 | A1 | 1/2016 | Aqad et al. | |
| 2018/0046078 | A1 | 2/2018 | Karasawa et al. | |
| 2019/0036059 | A1* | 1/2019 | Ji ......................... | C07D 487/22 |
| 2020/0317855 | A1* | 10/2020 | Korovina .............. | C07C 43/215 |
| 2021/0011384 | A1 | 1/2021 | Kori et al. | |

FOREIGN PATENT DOCUMENTS

| | | | |
|---|---|---|---|
| JP | 2004-205685 | A | 7/2004 |
| JP | 2005-128509 | A | 5/2005 |
| JP | 2005-250434 | A | 9/2005 |
| JP | 2006-076995 | A | 3/2006 |
| JP | 2006-227391 | A | 8/2006 |
| JP | 2006-285095 | A | 10/2006 |

(56) References Cited

FOREIGN PATENT DOCUMENTS

| | | | |
|---|---|---|---|
| JP | 2006-293298 | A | 10/2006 |
| JP | 2007-199653 | A | 8/2007 |
| JP | 2008-158002 | A | 7/2008 |
| JP | 2008-164806 | A | 7/2008 |
| JP | 2009-269953 | A | 11/2009 |
| JP | 2010-122656 | A | 6/2010 |
| JP | 2013-253227 | A | 12/2013 |
| JP | 2021-163558 | A | 10/2021 |
| WO | 2004/066377 | A1 | 8/2004 |
| WO | 2008/126804 | A1 | 10/2008 |
| WO | 2013/047106 | A1 | 4/2013 |
| WO | 2016/143436 | A1 | 9/2016 |

OTHER PUBLICATIONS

Oct. 22, 2024 Office Action issued in Japanese Patent Application No. 2022-033006.
May 12, 2025 Office Action issued in Chinese Patent Application No. 202310197024.X.
Jul. 20, 2023 Extended Search Report issued in European Patent Application No. 23156921.1.

* cited by examiner

[FIG. 1]
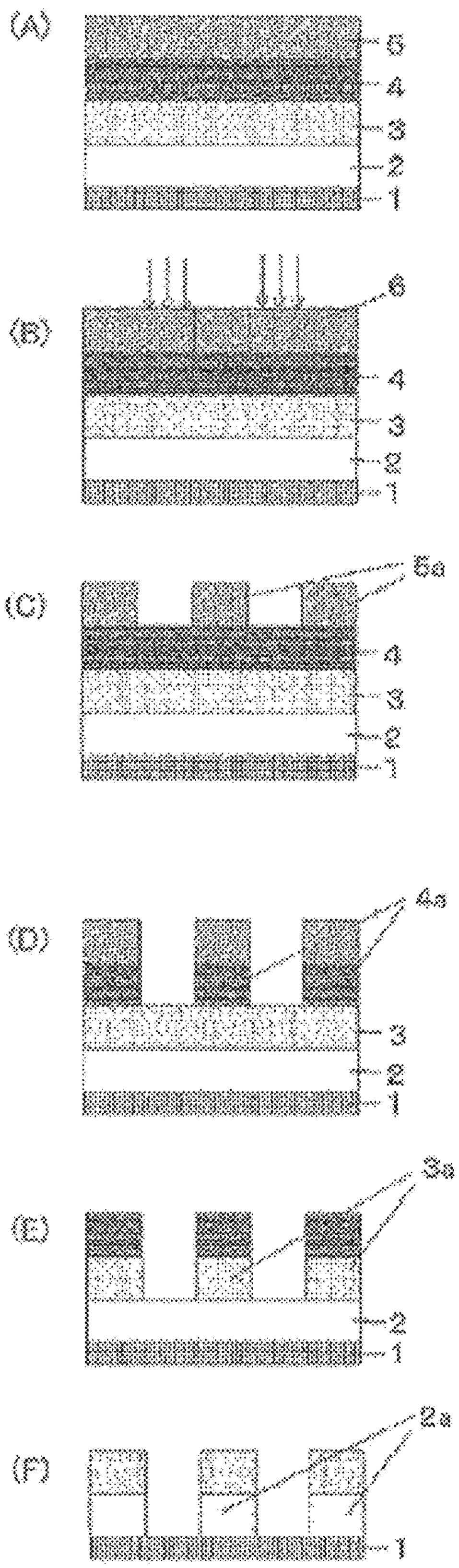

[FIG. 2]
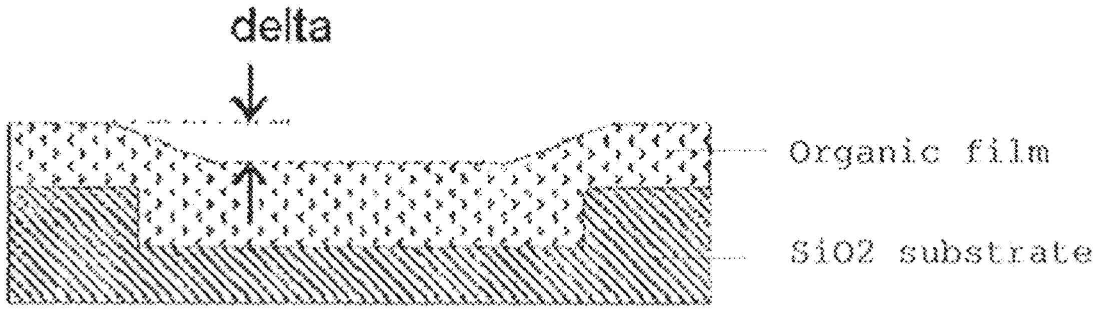

COMPOSITION FOR FORMING ORGANIC FILM, PATTERNING PROCESS, AND COMPOUND

TECHNICAL FIELD

The present invention relates to a composition for forming an organic film, a patterning process using this composition, and a compound contained in this composition.

BACKGROUND ART

In recent requirement of a finer pattern rule with higher integration and higher speed of semiconductor devices, various technical developments have been made in lithography using light exposure, used as a common technology at present, about how finer and more precise pattern is processed relative to the used light source.

As the light source for lithography used in the resist pattern formation, light exposure using a light source of g-line (436 nm) or i-line (365 nm) of a mercury lamp is widely used for portions having a lower integration degree. Meanwhile, practically used for portions having a higher integration degree and requiring finer patterns are lithography using KrF excimer laser (248 nm) and ArF excimer laser (193 nm), which have a shorter wavelength. In the latest generation requiring further finer patterns, lithography with extreme ultraviolet ray (EUV, 13.5 nm) is approaching the practical use.

It is well known that such a finer resist pattern line enlarges the ratio of the pattern height to the pattern line width (aspect ratio) in a single-layer resist method, which is used as a typical resist patterning process, leading to pattern collapse due to the surface tension of a developing liquid during development. A multilayer resist method, which stacks films having different dry etching characteristics to form a pattern, is known to be excellent for forming a pattern with a high aspect ratio on a stepped substrate. Developed is a two-layer resist method combining: a photoresist upper layer film of a silicon-containing photosensitive polymer; and an organic film of an organic polymer having carbon, hydrogen, and oxygen as major constituent elements, for example a novolac-type polymer (Patent Document 1, etc.). Also developed is a three-layer resist method combining: a photoresist upper layer film of an organic photosensitive polymer used for the single layer resist method; a silicon-containing resist intermediate film of a silicon-based polymer or a silicon-based CVD film; and an organic film of an organic polymer (Patent Document 2, etc.).

In this three-layer resist method, a pattern in the photoresist upper layer film is transferred to the silicon-containing resist intermediate film using a fluorocarbon-based dry etching gas. Then, while using this pattern as a mask, the pattern is transferred to the organic film having carbon and hydrogen as major constituent elements (organic underlayer film) by dry etching with an oxygen-containing gas. Thereafter, while using this pattern as a mask, the pattern is transferred to a body to be processed by dry etching. However, in a semiconductor device manufacturing process after 20-nm generation, transferring the pattern to the body to be processed while using the pattern of this organic film as a hard mask by dry etching causes a phenomenon of twisting or bending of the organic film pattern.

A carbon hard mask formed immediately on the body to be processed is commonly an amorphous carbon (hereinafter, "CVD-C") film produced by a CVD method using methane gas, ethane gas, acetylene gas, etc. as a raw material. This CVD-C film, which can extremely reduce hydrogen atoms in the film, is known to be remarkably effective to the above twisting or bending of the pattern. Meanwhile, when the body to be processed being a base has a step, it is also known for the CVD-C film to be difficult to flatly embed such a step because of characteristics of the CVD process. Thus, embedding the stepped body to be processed with the CVD-C film and then patterning with a photoresist cause a step on the photoresist-coated surface due to the step of the body to be processed to cause ununiform film thickness of the photoresist, resulting in deterioration of a focus tolerance and pattern shape during the lithography.

Meanwhile, the organic film as the carbon hard mask formed immediately on the body to be processed formed by a spin-coating method is known to have an advantage that the step of the stepped substrate can be flatly embedded. The substrate planarized with this organic film material can inhibit change in the film thickness of the silicon-containing resist intermediate film or the photoresist upper layer film formed thereon, and can expand the focus tolerance of the lithography to form a regular pattern.

Accordingly, there have been demand for: an organic film material that can form an organic film that can form a film having high etching resistance during the dry etching process of the body to be processed and being a highly planarized film on the body to be processed by a spin-coating method; and a method for forming the organic film.

Conventionally known organic film materials include condensed resins, as a material for forming an organic film for a multilayer resist method, using carbonyl compounds, such as ketones and aldehydes, and aromatic alcohols as a condensing agent to phenol-based or naphthol-based compounds. Examples thereof include a fluorene-bisphenol novolac resin described in Patent Document 2, a bisphenol compound and a novolac resin thereof described in Patent Document 3, a novolac resin of an adamantane phenol compound described in Patent Document 4, and a bisnaphthol compound and a novolac resin thereof described in Patent Document 5. The main skeleton of the resin used for such materials is constituted with naphthalene, fluorene, adamantane, etc., which have a high carbon density. However, such materials have oxygen atom derived from the phenolic hydroxy group in the constitution unit, and thereby deterioration in the etching resistance is inevitable.

As a resin for an organic film material that has no heteroatom, such as oxygen, to avoid the deterioration in the etching resistance, a resin having a fluorene structure described in Patent Document 6 is exemplified. However, the resin itself does not contribute to thermal curing, and for forming a cured film, a composition in which a crosslinker, such as a methylol compound, is added is used to form a cured film. Thus, even if the carbon content in the resin is increased, a low carbon-content crosslinker, such as a methylol compound, is needed to be used. There is a problem of deterioration in the etching resistance that the high carbon-content resin originally has.

As an organic film material containing no additive such as a crosslinker, which is a deterioration factor of the etching resistance, and having no heteroatom such as oxygen to improve the etching resistance, an organic film material using a monomolecular compound described in Patent Document 7 is exemplified. However, using a monomolecular compound causes problems of coatability on a substrate having a complex shape and a sublimate derived from the low molecular weight during the baking, which remain a problem of characteristics of the organic film after the curing, such as heat resistance and the etching resistance.

Although various fullerene derivatives, described in Patent Documents 8 and 9, have been investigated to increase the carbon density to the maximum, the fullerene itself has no curability, and has difficulty in film formability due to the problem of solvent solubility. Thus, applying the fullerene essentially requires adding a resin or a crosslinker, and in addition, introducing various substituents, etc. to improve the solvent solubility. The decrease in the carbon density and deterioration in the heat resistance due to the substituent introduction become considerable problems for application to the organic film material.

CITATION LIST

Patent Literature

Patent Document 1: JP H6-118651 A
Patent Document 2: JP 2005-128509 A
Patent Document 3: JP 2006-293298 A
Patent Document 4: JP 2006-285095 A
Patent Document 5: JP 2010-122656 A
Patent Document 6: WO 2013/047106
Patent Document 7: JP 2008-164806 A
Patent Document 8: WO 2008/126804
Patent Document 9: WO 2016/143436

SUMMARY OF INVENTION

Technical Problem

The present invention have been made to solve the above problems. An object of the present invention is to provide: a composition for forming an organic film that can exhibit high etching resistance and excellent twisting resistance without impairing the original carbon content of the resin by using a compound having a high carbon content and thermal curability, that has film formability, and that causes reduced sublimate component to be an out gas; a patterning process using this composition; and a compound-suitable for such a composition for forming an organic film.

Solution to Problem

To achieve the above object, the present invention provides a composition for forming an organic film, comprising: a compound represented by the following general formula (1); and an organic solvent, (1)

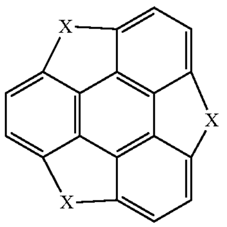

wherein in the general formula (1), X represents any one group of X1 to X3 represented by the following general formulae (2), (3), and (5), and two or more kinds of X are optionally used in combination, (2)

X1 =

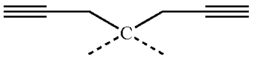

(3)

X2 =

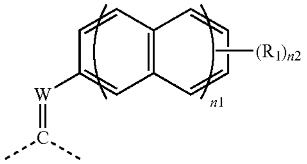

wherein in the general formula (3), W represents a carbon atom or a nitrogen atom; "n1" represents 0 or 1; "n2" represents an integer of 1 to 3; and $R_1$ independently represents any one of groups represented by the following general formula (4), and (4)

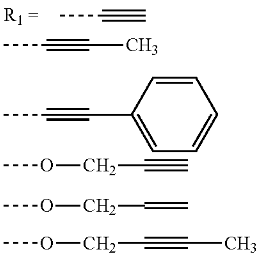

(5)

X3 =

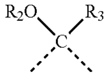

wherein in the general formula (5), $R_2$ represents a hydrogen atom or an alkyl group having 1 to 4 carbon atoms; and $R_3$ represents any one of the following groups.

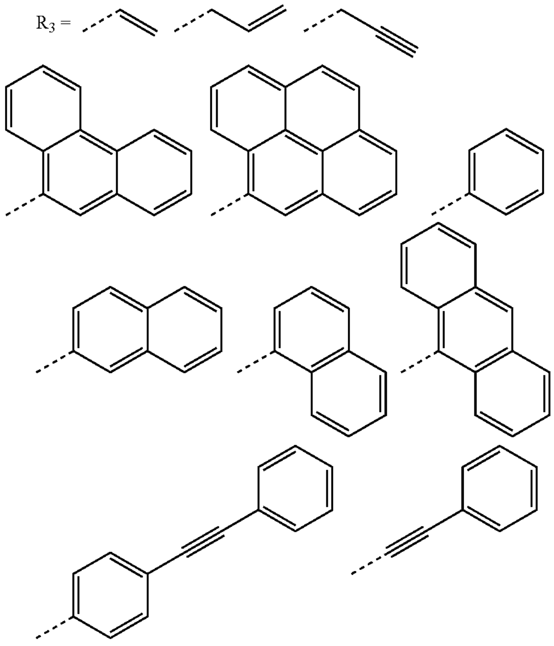

-continued

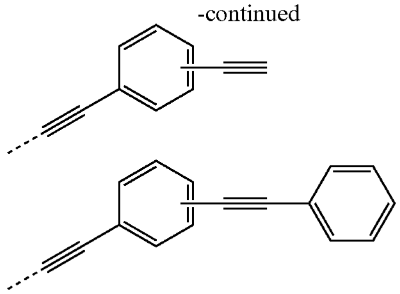

Such a composition for forming an organic film, which has a high carbon content, can exhibit high etching resistance and excellent twisting resistance without impairing the original carbon content of the resin, and can provide a composition for forming an organic film having film formability and causing reduced sublimate component to be out gas.

The compound represented by the general formula (1) preferably satisfies $1.00 \leq Mw/Mn \leq 1.15$ where Mw is a weight-average molecular weight and Mn is a number-average molecular weight measured by gel permeation chromatography in terms of polystyrene.

Such a composition for forming an organic film can form an organic film having excellent embedding ability and planarization.

The organic solvent is preferably a mixture of: one or more kinds of organic solvent having a boiling point of lower than 180° C.; and one or more kinds of organic solvent having a boiling point of 180° C. or higher.

Such a composition for forming an organic film can yield a composition for forming an organic film having high embedding/planarizing ability with imparting thermal flowability of the organic film by adding the high boiling-point organic solvent into the compound represented by the general formula (1).

The composition for forming an organic film preferably further comprises at least one of a surfactant and a plasticizer.

Such a composition for forming an organic film has further excellent coatability and embedding/planarizing ability.

The present invention can also provide a patterning process, comprising: forming an organic film on a body to be processed by using the above composition for forming an organic film; forming a silicon-containing resist intermediate film on the organic film by using a silicon-containing resist intermediate film material; forming a resist upper layer film on the silicon-containing resist intermediate film by using a photoresist composition; forming a circuit pattern in the resist upper layer film; transferring the pattern to the silicon-containing resist intermediate film by etching while using the resist upper layer film having the formed pattern as a mask; transferring the pattern to the organic film by etching while using the silicon-containing resist intermediate film having the transferred pattern as a mask; and further forming a pattern to the body to be processed by etching while using the organic film having the transferred pattern as a mask.

Such a patterning process of the three-layer resist process can form a fine pattern to the body to be processed with high precision.

The present invention can also provide a patterning process, comprising: forming an organic film on a body to be processed by using the above composition for forming an organic film; forming a silicon-containing resist intermediate film on the organic film by using a silicon-containing resist intermediate film material; forming an organic anti-reflective film, BARC, on the silicon-containing resist intermediate film; forming a resist upper layer film on the BARC by using a photoresist composition to form a four-layer film structure; forming a circuit pattern in the resist upper layer film; transferring the pattern to the BARC film and the silicon-containing resist intermediate film by etching while using the resist upper layer film having the formed pattern as a mask; transferring the pattern to the organic film by etching while using the silicon-containing resist intermediate film having the transferred pattern as a mask; and further forming a pattern to the body to be processed by etching the body to be processed while using the organic film having the transferred pattern as a mask.

Such a patterning process of the four-layer resist process can form a fine pattern to the body to be processed with further higher precision.

The present invention can also provide a patterning process, comprising: forming an organic film on a body to be processed by using the above composition for forming an organic film; forming an inorganic hard mask selected from a silicon oxide film, a silicon nitride film, and a silicon oxynitride film on the organic film; forming a resist upper layer film on the inorganic hard mask by using a photoresist composition; forming a circuit pattern in the resist upper layer film; transferring the pattern to the inorganic hard mask by etching while using the resist upper layer film having the formed pattern as a mask; transferring the pattern to the organic film by etching while using the inorganic hard mask having the transferred pattern as a mask; and further forming a pattern to the body to be processed by etching the body to be processed while using the organic film having the transferred pattern as a mask.

Such a patterning process of the three-layer resist process can form a fine pattern to the body to be processed with high precision.

The present invention can further provide a patterning process, comprising: forming an organic film on a body to be processed by using the above composition for forming an organic film; forming an inorganic hard mask selected from a silicon oxide film, a silicon nitride film, and a silicon oxynitride film on the organic film; forming an organic anti-reflective film, BARC, on the inorganic hard mask; forming a resist upper layer film on the BARC by using a photoresist composition to form a four-layer film structure; forming a circuit pattern in the resist upper layer film; transferring the pattern to the BARC film and the inorganic hard mask by etching while using the resist upper layer film having the formed pattern as a mask; transferring the pattern to the organic film by etching while using the inorganic hard mask having the transferred pattern as a mask; and further forming a pattern to the body to be processed by etching the body to be processed while using the organic film having the transferred pattern as a mask.

Such a patterning process of the four-layer resist process can form a fine pattern to the body to be processed with further higher precision.

The inorganic hard mask is preferably formed by a CVD method or an ALD method.

Forming the inorganic hard mask by a CVD method or an ALD method can form a fine pattern to the body to be processed with further higher precision.

The circuit pattern is preferably formed by a photolithography using light having a wavelength of 10 nm or more and 300 nm or less, a direct writing with electron beam, nanoimprinting, or a combination thereof.

Using such a circuit patterning process can form a fine pattern to the body to be processed with further higher precision.

The circuit pattern is preferably developed with an alkaline development or an organic solvent.

Using such a circuit patterning process can form a fine pattern to the body to be processed with further higher precision.

In forming the circuit pattern, the body to be processed is preferably a semiconductor device substrate, a metal film, a metal carbide film, a metal oxide film, a metal nitride film, a metal oxycarbide film, or a metal oxynitride film.

Using such a body to be processed can form a better pattern.

In forming the circuit pattern, the metal is preferably silicon, titanium, tungsten, hafnium, zirconium, chromium, germanium, copper, silver, gold, aluminum, indium, gallium, arsenic, palladium, iron, tantalum, iridium, molybdenum, or an alloy thereof.

Using such a metal for the body to be processed can form a better pattern.

The present invention also provides a compound represented by the following general formula (1), (1)

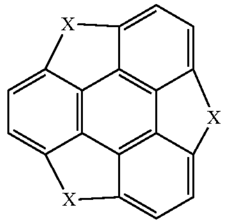

wherein in the general formula (1), X represents any one group of X1 to X3 represented by the following general formulae (2), (3), and (5), and two or more kinds of X are optionally used in combination, (2)

X1 = 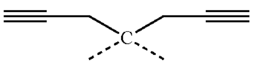

(3)

X2 = 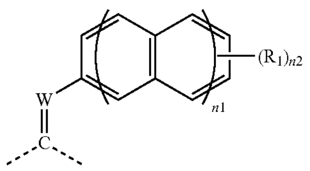

wherein in the general formula (3), W represents a carbon atom or a nitrogen atom; "n1" represents 0 or 1; "n2" represents an integer of 1 to 3; and $R_1$ independently represents any one of groups represented by the following general formula (4), and (4)

$R_1$ = 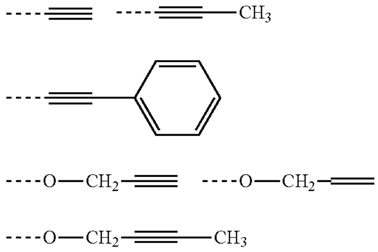

(5)

X3 = 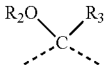

wherein in the general formula (5), $R_2$ represents a hydrogen atom or an alkyl group having 1 to 4 carbon atoms; and $R_3$ represents any one of the following groups.

$R_3$ = 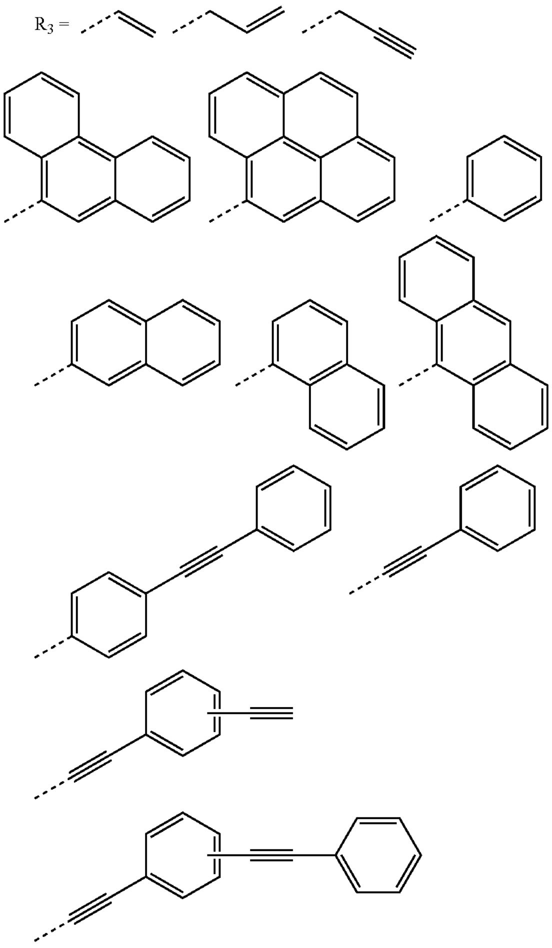

Such a compound, which has a high carbon content, can exhibit high etching resistance and excellent twisting resistance without decreasing the original carbon content of the resin, and can provide a compound suitable for a composition for forming an organic film having film formability and causing reduced sublimate component to be out gas.

Advantageous Effects of Invention

A typical sumanene derivative, which corresponds to a cap structure of fullerenes or carbon nanotube, has a property of easily forming a two-dimensional molecular aggregation by stacking the sumanene molecules each other with a curved structure that the sumanene structure has. The composition for forming an organic film containing the sumanene derivative represented by the general formula (1), provided with solubility in an organic solvent and thermal curability due to the property of easily forming the molecular aggregation and the substituent represented by X, can form a dense, tough carbon film. Therefore, when the organic film formed with the inventive composition for forming an organic film is used as an organic film for a resist, the organic film has excellent dry etching resistance and twisting resistance.

The inventive sumanene derivative has thermal curability and is constituted with a condensed aromatic ring structure with a high carbon content, which corresponds to a partial structure of fullerene. Thus, the inventive sumanene derivative is a component to provide a composition for forming an organic film that can form an organic film having both high twisting resistance and dry etching resistance. Furthermore, these sumanene derivatives are promising not only for usage of a compound for the resist organic film material but also for usage of a next-generation material such as a molecular semiconductor based on its property of easily forming the molecular aggregation.

As described above, the inventive compound, which is a dense carbon compound constituted with the sumanene structure as a main skeleton, is a compound useful for forming an organic film having excellent etching resistance and twisting resistance. In addition, the inventive composition for forming an organic film containing this compound is a material useful for forming an organic film having all of excellent etching resistance and twisting resistance, and properties such as heat resistance and embedding/planarizing ability. Therefore, the inventive composition is extremely useful as a resist organic film material in a multilayer resist process such as: a two-layer resist process; a three-layer resist process using a silicon-containing resist intermediate film; or a four-layer resist process using a silicon-containing resist intermediate film and an organic anti-reflective film (BARC), for example. Furthermore, the inventive patterning process can form a fine pattern to a substrate to be processed with high precision in the multilayer resist process.

BRIEF DESCRIPTION OF DRAWINGS

FIG. 1 is a process view illustrating an example of the inventive patterning process.

FIG. 2 is a sectional view illustrating an example of an organic film formed by applying the inventive composition for forming an organic film on a $SiO_2$ wafer substrate having a trench pattern.

DESCRIPTION OF EMBODIMENTS

As noted above, there have been demands for the developments of: a composition for forming an organic film having high etching resistance and excellent twisting resistance, and further having excellent embedding ability and planarizing ability to a substrate; a patterning process using this composition; and a compound suitable for such a composition for forming an organic film.

The present inventors have earnestly studied the above object, and consequently found that introducing a specific partial structure into sumanene can impart thermal curability and solubility in an organic solvent. Furthermore, the present inventors have found that a composition for forming an organic film containing the above compound and an organic solvent forms an organic film having excellent etching resistance and twisting resistance, and having all properties such as heat resistance, embedding/planarizing ability, film formability, and reduced sublimate component. These findings have led to the completion of the present invention.

Specifically, the present invention is a composition for forming an organic film, comprising: a compound represented by the following general formula (1); and an organic solvent, (1)

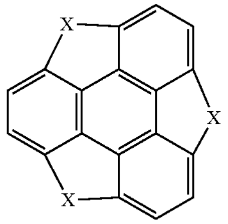

wherein in the general formula (1), X represents any one group of X1 to X3 represented by the following general formulae (2), (3), and (5), and two or more kinds of X are optionally used in combination, (2)

X1 = 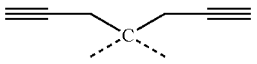

(3)

X2 = 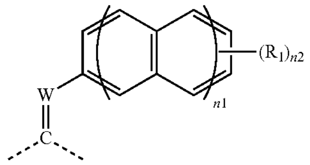

wherein in the general formula (3), W represents a carbon atom or a nitrogen atom; "n1" represents 0 or 1; "n2" represents an integer of 1 to 3; and $R_1$ independently represents any one of groups represented by the following general formula (4), and (4)

$R_1$ = 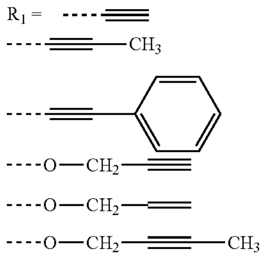

-continued (5)

X3 = 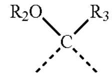

wherein in the general formula (5), $R_2$ represents a hydrogen atom or an alkyl group having 1 to 4 carbon atoms; and $R_3$ represents any one of the following groups.

$R_3$ = 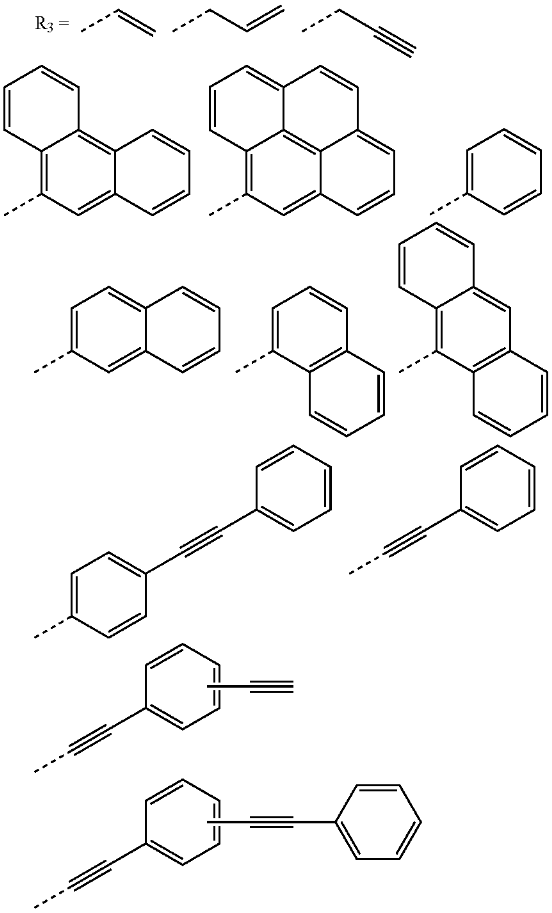

Hereinafter, the present invention will be described in detail, but the present invention is not limited thereto.

[Compound]

The inventive composition for forming an organic film contains a compound represented by the following general formula (1), (1)

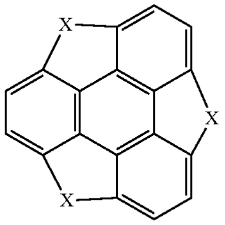

wherein in the general formula (1), X represents any one group of X1 to X3 represented by the following general formulae (2), (3), and (5), and two or more kinds of X are optionally used in combination, (2)

X1 = 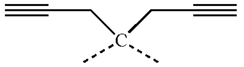

(3)

X2 = 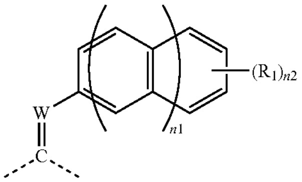

wherein in the general formula (3), W represents a carbon atom or a nitrogen atom; "n1" represents 0 or 1; "n2" represents an integer of 1 to 3; and $R_1$ independently represents any one of groups represented by the following general formula (4), and (4)

$R_1$ = 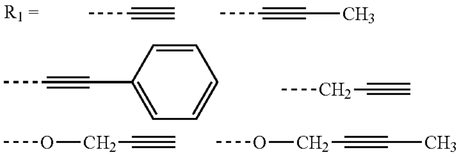

(5)

X3 = 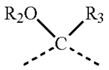

wherein in the general formula (5), $R_2$ represents a hydrogen atom or an alkyl group having 1 to 4 carbon atoms; and $R_3$ represents any one of the following groups.

$R_3$ = 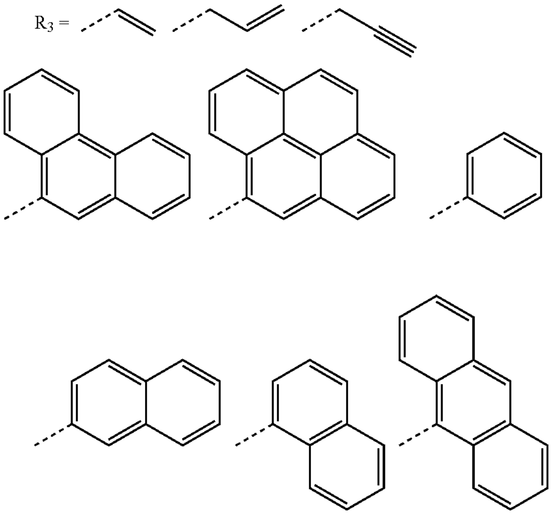

-continued

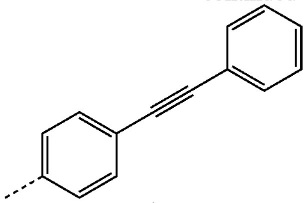

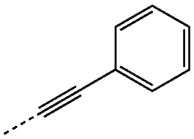

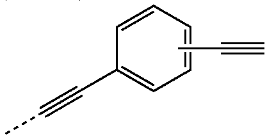

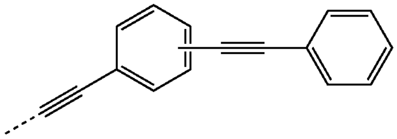

When the partial structure represented by X in the general formula (1) is X1, the partial structure represents a structure represented by the following formula (2). This partial structure is preferable from the viewpoints of imparting curability, solvent solubility, and etching resistance.

(2)

X1 =

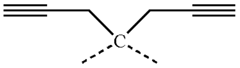

X2 among the partial structures represented by X in the general formula (1) is represented by the general formula (3), and specific examples thereof include the following structures. The aromatic ring constituting these structures optionally has a substituent thereon, and examples of the substituent include a hydroxy group, a methyl group, a methoxy group, a nitro group, a halogen group, and a trifluoromethyl group. Among the following X2, the partial structure preferably satisfies n1=1 and has the substituent represented by $R_1$ being an ethynyl group or an ethynylphenyl group, from the viewpoint of etching resistance.

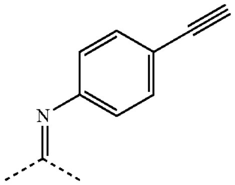

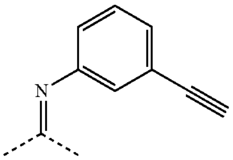

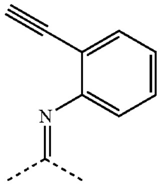

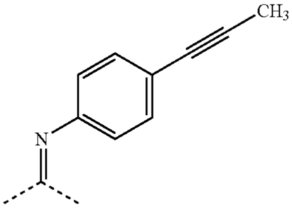

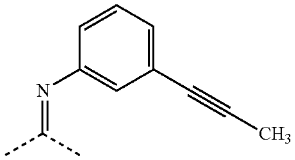

-continued

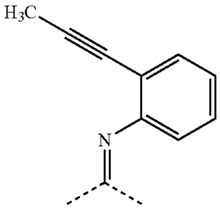

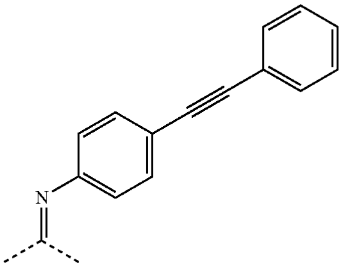

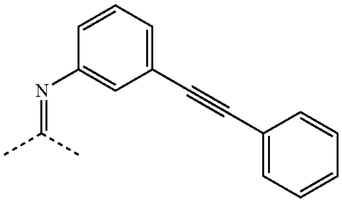

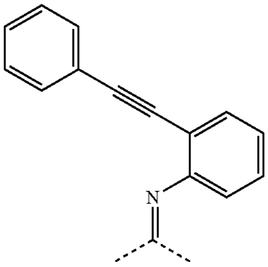

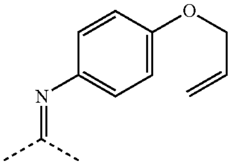

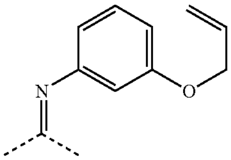

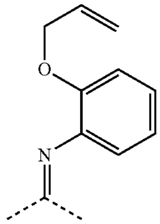

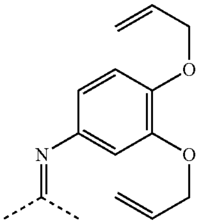

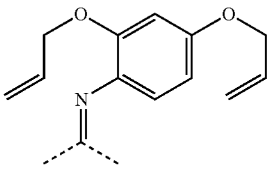

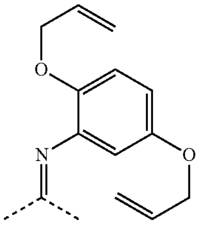

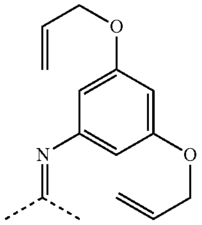

-continued
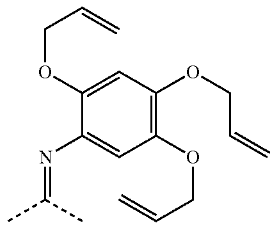
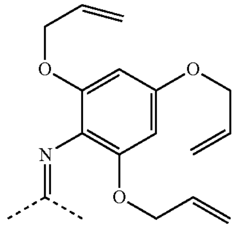
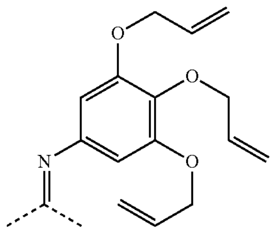
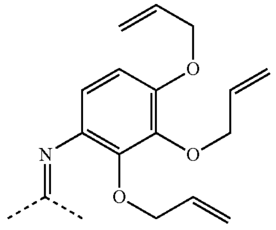
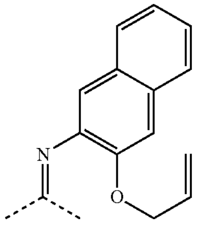
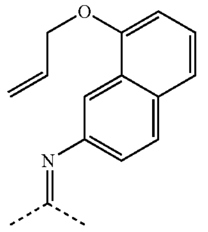
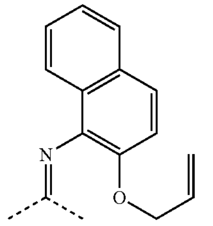
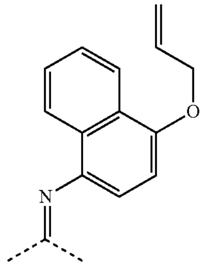
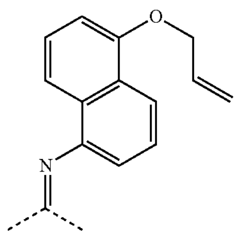
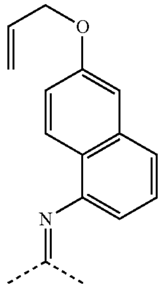
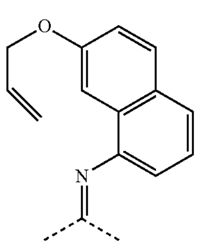
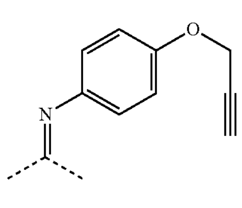
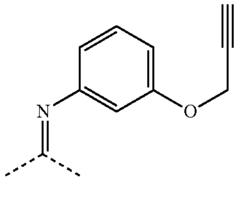
-continued
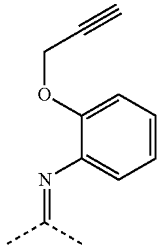
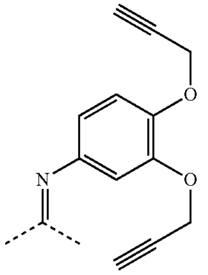
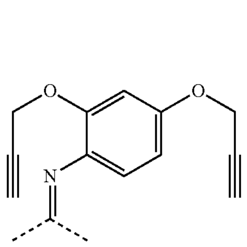
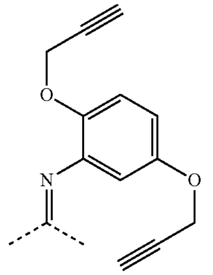
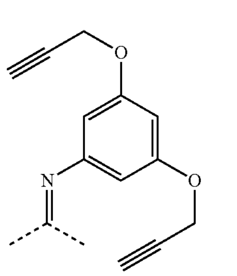
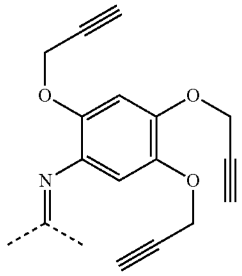
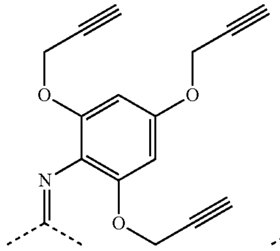
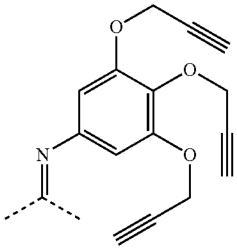
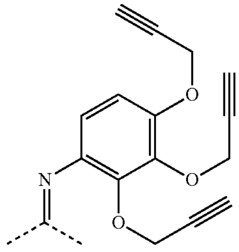
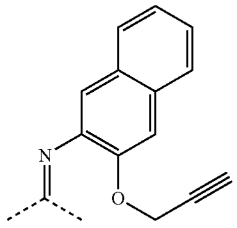
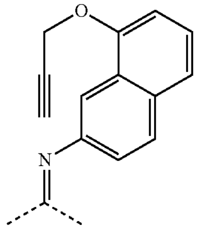
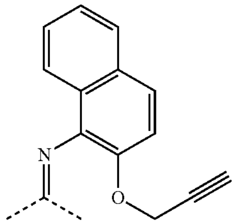

-continued
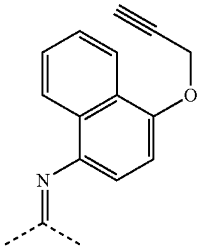
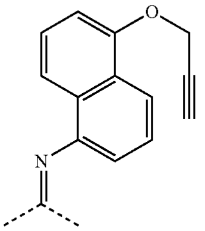
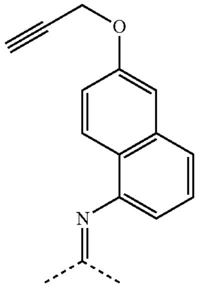
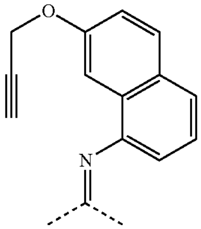
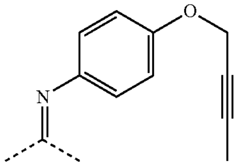
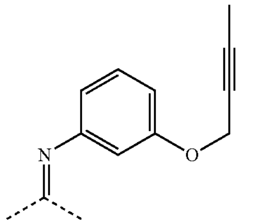
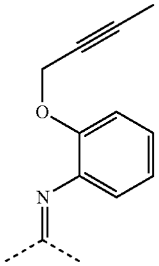
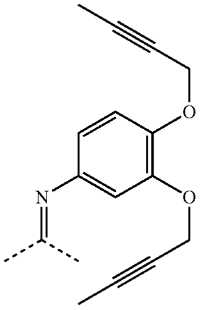
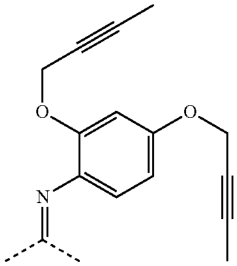
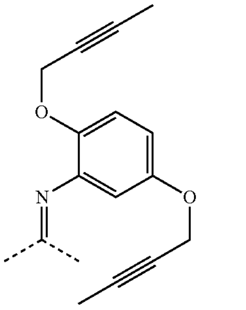
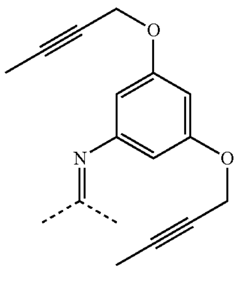
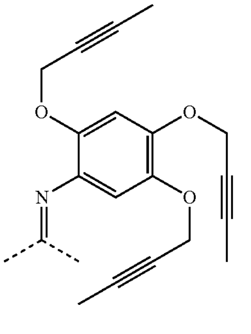
-continued
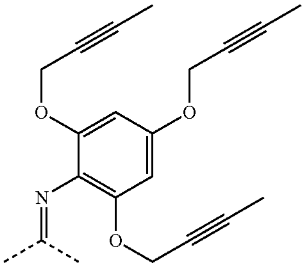
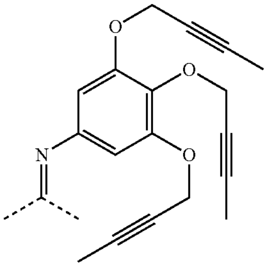
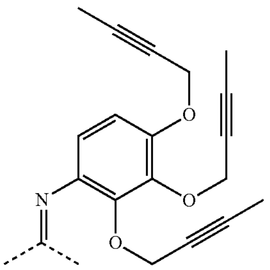
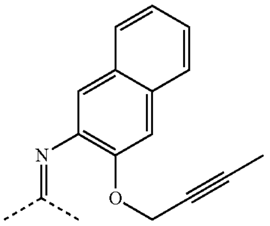
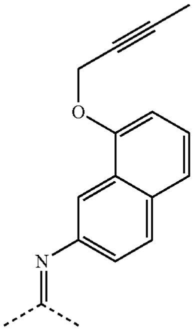
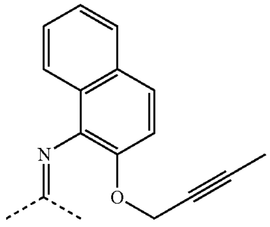
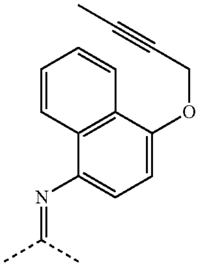
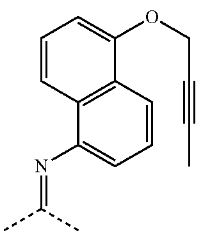

-continued
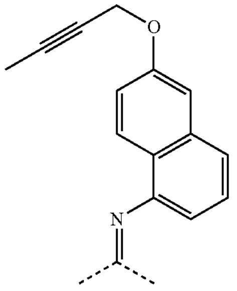
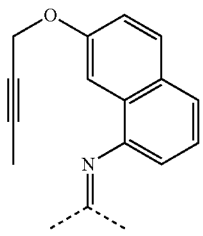
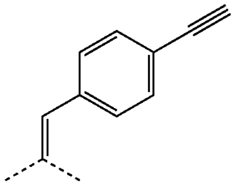
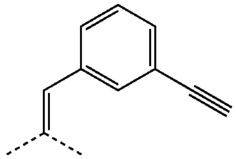
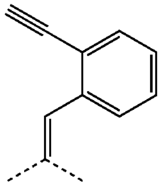
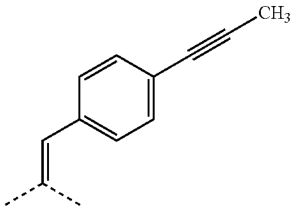
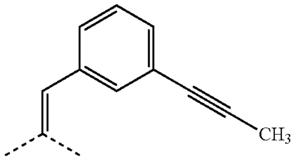
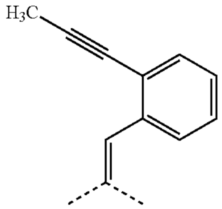
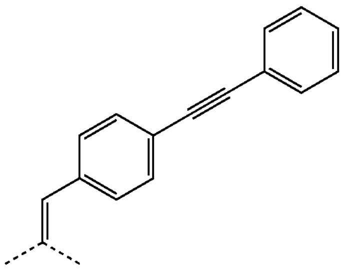
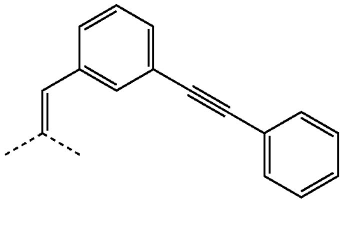
-continued
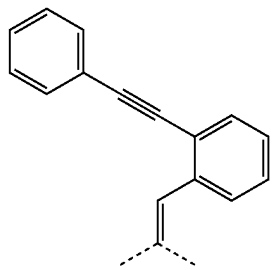
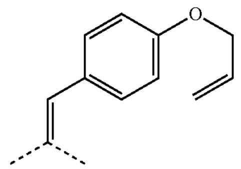
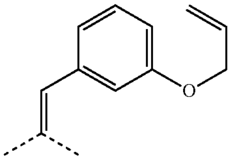
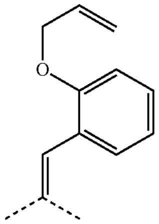
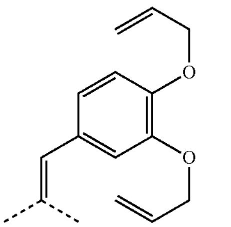
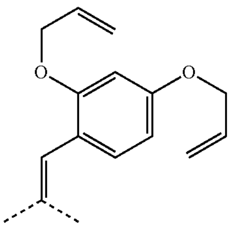
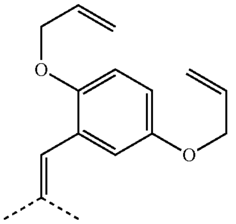
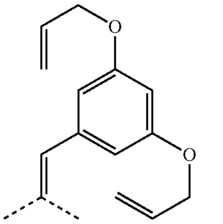
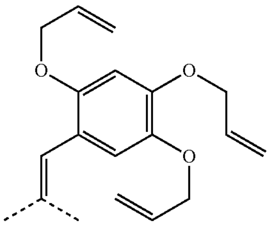
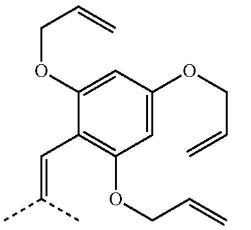
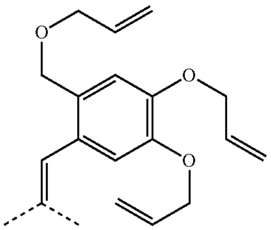
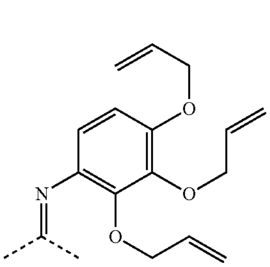
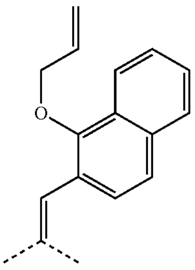

-continued
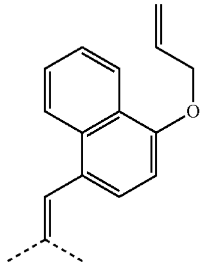
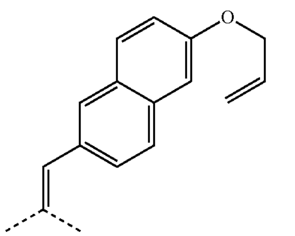
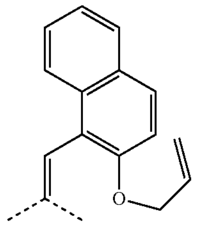
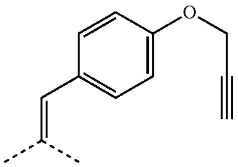
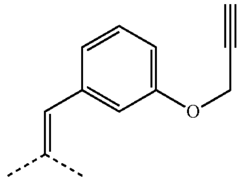
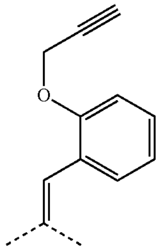
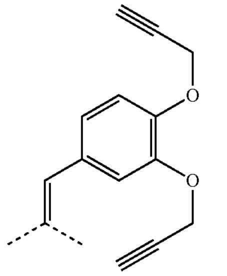
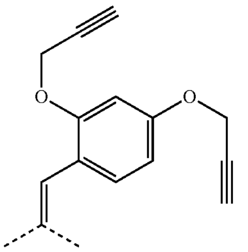
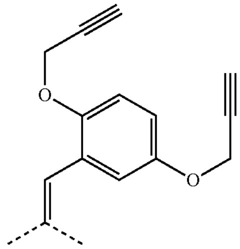
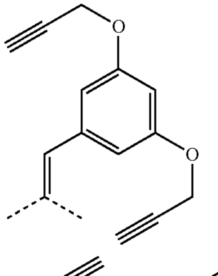
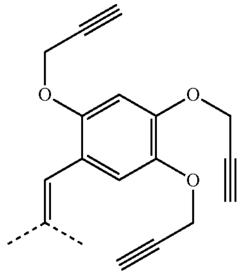
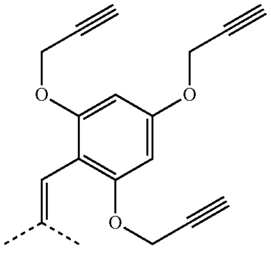
-continued
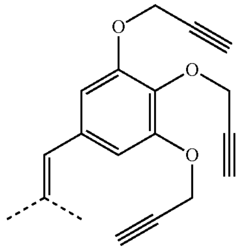
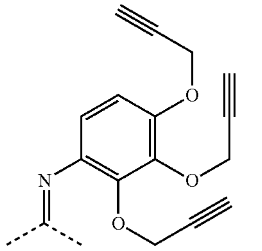
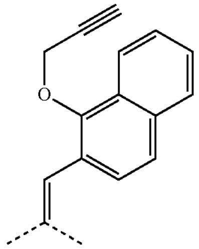
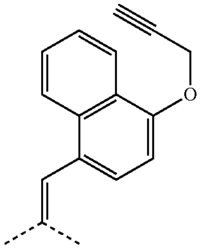
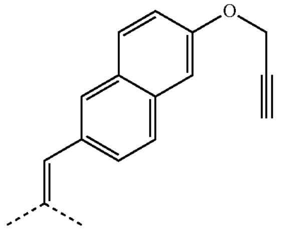
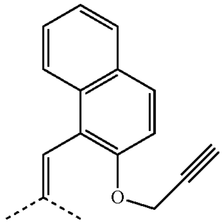
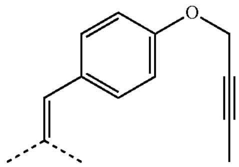
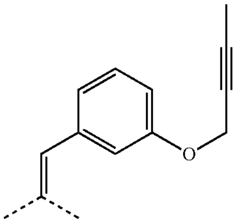
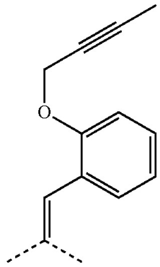
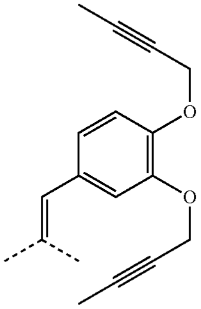
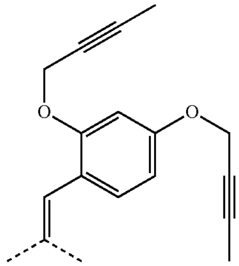
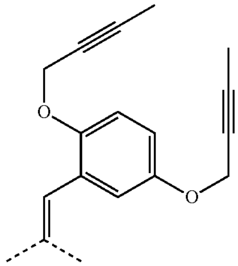

-continued

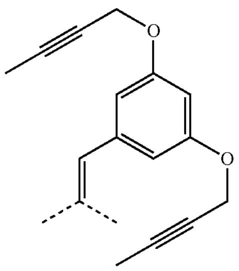

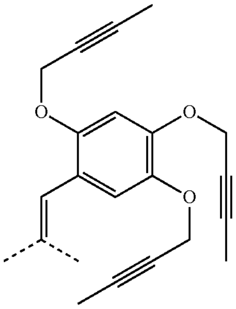

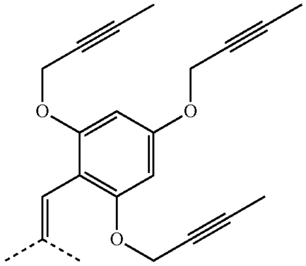

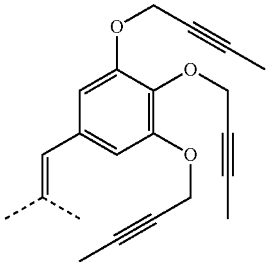

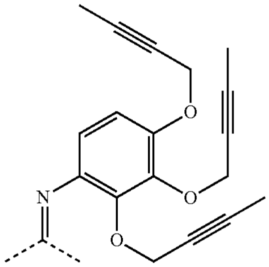

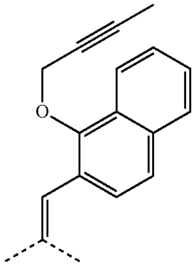

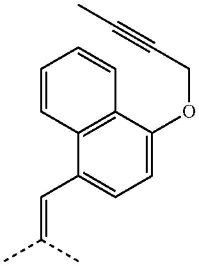

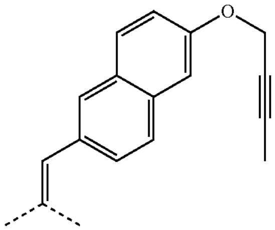

-continued

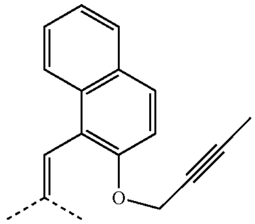

X3 among the partial structures represented by X in the general formula (1) is represented by the general formula (5), and specific examples thereof include the following structures. When these constituents has an aromatic ring, the aromatic ring optionally has a substituent thereon, and examples of the substituent include a hydroxy group, a methyl group, a methoxy group, a nitro group, a halogen group, and a trifluoromethyl group. Among the following X3, $R_2$ preferably represents a hydrogen atom from the viewpoint of thermal curability, and $R_3$ preferably represents naphthalene or diphenylacetylene from the viewpoints of etching resistance and thermal curability.

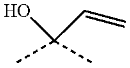
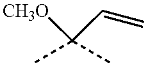
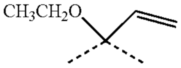
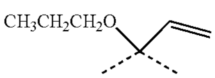
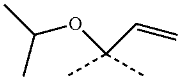
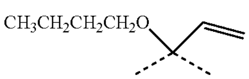
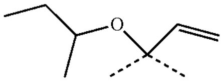
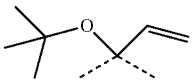
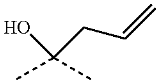
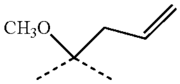
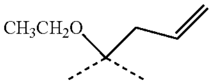
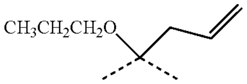
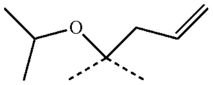
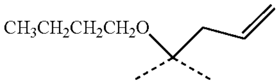
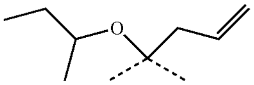
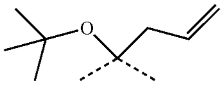
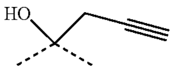
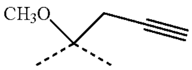
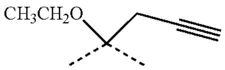
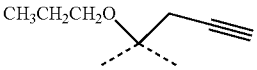
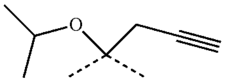
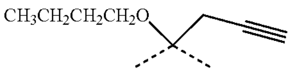
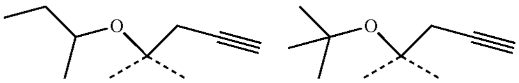

-continued
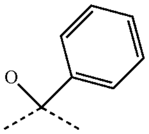
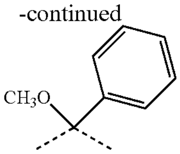
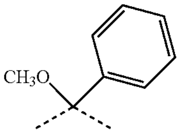
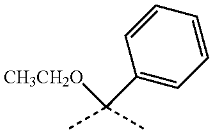
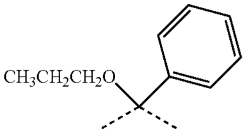
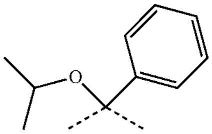
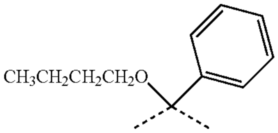
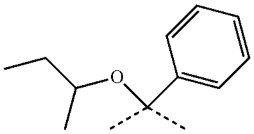
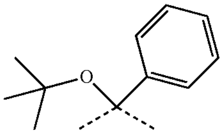
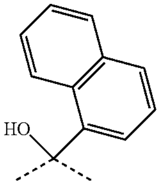
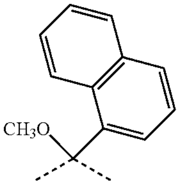
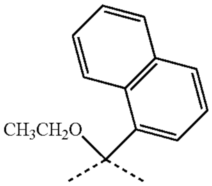
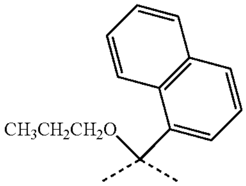
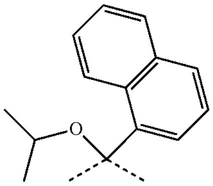
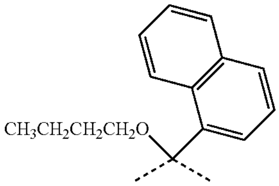
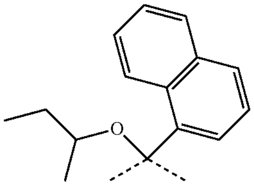
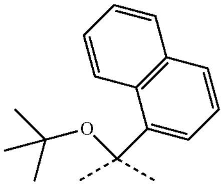
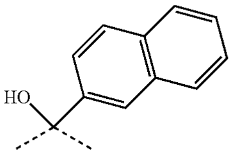
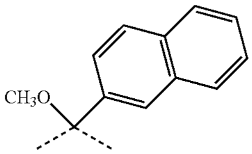
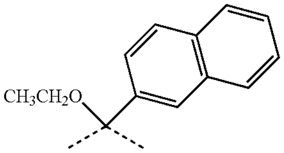
-continued
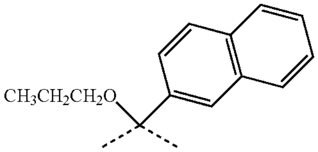
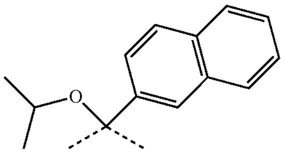
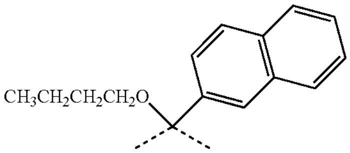
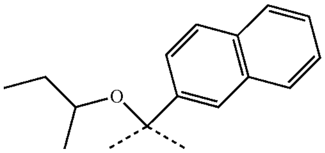
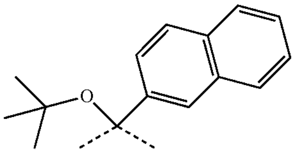
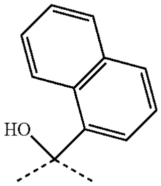
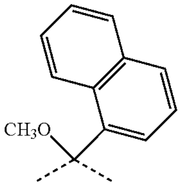
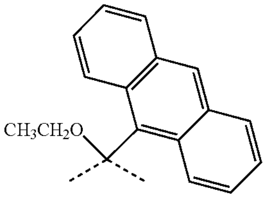
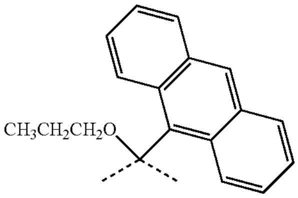
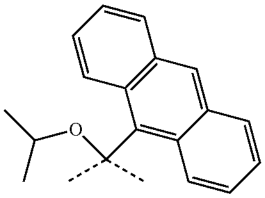
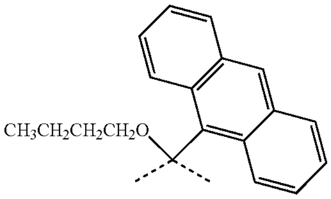

-continued
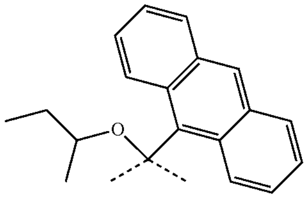
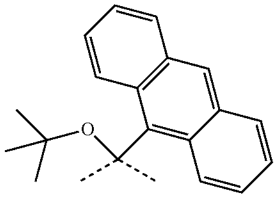
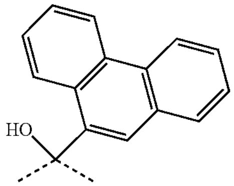
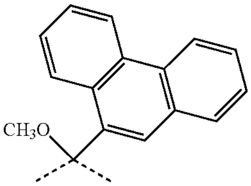
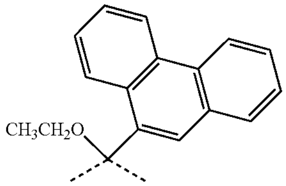
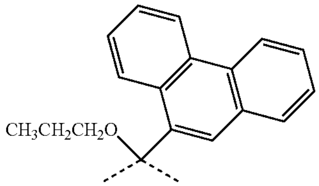
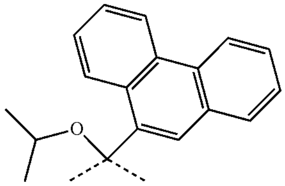
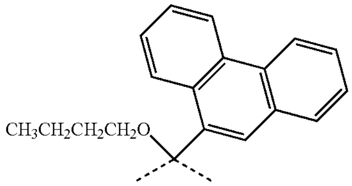
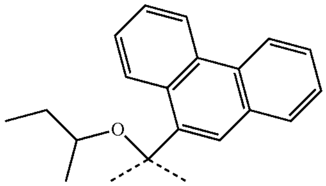
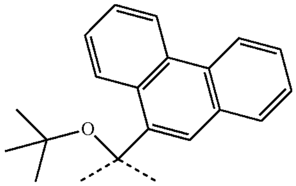
-continued
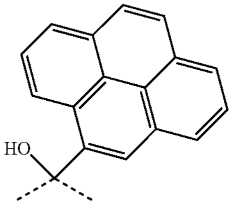
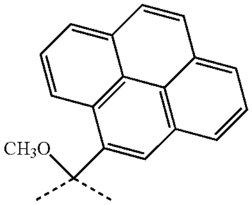
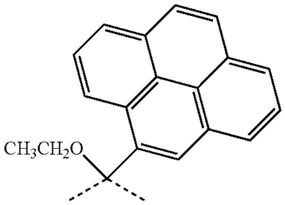
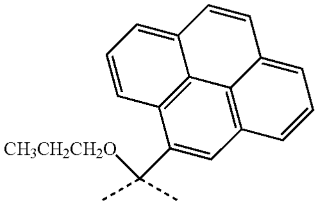
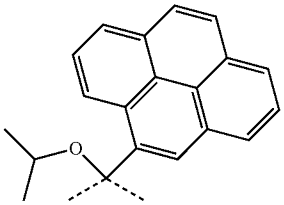
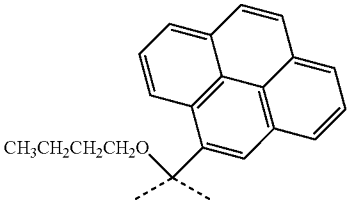
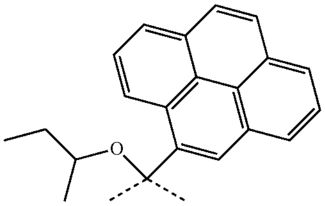
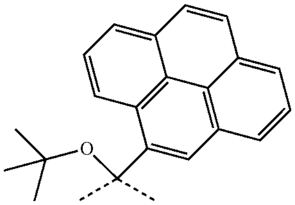
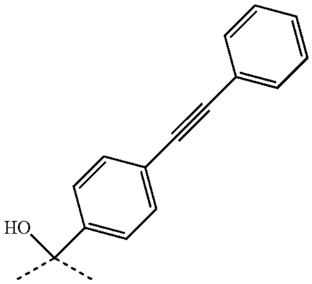

-continued
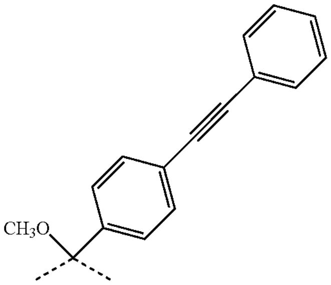
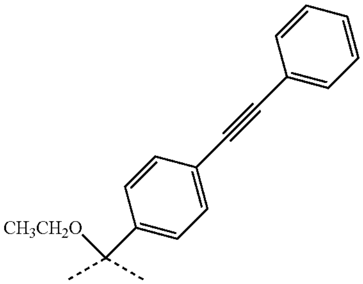
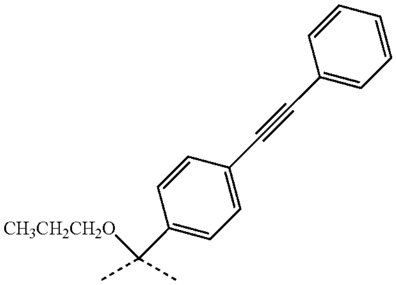
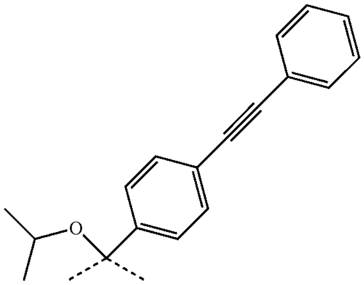
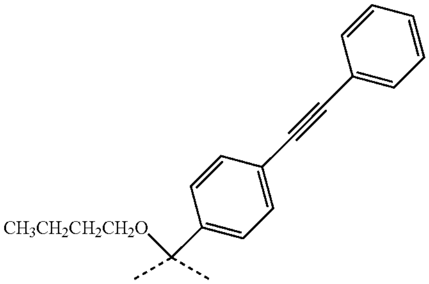
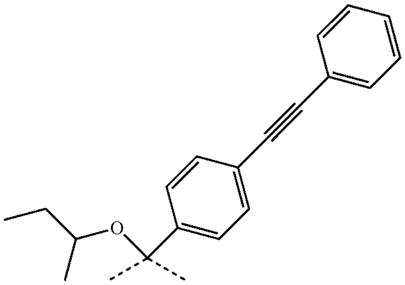
-continued
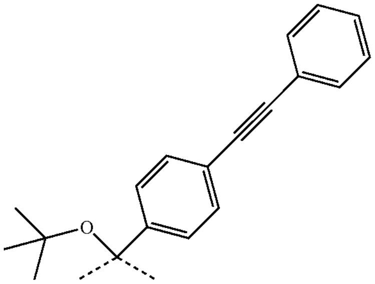
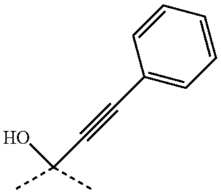
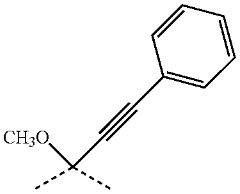
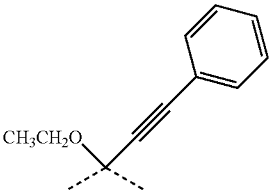
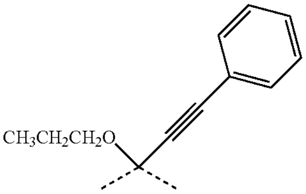
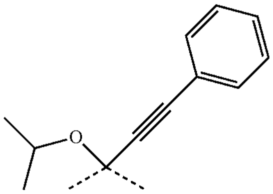
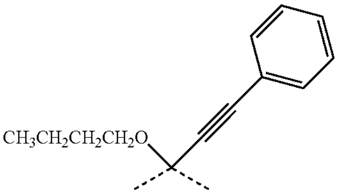
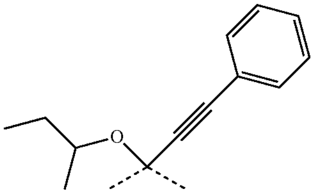
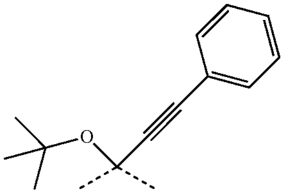

-continued
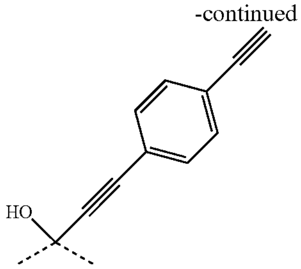
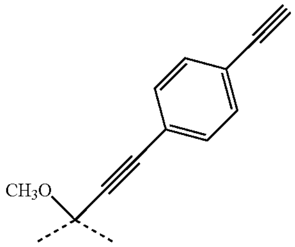
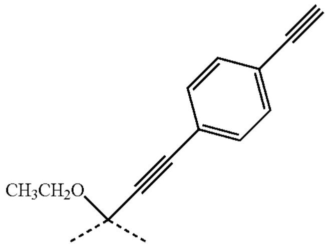
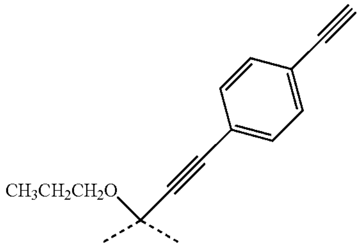
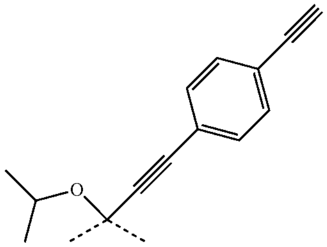
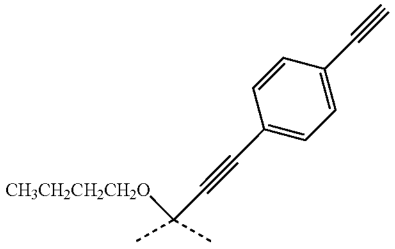
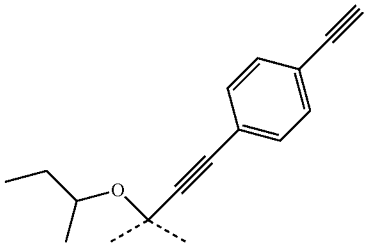
-continued
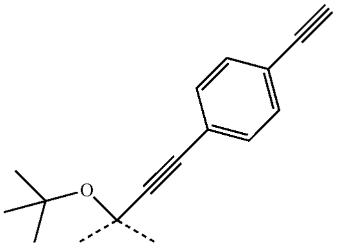
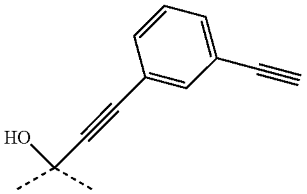
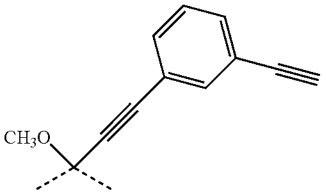
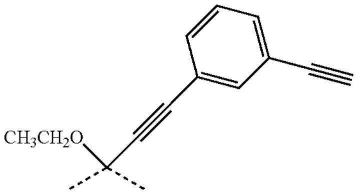
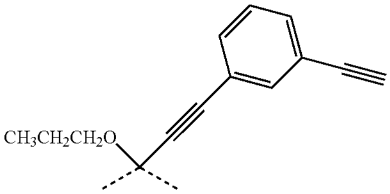
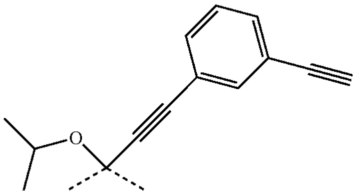
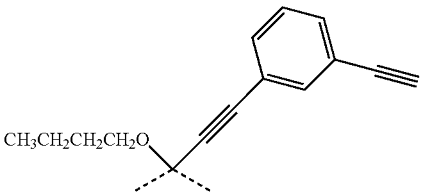
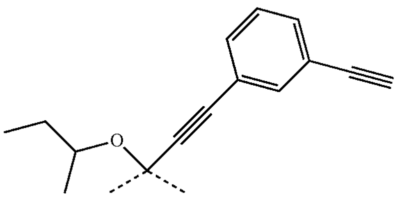

-continued
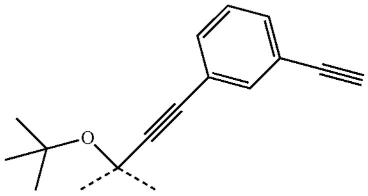
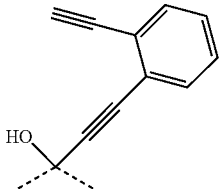
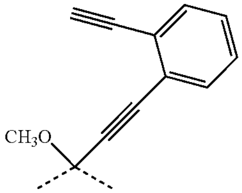
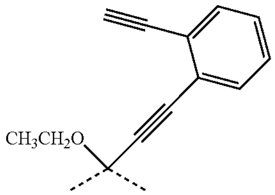
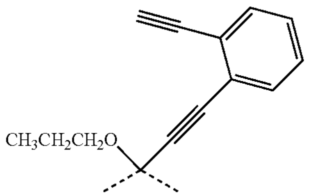
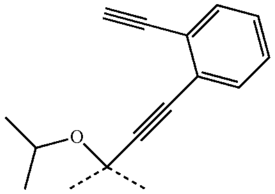
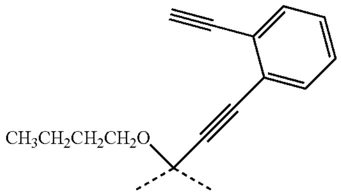
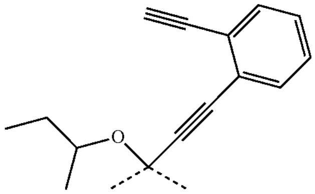
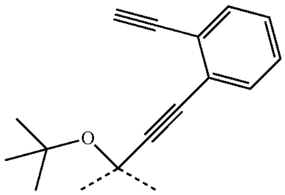
-continued
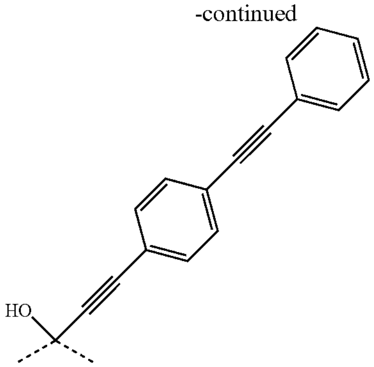
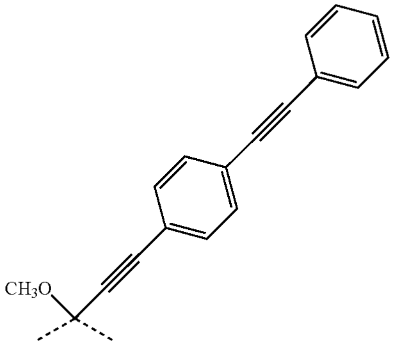
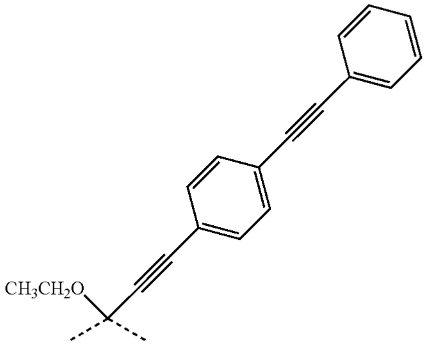
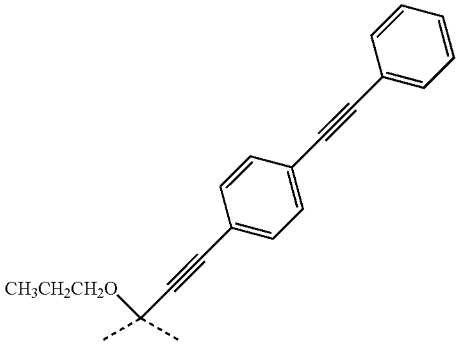
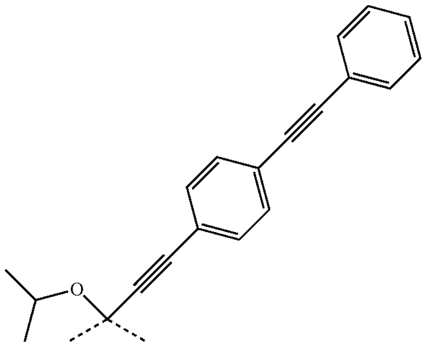

-continued

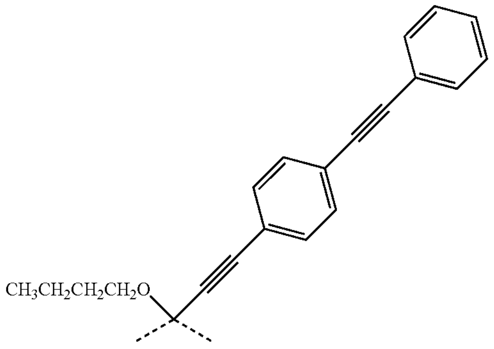

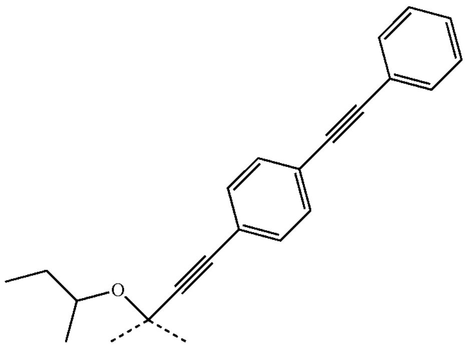

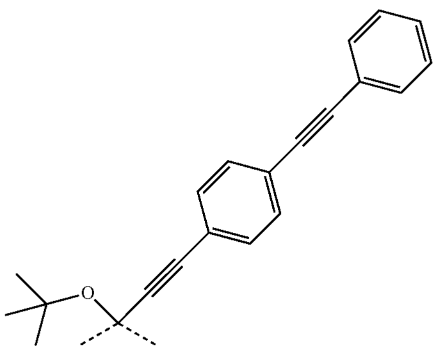

The compound having X3 among the partial structures represented by X in the general formula (1) has not only thermal curability by an action of the substituent $R_3$ but also can cause an intermolecular condensation reaction by an action of heat or an acid with dehydration or dealcoholization to form a dense film, described below.

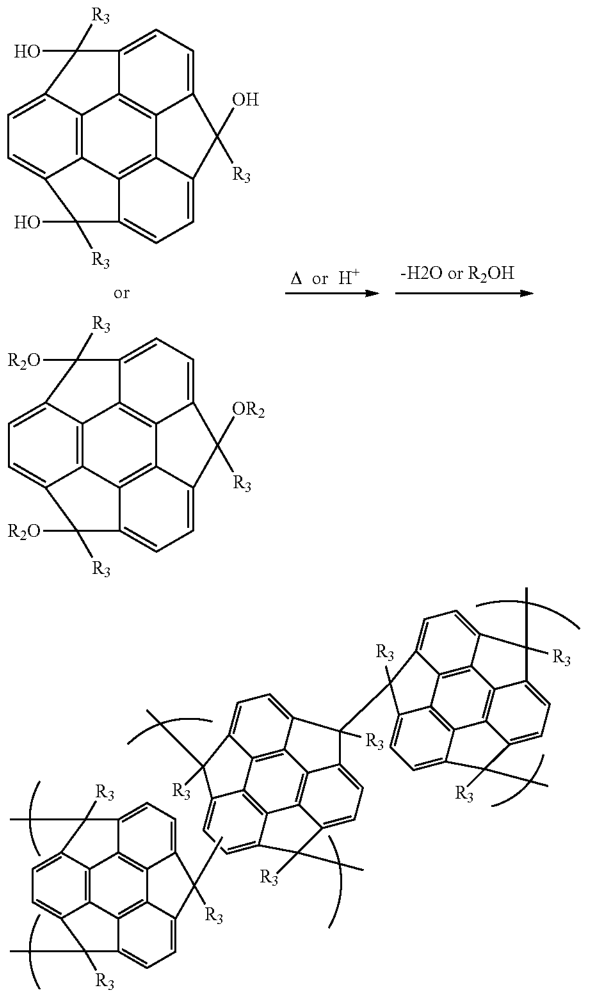

In addition, the compound represented by the general formula (1) preferably satisfies 1.00≤Mw/Mn≤1.15 where Mw is a weight-average molecular weight and Mn is a number-average molecular weight measured by gel permeation chromatography in terms of polystyrene. Although a monomolecular compound has Mw/Mn of 1.00 by the definition, a measurement value may exceed 1.00 due to separability with the gel permeation chromatography. It is extremely difficult for a typical polymer having a repeating unit to have Mw/Mn closer to 1.00 unless using a special polymerization method, and a typical polymer exhibits distribution of Mw to have a value of Mw/Mn exceeding 1. The present invention defines 1.00≤Mw/Mn≤1.15 as an indicator exhibiting a monomolecular property to distinguish a monomolecular compound and a polymer.

Regulating Mw/Mn of the compound for a composition for forming an organic film within the above range allows the composition for forming an organic film to form an organic film having excellent embedding ability and planarizing ability.

The compound for a composition for forming an organic film represented by the general formula (1) is preferably added in an amount of 1 to 20 parts by mass, and more preferably 5 to 15 parts by mass, relative to 100 parts by mass of the composition for forming an organic film.

[Method for Manufacturing Compound]

The inventive compound represented by the general formula (1) can be synthesized by using sumanene or an oxide of sumanene as a raw material. The manufacturing methods will be described below in each case of X being X1, X2, or X3.

When X is X1, examples thereof include the following substitution reaction using: sumanene; a propargyl halide, tosylate, or mesylate; and a base catalyst. In the following formula, X4 represents a halogen, a tosyl group, or a mesyl group.

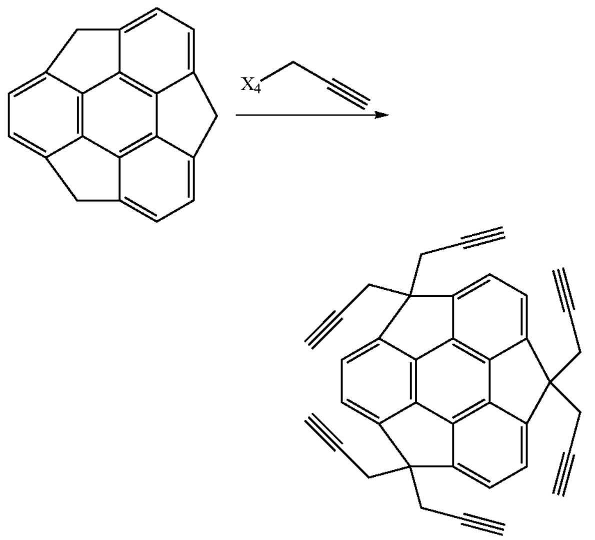

Examples of the base catalyst used in the substitution reaction include: inorganic base compounds, such as sodium hydrogen carbonate, sodium carbonate, potassium carbonate, calcium carbonate, cesium carbonate, sodium hydroxide, potassium hydroxide, sodium hydride, and potassium phosphate; and organic amine compounds, such as triethylamine, pyridine, and N-methylmorpholine. These base catalysts may be used singly, or may be used in combination of two or more kinds thereof. The use amount of these catalysts is within a range of 0.1 to 20 mol, and preferably 0.2 to 10 mol, relative to the number of moles of the raw material sumanene.

A solvent used in this case is not particularly limited as long as the solvent is inactive to the reaction. Examples thereof include: ether solvents, such as diethyl ether, tetrahydrofuran, and dioxane; aromatic solvents, such as benzene, toluene, and xylene; acetonitrile; dimethyl sulfoxide; N,N-dimethylformamide; N-methylpyrrolidone; and water. These solvents may be used singly, or may be used as a mixture thereof. These solvents can be used within a range of 0 to 2000 parts by mass relative to 100 parts by mass of the reaction raw material. The reaction temperature is preferably from −50° C. to near the boiling point of the solvent, and preferably a room temperature to 150° C. The reaction time is appropriately selected from 0.1 to 100 hours.

The reaction methods include: a method of collectively adding sumanene, a propargyl halide, tosylate, or mesylate, and a base catalyst being the catalyst; a method of dispersing or dissolving sumanene and the halide, tosylate, or mesylate, and then collectively or separately adding the catalyst, or dropwise adding the catalyst diluted with a solvent; a method of dispersing or dissolving the catalyst, and then collectively or separately adding each of sumanene and the halide, tosylate, or mesylate, or adding dropwise each thereof diluted with a solvent. In these cases, although depending on a reactivity of the aromatic compound, 2 mol or more of the propargyl halide, tosylate, or mesylate is preferably used relative to 1 mol of sumanene. After the reaction is finished, the product is diluted with an organic solvent to remove the catalyst used for the reaction, and phase-separation washing can be performed to recover the target compound.

During the reaction, an alkyl halide, tosylate, or mesylate, or an allyl halide, tosylate, or mesylate, etc. can be used in combination with the above propargyl halide, tosylate, or mesylate. Regulating the reaction rate of the substitution reaction can regulate the introduction rate of the propargyl group. Combining a plurality of substituents and regulating the introduction rate can regulate the film formability and adhesion strength to a substrate.

The organic solvent used for the phase-separation washing is not particularly limited as long as the organic solvent can dissolve the target compound and separate the mixture into two layers even when mixed with water. Examples thereof include: hydrocarbons, such as hexane, heptane, benzene, toluene, and xylene; esters, such as ethyl acetate, n-butyl acetate, and propylene glycol methyl ether acetate; ketones, such as methyl ethyl ketone, methyl amyl ketone, cyclohexanone, and methyl isobutyl ketone; ethers, such as diethyl ether, diisopropyl ether, methyl t-butyl ether, and ethylcyclopentyl methyl ether; chlorine-based solvents, such as methylene chloride, chloroform, dichloroethane, and trichloroethylene; and a mixture thereof. As the washing water used in this time, water called as deionized water or ultrapure water is typically used. The washing may be performed once or more times, preferably approximately once to five times, because washing ten times or more does not always produce the full washing effects thereof.

To remove acidic component in the system during the phase-separation washing, the washing may be performed with a basic aqueous solution. Specific examples of the base include a hydroxide of an alkali metal, a carbonate salt of an alkali metal, a hydroxide of an alkali earth metal, a carbonate salt of an alkali earth metal, ammonia, and an organic ammonium.

To remove a metal impurity or a base component in the system during the phase-separation washing, the washing may be performed with an acidic aqueous solution. Specific examples of the acid include: inorganic acids, such as hydrochloric acid, hydrobromic acid, sulfuric acid, nitric acid, phosphoric acid, and heteropoly acid; and organic acids, such as oxalic acid, fumaric acid, maleic acid, trifluoroacetic acid, methanesulfonic acid, benzenesulfonic acid, p-toluenesulfonic acid, and trifluoromethanesulfonic acid.

The phase-separation washing may be performed with any one of the basic aqueous solution and the acidic aqueous solution, or may be performed in combination thereof. The phase-separation washing is preferably performed with the basic aqueous solution and the acidic aqueous solution in this order from the viewpoint of removal of a metal impurity.

After the phase-separation washing with the basic aqueous solution and the acidic aqueous solution, washing with neutral water may be subsequently performed. The washing may be performed once or more times, and preferably appropriately 1 to 5 times. As the neutral water, deionized water, ultrapure water, etc., as described above, are used. The washing may be performed once or more times, but washing fewer times may fail to remove the basic component and the acidic component. The washing is preferably performed approximately 1 to 5 times, because washing ten times or more does not always produce the full washing effects thereof.

The reaction product after the phase-separation procedure can be recovered as a powder by concentrating the solvent under a reduced pressure or a normal pressure and solidifying, or by performing a crystallization procedure. Alternatively, the reaction product can be in a solution state at an appropriate concentration in order to improve handling in preparing the composition for forming an organic film. The concentration in this case is preferably 0.1 to 50 mass %, and more preferably 0.5 to 30 mass %. Such a concentration, which hardly increases the viscosity, can prevent impairing the handling, and is economical because the solvent amount is not excessively large.

The solvent in this case is not particularly limited as long as the solvent can dissolve the compound. Specific examples thereof include: ketones, such as cyclohexanone and methyl 2-amyl ketone; alcohols, such as 3-methoxylbutanol, 3-methyl-3-methoxybutanol, 1-methoxy-2-propanol, and 1-ethoxy-2-propanol; ethers, such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters, such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used singly, or may be used by mixing two or more kinds thereof.

When X is X2, the manufacturing method differs depending on whether W represents a carbon atom or a nitrogen atom. When W represents a carbon atom, the compound can be obtained by a condensation reaction, etc. of sumanene and aromatic aldehydes (reaction method 1). When W represents a nitrogen atom, the compound can be obtained by a condensation reaction, etc. of a sumanene oxide and aromatic amines (reaction method 2). In the following formula, "n1", "n2", and $R_1$ represent the same as the above.

Reaction method 1: when W represents a carbon atom.

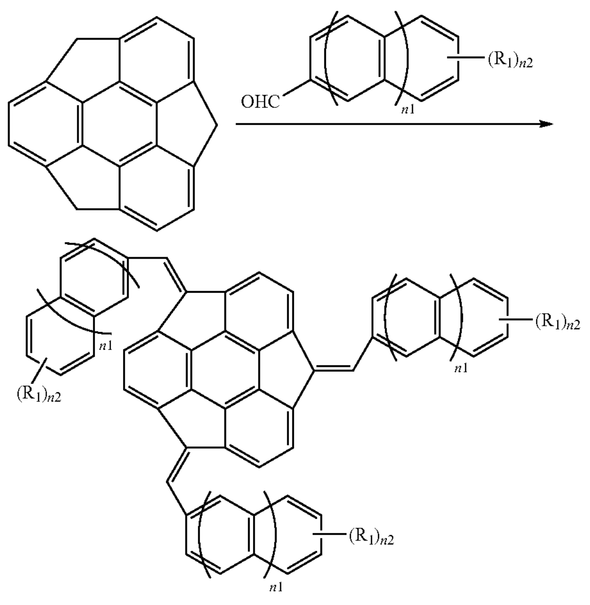

Reaction method 2: when W represents a nitrogen atom.

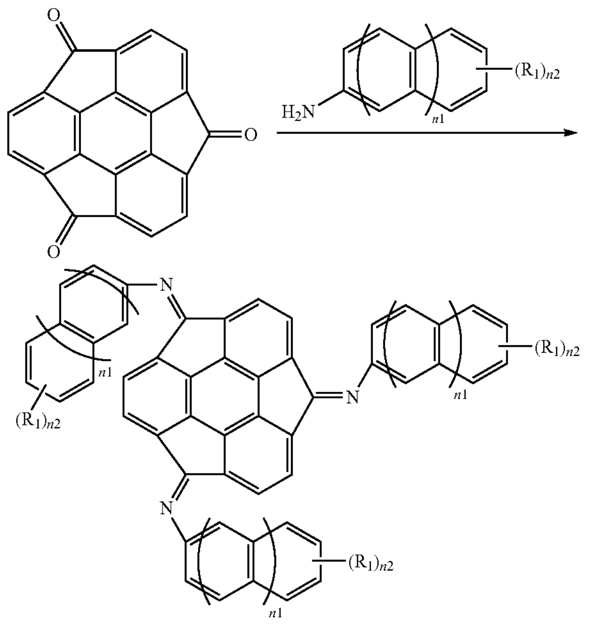

Examples of a base catalyst used in the condensation reaction of sumanene and the aromatic aldehydes, described in the reaction method 1, include: inorganic base compounds, such as sodium hydrogen carbonate, sodium carbonate, potassium carbonate, calcium carbonate, cesium carbonate, sodium hydroxide, potassium hydroxide, sodium hydride, and potassium phosphate; and organic amine compounds, such as triethylamine, pyridine, and N-methylmorpholine. These base catalysts may be used singly, or may be used in combination of two or more kinds thereof. The use amount of these catalysts is within a range of 0.1 to 20 mol, and more preferably 0.2 to 10 mol, relative to the number of moles of the raw material sumanene.

A solvent used in the reaction method 1 is not particularly limited as long as the solvent is inactive to the reaction. Examples thereof include: ether solvents, such as diethyl ether, tetrahydrofuran, and dioxane; aromatic solvents, such as benzene, toluene, and xylene; acetonitrile; dimethyl sulfoxide; N,N-dimethylformamide; N-methylpyrrolidone; and water. These solvents may be used singly, or may be used as a mixture thereof. These solvents can be used within a range of 0 to 2000 parts by mass relative to 100 parts by mass of the reaction raw material. The reaction temperature is preferably from −50° C. to near the boiling point of the solvent, and more preferably a room temperature to 150° C. The reaction time is appropriately selected from 0.1 to 100 hours.

As a reaction method and recovering method of the reaction method 1, the methods described as the methods usable in the case of X1 can be used.

For preparing the compound to be obtained in the reaction method 1 and used for an organic film material, aromatic aldehydes having a substituent other than $R_1$ can be used singly or in combination of a plurality kinds thereof depending on the required performance. For example, aromatic aldehydes having a substituent that contributes to improvement of the planarizing ability and the film formability, or a substituent that contributes to the etching resistance and the heat resistance can be combined at any ratio.

Examples of a usable acid catalyst used in the condensation reaction of the sumanene oxide and the aromatic amines, described in the reaction method 2, include: inorganic acids, such as hydrochloric acid, hydrobromic acid, sulfuric acid, nitric acid, phosphoric acid, and heteropoly acid; organic acids, such as oxalic acid, trifluoroacetic acid, methanesulfonic acid, benzenesulfonic acid, p-toluenesulfonic acid, and trifluoromethanesulfonic acid; and Lewis acids, such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium (IV) methoxide, titanium (IV) ethoxide, titanium (IV) isopropoxide, and titanium (IV) oxide. The use amount of this catalyst is within a range of 0.1 to 20 mol, and preferably 0.2 to 10 mol, relative to the number of moles of the bis(indole-2,3-dione) intermediate.

A solvent used in the reaction method 2 is not particularly limited. Examples thereof include: alcohols, such as methanol, ethanol, isopropyl alcohol, butanol, ethylene glycol, propylene glycol, diethylene glycol, glycerol, ethylene glycol monomethyl ether, and propylene glycol monomethyl ether; ethers, such as diethyl ether, dibutyl ether, diethylene glycol diethyl ether, diethylene glycol dimethyl ether, tetrahydrofuran, and 1,4-dioxane; chlorine-based solvents, such as methylene chloride, chloroform, dichloroethane, and trichloroethylene; hydrocarbons, such as hexane, heptane, benzene, toluene, xylene, and cumene; nitriles, such as acetonitrile; ketones, such as acetone, ethyl methyl ketone, and isobutyl methyl ketone; esters, such as ethyl acetate, n-butyl acetate, and propylene glycol methyl ether acetate; and aprotic polar solvents, such as dimethyl sulfoxide, N,N-dimethylformamide, and hexamethylphosphoric triamide. These solvents may be used singly, or may be used as a mixture of two or more kinds thereof. These solvents can be used within a range of 0 to 2000 parts by mass relative to 100 parts by mass of the reaction raw material. The reaction temperature is preferably from −50° C. to near the boiling point of the solvent, and further preferably a room temperature to 150° C. The reaction time is appropriately selected from 0.1 to 100 hours.

As a reaction method and recovering method of the reaction method 2, the methods described as the methods usable in the case of X1 can be used.

For preparing the compound to be obtained in the reaction method 2 and used for the composition for forming an organic film, aromatic amines having a substituent other than $R_1$ can be used singly or in combination of a plurality kinds thereof depending on the required performance. For example, aromatic amines having a substituent that contributes to improvement of the planarizing ability and the film formability, or a substituent that contributes to the etching resistance and the heat resistance can be combined at any proportion.

When X is X3, the manufacturing method differs depending on whether $R_2$ represents a hydrogen atom or an alkyl group. When $R_2$ represents a hydrogen atom, the compound can be obtained by a reaction between a sumanene oxide and an organometallic reagent represented by $R_3$-M, etc. (Step 1). When $R_2$ represents an alkyl group, the compound can be obtained by a condensation reaction, etc. between the sumanene derivative obtained in Step 1 as an intermediate and an alcohol represented by $R_2$—OH (Step 2). In the following formulae, $R_2$ and $R_3$ represent the same as above, M represents Li or $MgX_5$, and $X_5$ represents a halogen atom.

(Step 1)

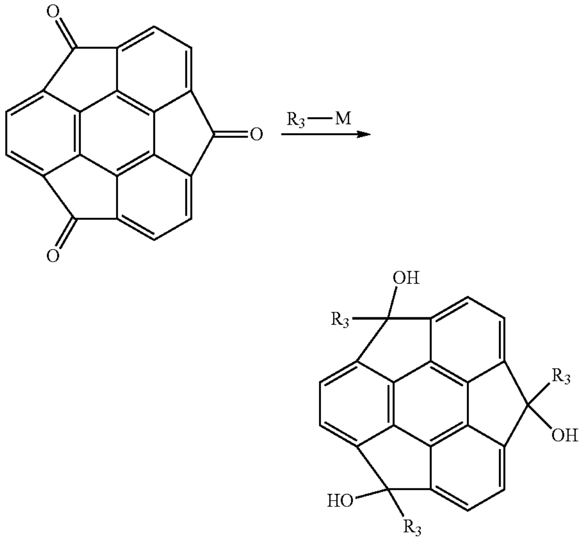

(Step 2)

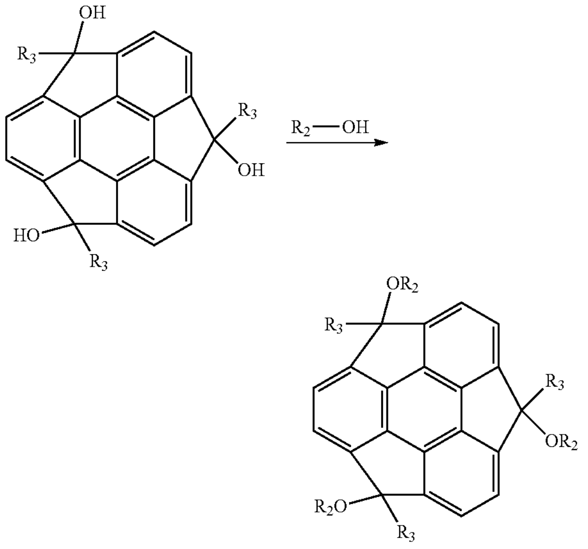

Examples of the organometallic reagent used in Step 1 include a Grignard reagent, an organolithium reagent, an organozinc reagent, and organotitanium reagent. A Grignard reagent and an organolithium reagent are particularly preferable. The Grignard reagent and the organolithium reagent may be prepared by a direct metalation between a corresponding halide and metal magnesium or metal lithium, or may be prepared by a metal-halogen exchanging reaction with aliphatic organometallic compounds, such as an isopropylmagnesium halide, methyllithium, and butyllithium.

The organozinc reagent and the organotitanium reagent can be prepared by a reaction from a corresponding Grignard reagent or organolithium reagent with a zinc halide, titanium (IV) halide, titanium (IV) alkoxide, etc. During the preparation of the organometallic reagent or during the reaction between the organometallic reagent and the sumanene oxide, a metal salt compound may be present. In this case, transition metal catalysts, such as palladium and nickel, proceeds the reaction.

Examples of the metal salt compounds include a cyanide salt, a halide salt, and a perhalogenate salt. Examples of preferable metal salt compounds include: lithium salts, such as lithium chloride, lithium bromide, lithium iodide, and lithium perchlorate; and copper salts, such as copper (I) cyanide, copper (II) cyanide, copper (I) chloride, copper (II) chloride, and dilithium tetrachlorocuprate.

Adding the metal salt compound at 0.01 to 5.0 equivalents, preferably 0.2 to 2.0 equivalents, relative to the organometallic reagent can increase solubility of the organometallic reagent to facilitate its preparation, or can regulate nucleophilicity or Lewis acidity of the reagent.

Examples of a solvent used in the preparation of the organometallic reagent and the reaction with the sumanene oxide include: ethers, such as diethyl ether, dibutyl ether, tetrahydrofuran, 1,4-dioxane, and cyclopentyl methyl ether; hydrocarbons, such as benzene, toluene, xylene, mesitylene, hexane, heptane, octane, and isooctane; and aprotic polar solvents, such as N,N,N',N'-tetramethylethylenediamine, hexamethylphosphoric triamide, and N,N-dimethylformamide. These solvents may be used singly, or may be used as a mixture thereof.

Although depending on a kind of the sumanene oxide and the organometallic reagent and the reaction condition, the reaction temperature is preferably −70° C. to 150° C. For example, when the organometallic reagent is the organozinc reagent or the Grignard reagent, various reaction temperatures, such as a room temperature to reflux at the boiling point of the solvent can be selected depending on the reaction. The reaction time is typically preferably 30 minutes to 48 hours.

As a reaction method of Step 1 and recovering method after quenching the reaction of the organometallic reagent with water, the methods described as the methods usable in the case of X1 can be used.

As an acid catalyst and solvent used in the condensation reaction with the alcohol represented by $R_2$—OH in Step 2, the same acid catalyst and solvent as used in the condensation reaction between the sumanene oxide and the aromatic amines used in (Reaction method 2) can be used. As a reaction method and a recovering method, the methods described as the methods usable in the case of X1 can be used.

As noted above, the inventive compound represented by the general formula (1) provides a composition for forming an organic film that can exhibit high etching resistance and excellent twisting resistance.

<Composition for Forming Organic Film>

The present invention also provides a composition for forming an organic film containing the compound represented by the general formula (1) and an organic solvent. In the inventive composition for forming an organic film, the inventive compound represented by the general formula (1) can be used singly, or can be used in combination of a plurality of kinds thereof.

With the inventive composition for forming an organic film, a modifier such as a compound for blending and another polymer can be further blended. The modifier has a role of improving film formability of spin-coating and embedding ability on a substrate having a step by mixing with the inventive composition for forming an organic film.

Examples of such a modifier include: novolac resins of phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-tert-butylphenol, 3-tert-butylphenol, 4-tert-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-tert-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-tert-butyl-5-methylphenol, pyrogallol, thymol, isothymol, 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, 7-methoxy-2-naphthol, dihydroxynaphthalenes such as 1,5-dihydroxynaphthalene, 1,7-dihydroxynaphthalene, and 2,6-dihydroxynaphthalene, methyl 3-hydroxynaphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, limonene, etc.; polyhydroxystyrene, polystyrene, polyvinylnaphthalene, polyvinylanthracene, polyvinylcarbazole, polyindene, polyacenaphthylene, polynorbornene, polycyclodecene, polytetracyclododecene, polynortricyclene, a poly(meth)acrylate, and a copolymer thereof.

In addition, a naphthol-dicyclopentadiene copolymer described in JP 2004-205685 A, a fluorenebisphenol novolac resin described in JP 2005-128509 A, an acenaphthylene copolymer described in JP 2005-250434 A, a fullerene having a phenol group described in JP 2006-227391 A, a bisphenol compound and a novolac resin thereof described in JP 2006-293298 A, a novolac resin of an adamantanephenol compound described in JP 2006-285095 A, a bisnaphthol compound and a novolac resin thereof described in JP 2010-122656 A, a fullerene resin compound described in JP 2008-158002 A, etc. can be blended.

A blending amount of the modifier is preferably 0 to 1,000 parts by mass, and more preferably 0 to 500 parts by mass, relative to 100 parts by mass of the inventive compound represented by the general formula (1).

[Organic Solvent]

The organic solvent usable in the inventive composition for forming an organic film is not particularly limited as long as the solvent dissolves the compound represented by the general formula (1), an acid generator, a crosslinker, and other additives. Specifically, solvents having a boiling point of lower than 180° C., such as solvents described in paragraphs (0091) to (0092) in JP 2007-199653 A, can be used.

Among these, propylene glycol monomethyl ether acetate (PGMEA), propylene glycol monomethyl ether, 2-heptanone, cyclopentanone, cyclohexanone (CyHO), and a mixture of two or more kinds thereof are preferably used.

The composition containing such an organic solvent can be applied by spin-coating. In addition, since containing the inventive compound represented by the general formula (1), the composition is a composition for forming an organic film having good dry etching resistance, heat resistance, and high embedding/planarizing ability.

Furthermore, as the organic solvent in the inventive composition for forming an organic film, a high boiling-point organic solvent having a boiling point of 180° C. or higher can be added into the organic solvent having a boiling point of lower than 180° C. (a mixture of the organic solvent having a boiling point of lower than 180° C. and the organic solvent having a boiling point of 180° C. or higher).

The high boiling-point organic solvent is not particularly limited to hydrocarbons, alcohols, ketones, esters, ethers, and chlorine-based solvents as long as the solvent can dissolve the compound represented by the general formula (1). Specific examples thereof include 1,6-diacetoxyhexane, 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol monohexyl ether, ethylene glycol mono-2-ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butyl methyl ether, triethylene glycol dimethyl ether, triethylene glycol monomethyl ether, triethylene glycol n-butyl ether, triethylene glycol butyl methyl ether, triethylene glycol diacetate, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol monomethyl ether acetate, dipropylene glycol methyl n-propyl ether, dipropylene glycol methyl ether acetate, 1,4-butanedoil diacetate, 1,3-butylene glycol diacetate, 1,6-hexanediol diacetate, triethylene glycol diacetate, γ-butyrolactone, dihexyl malonate, diethyl succinate, dipropyl succinate, dibutyl succinate, dihexyl succinate, dimethyl adipate, diethyl adipate, and dibutyl adipate. These solvents may be used singly, or may be used as a mixture thereof.

The boiling point of the high boiling-point organic solvent is appropriately selected depending on a temperature of heat-treating the composition for forming an organic film. The boiling point of the added high boiling-point organic solvent is preferably 180° C. to 300° C., and more preferably 200° C. to 300° C. When the boiling point is 180° C. or higher, there is no risk of excessively fast evaporation during baking (heat treatment) due to an excessively low boiling point, and sufficient thermal flowability can be obtained. When the boiling point is 300° C. or lower, which is not an excessively high boiling point, there is no possibility that the high boiling-point solvent does not evaporate and remains in the organic film after baking, and therefore there is no risk of adverse effect on the organic film properties such as the etching resistance.

When the high boiling-point organic solvent is used, a blending amount of the high boiling-point organic solvent is preferably 1 to 30 parts by mass relative to 100 parts by mass of the solvent having a boiling point of lower than 180° C. Such a blending amount eliminates a risk of failure to impart sufficient thermal flowability during the baking, and a risk of remaining in the organic film to deteriorate the film properties such as the etching resistance.

In such a composition for forming an organic film, adding the high boiling-point organic solvent imparts the thermal flowability to the compound represented by the general formula (1) to be a composition for forming an organic film having high embedding/planarizing ability.

The amount of the entire organic solvent is preferably 70 to 95 mass %, and more preferably 80 to 90 mass %, in the composition for forming an organic film.

[Other Additives]

Into the inventive composition for forming an organic film, an acid generator can be added to further promote the curing reaction. The acid generator includes an acid generator to generate an acid by pyrolysis and an acid generator to generate an acid by light irradiation, and any of them can be added. Specifically, materials described in paragraphs (0061) to (0085) in JP 2007-199653 A can be added, but the acid generator is not limited thereto.

The acid generator can be used singly, or may be used in combination of two or more kinds thereof. When the acid generator is added, the addition amount is preferably 0.05 to 50 parts by mass, and more preferably 0.1 to 10 parts by mass, relative to 100 parts by mass of the compound represented by the general formula (1).

Into the inventive composition for forming an organic film, a surfactant can be added to improve the coatability with spin-coating. As the surfactant, surfactants described in paragraphs (0142) to (0147) in JP 2009-269953 A can be used, for example.

When the surfactant is added, the addition amount is preferably 0.001 to 20 parts by mass, and more preferably 0.01 to 10 parts by mass, relative to 100 parts by mass of the compound represented by the general formula (1).

Into the inventive composition for forming an organic film, a crosslinker can be added to improve the curability and further inhibit intermixing with the upper layer film. The crosslinker is not particularly limited, and various known types of crosslinkers can be widely used. An example of the crosslinker includes a melamine-based crosslinker, a glycoluril-based crosslinker, a benzoguanamine-based crosslinker, a urea-based crosslinker, a β-hydroxyalkylamide-based crosslinker, an isocyanurate-based crosslinker, an aziridine-based crosslinker, an oxazoline-based crosslinker, or epoxy-based crosslinker.

When the crosslinker is added, the addition amount is preferably 1 to 50 parts by mass, and more preferably 10 to 40 parts by mass, relative to 100 parts by mass of the compound represented by the general formula (1).

Specific examples of the melamine-based crosslinker include hexamethoxymethylated melamine, hexabutoxymethylated melamine, alkoxy- and/or hydroxy-substituted derivatives thereof, and partially self-condensed products thereof.

Specific examples of the glycoluril-based crosslinker include tetramethoxymethylated glycoluril, tetrabutoxymethylated glycoluril, alkoxy- and/or hydroxy-substituted derivatives thereof, and partially self-condensed products thereof.

Specific examples of the benzoguanamine-based crosslinker include tetramethoxymethylated benzoguanamine, tetrabutoxymethylated benzoguanamine, alkoxy- and/or hydroxy-substituted derivatives thereof, and partially self-condensed products thereof.

Specific examples of the urea-based crosslinker include dimethoxymethylated dimethoxyethylene urea, alkoxy- and/ or hydroxy-substituted derivatives thereof, and partially self-condensed products thereof.

Specific examples of the β-hydroxyalkylamide-based crosslinker include N,N,N',N'-tetra(2-hydroxyethyl)adipic amide.

Specific examples of the isocyanurate-based crosslinker include triglycidylisocyanurate and triallylisocyanurate.

Specific examples of the aziridine-based crosslinker include 4,4'-bis(ethyleneiminocarbonylamino)diphenylmethane and 2,2-bishydroxymethylbutanol-tris[3-(1-aziridinyl)propionate].

Specific examples of the oxazoline-based crosslinker include 2,2'-isopropylidinebis(4-benzyl-2-oxazoline), 2,2'-isoprolylidenebis(4-phenyl-2-oxazoline), 2,2'-methylenebis-4,5-diphenyl-2-oxazoline, 2,2'-methylenebis-4-phenyl-2-oxazoline, 2,2'-methylenebis-4-tert-butyl-2-oxazoline, 2,2'-bis(2-oxazoline), 1,3-phenylenebis(2-oxazoline), 1,4-phenylenebis(2-oxazoline), and a 2-isopropenyloxazoline copolymer.

Specific examples of the epoxy-based crosslinker include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, and pentaerythritol tetraglycidyl ether.

Into the inventive composition for forming an organic film, a plasticizer can be added to further improve the planarizing/embedding ability. The plasticizer is not particularly limited, and known various types of plasticizers can be widely used. An example of the plasticizer includes: low molecular-weight compounds such as phthalate esters, adipate esters, phosphate esters, trimellitate esters, and citrate esters; and polymers such as polyether polymers, polyester polymers, and polyacetal polymers described in JP 2013-253227 A.

When the plasticizer is used, the addition amount is preferably 5 to 500 parts by mass, and more preferably 10 to 200 parts by mass, relative to 100 parts by mass of the compound represented by the general formula (1).

Into the inventive composition for forming an organic film, preferably used as additives for imparting the embedding/planarizing ability similar to the plasticizer are: liquid additives having a polyethylene glycol structure or a polypropylene glycol structure; or a polymer with pyrolyzing property having a weight reducing rate from 30° C. to 250° C. of 40 mass % or more and having a weight-average molecular weight of 300 to 200,000, for example. This polymer with pyrolyzing property preferably has a repeating unit having an acetal structure represented by the following general formula (DP1) or (DP2)

(DP1)

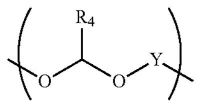

In the formula, $R_4$ represents a hydrogen atom or a saturated or unsaturated monovalent organic group having 1 to 30 carbon atoms and optionally having a substituent. Y represents a saturated or unsaturated divalent organic group having 2 to 30 carbon atoms.

(DP2)

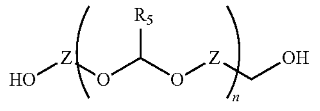

In the formula, $R_5$ represents an alkyl group having 1 to 4 carbon atoms. Z represents a saturated or unsaturated divalent hydrocarbon group having 4 to 10 carbon atoms and optionally having an ether bond. "n" represents an average number of the repeating units, and is 3 to 500.

The inventive composition for forming an organic film can be used singly, or can be used in combination of two or more kinds thereof. The composition for forming an organic film can be used for usage of a resist organic film material or a planarizing material for semiconductor device manufacturing.

The inventive composition for forming an organic film is extremely useful as an organic film material in multilayer resist processes, such as: two-layer resist process; a three-layer resist process using a silicon-containing resist intermediate film; and a four-layer resist process using a silicon-containing resist intermediate film, a silicon-containing inorganic hard mask, and an organic anti-reflective film (BARC).

<Method for Forming Organic Film>

The present invention can form an organic film functioning as an organic underlayer film of the multilayer resist film used in lithography, or a planarizing film for semiconductor manufacturing by using the composition for forming an organic film.

In the present invention, the composition for forming an organic film is applied on a substrate to be processed by a spin-coating method, etc. Using the spin-coating method, etc. can yield good embedding ability. After the spin-coating, the solvent is evaporated and baking (heat treatment) is performed to prevent mixing with a resist upper layer film or a silicon-containing resist intermediate film, and to promote the crosslinking reaction. The baking is preferably performed within a range of 100° C. or higher and 600° C. or lower for 10 to 600 seconds, more preferably within a range of 200° C. or higher and 500° C. or lower for 10 to 300 seconds. With considering device damage and an effect on wafer deformation, an upper limit of the heating temperature in the wafer process of lithography is preferably 600° C. or lower, and more preferably 500° C. or lower.

The present invention can form the organic film also by: applying the inventive composition for forming an organic film on a body to be processed by the spin-coating method, etc., similar to the above; and calcining the composition for forming an organic film in an atmosphere with an oxygen concentration of 0.1% or more and 21% or less to cure the composition.

Calcining the inventive composition for forming an organic film in such an oxygen atmosphere can yield a sufficiently cured organic film. The atmosphere during the baking may be the air, but sealing an inert gas, such as $N_2$, Ar, and He, to reduce oxygen is preferable for preventing oxidation of the organic film. The oxygen concentration is required to be controlled to prevent the oxidation, and is preferably 1000 ppm or less, and more preferably 100 ppm or less. Preventing the oxidation of the organic film during the baking is preferable because the absorption does not increase and the etching resistance is not deteriorated.

The above inventive composition for forming an organic film can yield a planarized organic film with its excellent embedding/planarizing ability regardless of concavity and convexity on the substrate to be processed. Therefore, the inventive composition is extremely useful when a planarized organic film is formed on a body to be processed having a structure or step with 30 nm or more in height.

The thickness of this organic film such as the organic underlayer film or the planarizing film for semiconductor device manufacturing is appropriately selected, and is preferably 30 to 20,000 nm, and more preferably 50 to 15,000 nm.

(Patterning Process)

The present invention can provide a patterning process for forming a pattern to a body to be processed with a three-layer resist process using such a composition for forming an organic film, the patterning process at least comprising: forming an organic film on a body to be processed by using the inventive composition for forming an organic film; forming a silicon-containing resist intermediate film on the organic film by using a silicon-containing resist intermediate film material; forming a resist upper layer film on the silicon-containing resist intermediate film by using a photoresist composition; forming a circuit pattern in the resist upper layer film; transferring the pattern to the silicon-containing resist intermediate film by etching while using the resist upper layer film having the formed circuit pattern as a mask; transferring the pattern to the organic film by etching while using the silicon-containing resist intermediate film having the transferred pattern as a mask; and forming a pattern to the body to be processed by etching while using the organic film having the transferred pattern as a mask.

Since the silicon-containing resist intermediate film in the three-layer resist process has etching resistance against oxygen gas or hydrogen gas, the dry etching of the organic film performed while using the silicon-containing resist intermediate film as a mask is preferably performed by using an etching gas mainly containing the oxygen gas or the hydrogen gas in the three-layer resist process.

As the silicon-containing resist intermediate film in the three-layer resist process, a polysiloxane-based intermediate film is also preferably used. Imparting an anti-reflective effect to the silicon-containing resist intermediate film can inhibit reflection. In particular, using a material for 193-nm exposure containing a large amount of aromatic groups and having high etching selectivity to the substrate as the organic film increases the k-value to increase reflection on the substrate. However, the silicon-containing resist intermediate film having the absorption so as to have an appropriate k-value can inhibit the reflection, resulting in the substrate reflection of 0.5% or less. Preferably used for the silicon-containing resist intermediate film having the anti-reflection effect is a polysiloxane having anthracene for 248-nm or 157-nm exposure, or a phenyl group or a light absorption group with a silicon-silicon bond for 193-nm exposure in a pendant structure, the polysiloxane being crosslinkable with acid or heat.

An organic anti-reflective film (BARC) may be formed on the silicon-containing resist intermediate film. In this case, a pattern can be formed to a body to be processed by: forming an organic film on a body to be processed by using the inventive composition for forming an organic film; forming a silicon-containing resist intermediate film on the organic film by using a silicon-containing resist intermediate film material; forming a BARC on the silicon-containing resist intermediate film; forming a resist upper layer film on the BARC by using a photoresist composition; forming a circuit pattern in the resist upper layer film; sequentially transferring the pattern to the BARC and the silicon-containing resist intermediate film by etching while using the resist upper layer film having the formed circuit pattern as a mask; transferring the pattern to the organic film by etching while using the silicon-containing resist intermediate film having the transferred pattern as a mask; and forming a pattern to the body to be processed by etching the body to be processed while using the organic film having the transferred pattern as a mask.

An inorganic hard mask may be formed as a resist intermediate film. In this case, a pattern can be formed to a body to be processed by: forming an organic film on a substrate to be processed by using the inventive composition for forming an organic film; forming an inorganic hard mask selected from a silicon oxide film, a silicon nitride film, and a silicon oxynitride film on the organic film; forming a resist upper layer film on the inorganic hard mask by using a photoresist composition; forming a circuit pattern in the resist upper layer film; transferring the pattern to the inorganic hard mask by etching while using the resist upper layer film having the formed circuit pattern as a mask; transferring the pattern to the organic film by etching while using the inorganic hard mask having the formed pattern as a mask; and forming a pattern to the body to be processed by etching the body to be processed while using the organic film having the formed pattern as a mask.

When the inorganic hard mask is formed on the organic film as above, a silicon oxide film, a silicon nitride film, and a silicon oxynitride film (SiON film) can be formed by a CVD method, an ALD method, etc. The method for forming the silicon nitride film are described in, for example, JP 2002-334869 A, WO 2004/066377, etc. The film thickness of the inorganic hard mask is preferably 5 to 200 nm, and more preferably 10 to 100 nm. As the inorganic hard mask, the SiON film, which is highly effective as the anti-reflective film, is most preferably used. Since the substrate temperature during the SiON film formation reaches 300 to 500° C., the organic film being the underlayer film is required to withstand the temperature of 300 to 500° C. The composition for forming an organic film used in the present invention has high heat resistance and can withstand the high temperature of 300° C. to 500° C., and thereby the inorganic hard mask formed by the CVD method or the ALD method and the organic film formed by spin-coating method can be combined.

The inventive composition is also suitable for a four-layer resist process using an organic anti-reflective film (BARC). In this case, a pattern can be formed on a body to be processed by: forming an organic film on a body to be processed by using the inventive composition for forming an organic film; forming an inorganic hard mask selected from a silicon oxide film, a silicon nitride film, and a silicon oxynitride film on the organic film; forming a BARC on the inorganic hard mask; forming a resist upper layer film on the BARC by using a photoresist composition; forming a circuit pattern in the resist upper layer film; sequentially transferring the pattern to the BARC and the inorganic hard mask by etching while using the resist upper layer film having the formed circuit pattern as a mask; transferring the pattern to the organic film by etching while using the inorganic hard mask having the transferred pattern as a mask; and forming a pattern to the body to be processed by etching the body to be processed while using the organic film having the transferred pattern as a mask.

Although the photoresist film may be formed as the resist upper layer film on the inorganic hard mask as noted above, the BARC may be formed on the inorganic hard mask by spin-coating, and the photoresist film may be formed thereon. In particular, when the SiON film is used as the inorganic hard mask, the reflection can be inhibited by the two anti-reflective films of the SiON film and the BARC even with the immersion exposure having high NA of more than 1.0. Another merit of forming the BARC is an effect of reducing bottom footing of the photoresist pattern just on the SiON film.

The resist upper layer film in the three-layer resist process may be any of positive-type or negative-type, and a material same as commonly used photoresist compositions can be used. After the photoresist composition is applied by spin-coating, the pre-baking is performed. The pre-baking is preferably performed within a range of 60 to 180° C. for 10 to 300 seconds. Thereafter, the exposure, then post exposure bake (PEB), and development are performed in accordance with the common method to obtain the resist pattern. The thickness of the resist upper layer film is not particularly limited, and preferably 30 to 500 nm, more preferably 50 to 400 nm.

Examples of the exposure light include a high-energy ray having a wavelength of 300 nm or less, and specifically, excimer laser with 248 nm, 193 nm, or 157 nm, soft X-ray with 3 to 20 nm, electron beam, and X-ray.

In the inventive patterning process, the circuit pattern in the resist upper layer film is preferably formed by a photolithography using light having a wavelength of 10 nm or more and 300 nm or less, a direct writing with electron beam, nanoimprinting, or a combination thereof.

In the inventive patterning process, an alkaline development or development with an organic solvent is preferably used.

Then, the etching is performed while using the obtained resist pattern as a mask. The etching of the silicon-containing resist intermediate film or the inorganic hard mask in the three-layer resist process is performed by using a fluorocarbon-based gas while using the upper layer resist pattern as a mask. This etching forms the silicon-containing resist intermediate film pattern or the inorganic hard mask pattern.

Then, the organic film is etch-processed while using the obtained silicon-containing resist intermediate film pattern or the inorganic hard mask pattern as a mask.

The subsequent etching of the body to be processed, such as a substrate to be processed, can be performed in accordance with a common method. For example, when the body to be processed is $SiO_2$-based, SiN-based, or silica-based low dielectric-constant insulative film, the etching is performed mainly using a fluorocarbon-based gas. When the body to be processed is p-Si, Al, or W, the etching is performed mainly using a chlorine-based or bromine-based gas. When the substrate is processed by etching using the fluorocarbon-based gas, the silicon-containing resist intermediate film pattern in the three-layer resist process is simultaneously removed with the substrate processing. When the substrate is etched by using the chlorine-based or bromine-based gas, a dry etching removal using the fluorocarbon-based gas is required to be separately performed after the substrate processing in order to remove the silicon-containing resist intermediate film pattern.

The organic film obtained by the inventive composition for forming an organic film has excellent etching resistance during the above etching of the body to be processed.

In the inventive patterning process, the body to be processed is preferably a semiconductor device substrate, a metal film, a metal carbide film, a metal oxide film, a metal nitride film, a metal oxycarbide film, or a metal oxynitride film.

As the metal, silicon, titanium, tungsten, hafnium, zirconium, chromium, germanium, copper, silver, gold, aluminum, indium, gallium, arsenic, palladium, iron, tantalum, iridium, molybdenum, or an alloy thereof is preferably used.

The body to be processed is not particularly limited, and used are: a substrate such as Si, α-Si, p-Si, $SiO_2$, SiN, SiON, W, TiN, and Al; and the substrate on which a layer to be processed is formed are used. As the layer to be processed, various low-k films such as Si, $SiO_2$, SiON, SiN, p-Si, α-Si, W, W—Si, Al, Cu, and Al—Si, and stopper films thereof. The layer to be processed can be formed to have a thickness of typically preferably 50 to 10,000 nm, more preferably 100 to 5,000 nm. When the layer to be processed is formed, the substrate and the layer to be processed having different materials are used.

As the body to be processed, a body to be processed having a structure or step with 30 nm or more in height is preferably used.

An example of the three-layer resist process will be specifically described as follows by using FIG. 1.

In the three-layer resist process, as illustrated in FIG. 1(A), an organic film 3 is formed on a body 2 to be processed stacked on a substrate 1 by using the inventive composition for forming an organic film, then a silicon-containing resist intermediate film 4 is formed, and a resist upper layer film 5 is formed thereon.

Then, as illustrated in FIG. 1(B), a target portion 6 in the resist upper layer film is exposed, and PEB and development are performed to form a resist pattern 5*a* (FIG. 1(C)). While using the obtained resist pattern 5*a* as a mask, the silicon-containing resist intermediate film 4 is etch-processed by using a CF-based gas to form a silicon-containing resist intermediate film pattern 4*a* (FIG. 1(D)). After removing the resist pattern 5*a*, while using this obtained silicon-containing resist intermediate film pattern 4*a* as a mask, the organic film 3 is etched with oxygen plasma to form an organic film pattern 3*a* (FIG. 1(E)). Furthermore, after removing the silicon-containing resist intermediate film pattern 4*a*, the body 2 to be processed is processed by etching while using the organic film pattern 3*a* as a mask to form a pattern 2*a* (FIG. 1(F)).

When the inorganic hard mask is used, the silicon-containing resist intermediate film 4 is the inorganic hard mask. When the BARC is spread, the BARC layer is provided between the silicon-containing resist intermediate film 4 or the inorganic hard mask and the resist upper layer film 5. The BARC may be subsequently etched prior to the etching of the silicon-containing resist intermediate film 4. Alternatively, only the BARC may be etched, and then the etching apparatus can be changed, etc. to etch the silicon-containing resist intermediate film 4.

As noted above, the inventive patterning process can form a fine pattern to the substrate to be processed with high precision in the multilayer resist process.

EXAMPLE

Hereinafter, the present invention will be described more specifically with showing Synthesis Examples, Comparative Synthesis Examples, Examples, and Comparative Examples, but the present invention is not limited by these examples. Note that, a weight-average molecular weight (Mw) and number-average molecular weight (Mn) were determined by gel permeation chromatography (GPC) in terms of polystyrene using tetrahydrofuran (THF) as an eluent to determine the dispersion degree (Mw/Mn).

For synthesizing compounds (A1) to (A8) contained in the composition for forming an organic film, used were the following sumanene derivatives (B1) to (B2), aromatic aldehydes (C1) to (C3), propargyl bromide (C4), aromatic Grignard reagents (C5) to (C6), and an aromatic amine (C7). The aromatic Grignard reagent (C6) and the sumanene oxide (B2) were synthesized by methods described in Synthesis Example 1 and Synthesis Example 2, respectively.

Sumanene Derivatives:

(B1)

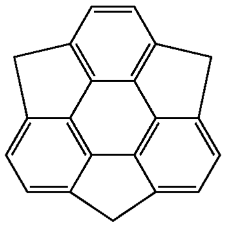

(B2)

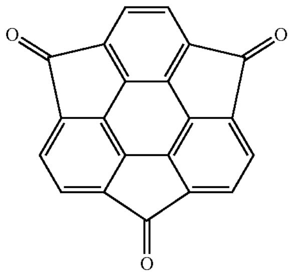

Aromatic aldehydes (C1) to (C3), propargyl bromide (C4), aromatic Grignard reagents (C5) to (C6), and aromatic amine (C7)

(C1)

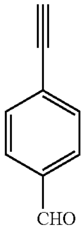

(C2)

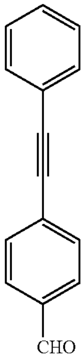

-continued (C3)

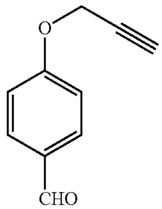

(C4)

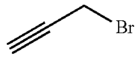

(C5)

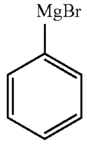

(C6)

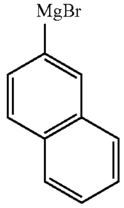

(C7)

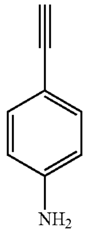

(Synthesis Example 1) Synthesis of Aromatic Grignard Reagent (C6)

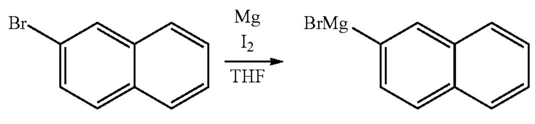

(C6)

Into a flask, 1.2 g of magnesium is added and heated with a heat gun to perform degassing and dehydration with reducing a pressure. Under a nitrogen atmosphere, 20 g of dehydrated THF and 2.0 g of iodine were added, and the mixture was stirred. A solution of 5.0 g of 2-bromonaphthalene dissolved in 10 g of THF was added, and the mixture was stirred at 40° C. for 3 hours to obtain a THF solution of (C6).

(Synthesis Example 2) Synthesis of Sumanene Derivative (B2)

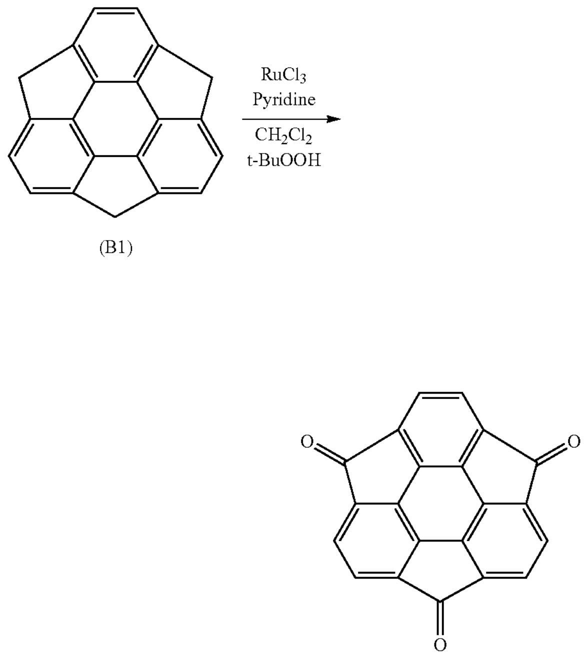

(B1)

(B2)

Adding 10.0 g of sumanene (B1), 200 ml of dichloromethane, 30.0 g of pyridine, 17.0 g of ruthenium (III) chloride hydrate, and 100 g of a 70% aqueous solution of tert-butyl hydroperoxide was performed, and the mixture was stirred at 40° C. for 100 hours. Thereafter, a small amount of silica gel was added, dried under a reduced pressure with an evaporator, and an impurity was removed by silica gel column chromatography. The product was dissolved in methyl isobutyl ketone (MIBK), crystallized with hexane, then recovered, and dried in vacuo at 70° C. to obtain 8.1 g of (B2) (70%). Instrumental analysis data of this compound is shown below.

(Synthesis Example 3) Synthesis of Compound (A1)

(A1)

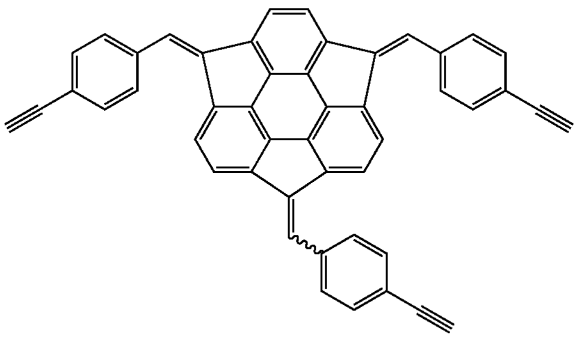

Under a nitrogen atmosphere, 1.0 g of sumanene (B1), 5.5 g of n-tetrabutylammonium bromide, 100 ml of a 30 wt % aqueous sodium hydroxide solution previously degassed with nitrogen bubbling, and 50 ml of THF were added. Thereafter, 3.5 g of 4-ethynylbenzaldehyde (C1) was added, and the mixture was stirred at a room temperature for 15 hours. Into the mixture, 150 ml of MIBK was added, and washed with deionized water until the neutral. The obtained organic layer was condensed and dissolved in MIBK, and methanol was added for crystallization. The crystal was filtered, washed, then recovered, and dried in vacuo at 70° C. to obtain 1.7 g of (A1) (74%). Instrumental analysis data of this compound is shown below.

IR (ATR method): 3443, 3289, 3036, 2957, 2870, 2106, 1698, 1661, 1505, 1403, 1367, 1308, 1224, 1163, 1110, 1016, 887, 827, 653, 544 $cm^{-1}$ $^1$H-NMR (600 MHz in $CDCl_3$): 7.89-7.80 (6H, m), 7.64-7.50 (7H, m), 7.43-7.16 (8H, m), 3.24-3.20 (3H, m) ppm $^{13}$C-NMR (150 MHz in $CDCl_3$): 162.512, 147.825, 147.458, 147.368, 145.807, 145.511, 145.339, 141.318, 141.219, 141.092, 132.853, 132.757, 132.559, 132.500, 130.751, 129.725, 129.663, 128.223, 127.869, 127.631, 127.571, 127.329, 125.727, 125.622, 123.884, 123.751, 123.662, 123.511, 122.454, 121.162, 121.060, 120.964, 120.964, 115.423, 115.323, 115.216, 76.496, 56.092 ppm GPC: Mw/Mn=1.08

MS (Calcd. for $C_{46}H_{24}+H^+$): 601.195

MS (LC-MS): 601.194

(Synthesis Example 4) Synthesis of Compound (A2)

(A2)

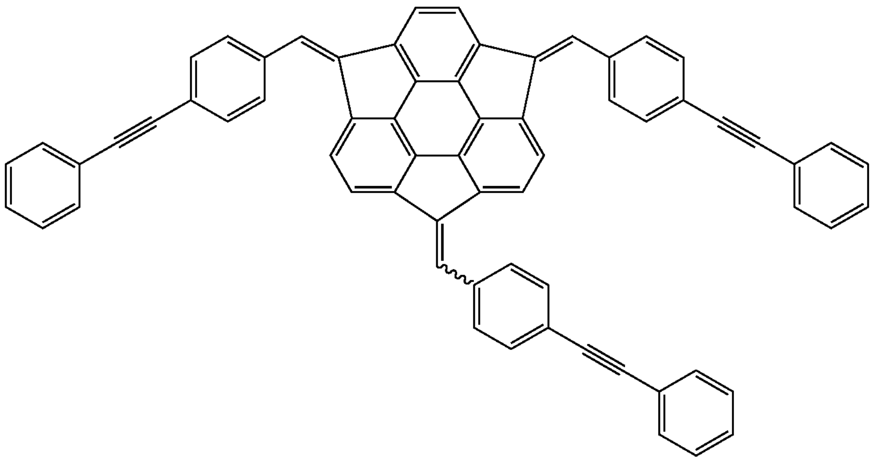

In the same manner as of the compound (A1) except that 4-ethynylphenylbenzaldehyde (C2) was used instead of 4-ethynylbenzaldehyde (C1), 2.2 g of a compound (A2) (69%) was obtained. Instrumental analysis data of this compound is shown below.

IR (ATR method): 3290, 3054, 2960, 2873, 2738, 2213, 2121, 1693, 1598, 1507, 1487, 1442, 1394, 1311, 1223, 1180, 1159, 1107, 1069, 1018, 910, 887, 824, 754, 689 $cm^{-1}$ $^1$H-NMR (600 MHz in $CDCl_3$): 7.90 (2H, m), 7.83 (2H, m), 7.66 (3H, m), 7.57 (10H, m), 7.47 (2H, m), 7.38 (15H, m), 7.24-7.16 (2H, m) ppm $^{13}$C-NMR (150 MHz in $CDCl_3$) 162.513, 147.535, 147.453, 147.403, 146.084, 145.787, 145.733, 145.495, 143.406, 143.159, 141.578, 141.125, 141.008, 136.370, 136.288, 136.218, 136.132, 132.213, 132.134, 132.047, 132.014, 131.914, 131.827, 131.751, 130.755, 130.207, 129.989, 129.837, 129.775, 128.573, 128.531, 128.334, 128.058, 127.815, 127.757, 127.516, 126.978, 125.776, 123.898, 123.765, 123.717, 123.512, 123.273, 121.209, 121.135, 121.010, 120.924, 115.325, 91.22, 89.57 ppm GPC: Mw/Mn=1.02

MS (Calcd. for $C_{66}H_{36}$+$H^+$): 829.289

MS (LC-MS): 829.288

(Synthesis Example 5) Synthesis of Compound (A3)

(A3)

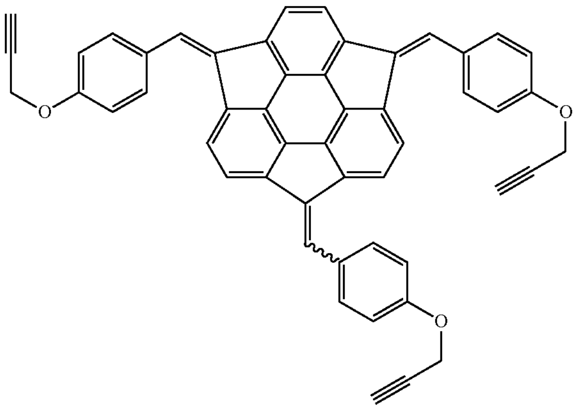

In the same manner as of the compound (A1) except that 4-(propargyloxy)benzaldehyde (C3) was used instead of 4-ethynylbenzaldehyde (C1), 2.0 g of a compound (A3) (75%) was obtained. Instrumental analysis data of this compound is shown below.

IR (ATR method): 3287, 3041, 2923, 2120, 1686, 1600, 1507, 1445, 1394, 1370, 1304, 1224, 1173, 1113, 1020, 978, 826, 681, 630 $cm^{-1}$ $^{1}$H-NMR (600 MHz in $CDCl_3$): 7.92-7.83 (8H, m), 7.49-7.27 (5H, m), 7.19-7.05 (8H, m), 4.83-4.77 (6H, m), 2.63-2.59 (3H, m) ppm $^{13}$C-NMR (150 MHz in $CDCl_3$): 158.139, 147.871, 147.547, 146.013, 145.667, 145.517, 145.237, 145.074, 143.373, 143.321, 139.383, 139.296, 132.048, 132.045, 131.347, 131.324, 131.298, 131.275, 130.171, 129.887, 129.847, 129.728, 128.270, 128.119, 127.902, 127.822, 127.608, 123.491, 123.343, 120.801, 120.707, 120.628, 120.506, 115.330, 115.171, 115.126, 78.85, 76.006, 56.052, 29.844 ppm GPC: Mw/Mn=1.06

MS (Calcd. for $C_{51}H_{30}O_3$+$H^+$) 691.227

MS (LC-MS): 691.226

(Synthesis Example 6) Synthesis of Compound (A4)

(A4)

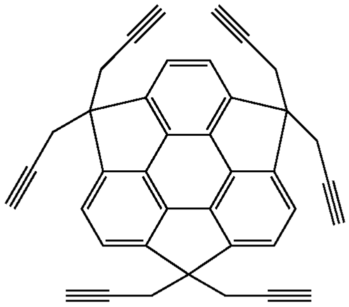

Under a nitrogen atmosphere, 1.0 g of sumanene (B1), 5.5 g of n-tetrabutylammonium bromide, 100 ml of a 30 wt % aqueous sodium hydroxide solution previously degassed with nitrogen bubbling, and 50 ml of THF were added. Thereafter, 10.0 g of a 80 wt % toluene solution of propargyl bromide (C4) was added, and the mixture was stirred at a room temperature for 100 hours. Into the mixture, 150 ml of MIBK was added, and washed with deionized water until the neutral. The obtained organic layer was condensed and then dissolved in MIBK, and hexane was added for crystallization. The crystal was filtered, washed, and dried in vacuo at 70° C. to obtain 1.5 g of (A4) (80%). Instrumental analysis data of this compound is shown below.

IR (ATR method): 3433, 3296, 2929, 2118, 1723, 1426, 1366, 1257, 1086, 825, 643 $cm^{-1}$ $^{1}$H-NMR (600 MHz in $CDCl_3$): 7.34 (6H, s), 3.47 (6H, d), 2.53 (6H, d), 2.26 (3H, t), 2.09 (3H, t)

$^{13}$C-NMR (150 MHz in $CDCl_3$): 154.911, 146.056, 122.961, 81.228, 71.604, 59.549, 24.629 ppm GPC: Mw/Mn=1.07

MS (Calcd. for $C_{39}H_{24}$+$H^+$): 493.195

MS (LC-MS): 493.195

(Synthesis Example 7) Synthesis of Compound (A5)

(A5)

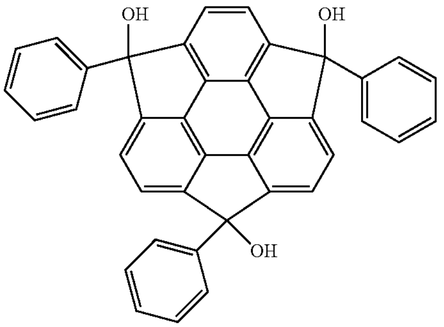

Under a nitrogen atmosphere, 1.0 g of trioxosumanene (B2) and 30 ml of THF were added. With stirring the mixture at a room temperature, 30 ml of a 1 M THE solution of phenylmagnesium bromide (C5) was added, and the mixture was stirred overnight. Then, 50 g of an aqueous ammonium chloride solution was added to terminate the reaction, and extraction was performed with 150 ml of MIBK. Thereafter, the organic layer was washed with deionized water until the neutral. Drying under a reduced pressure was performed with an evaporator, and an impurity was removed by silica gel column chromatography. The product was dissolved in MIBK, crystallized with hexane, filtered and washed, and dried in vacuo at 70° C. to obtain 1.4 g of (A5) (80%). Instrumental analysis data of this compound is shown below.

IR (ATR method): 3533, 3381, 3051, 3001, 1611, 1510, 1476, 1451, 1359 $cm^{-1}$ $^{1}$H-NMR (600 MHz in $CDCl_3$) 7.28 (15H, m), 7.02 (6H, s), 5.72 (3H, s) ppm $^{13}$C-NMR (150 MHz in $CDCl_3$): 160.321, 158.2, 146.223, 130.211, 122.415, 122.511, 116.283, 83.728 ppm GPC: Mw/Mn=1.03

(Synthesis Example 8) Synthesis of Compound (A6)

(A6)

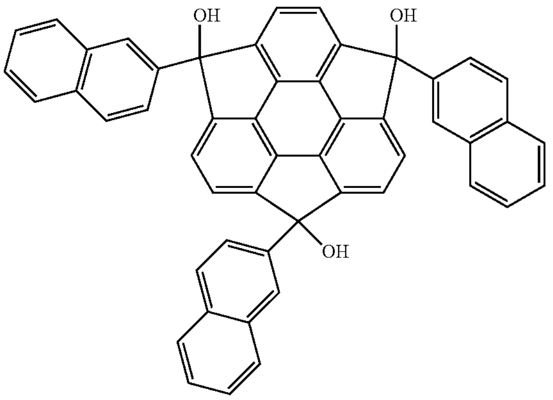

In the same manner as of the compound (A5) except that 2-naphthylmagnesium bromide (C6) prepared in Synthesis Example 1 was used instead of phenylmagnesium bromide (C5), 2.4 g of a compound (A6) (71%) was obtained. The yield and instrumental analysis data of this compound are shown below.

IR (ATR method): 3531, 3394, 3053, 3019, 1601, 1505, 1474, 1448, 1357 $cm^{-1}$ $^1$H-NMR (600 MHz in $CDCl_3$) 8.03-7.09 (21H, m), 7.04 (6H, s), 5.78 (3H, s) ppm $^{13}$C-NMR (150 MHz in $CDCl_3$) 161.312, 150.343, 146.273, 140.442, 139.686, 133.223, 132.639, 128.148, 127.497, 126.004, 125.774, 124.146, 121.122, 83.712 ppm GPC: Mw/Mn=1.05

(Synthesis Example 9) Synthesis of Compound (A7)

(A7)

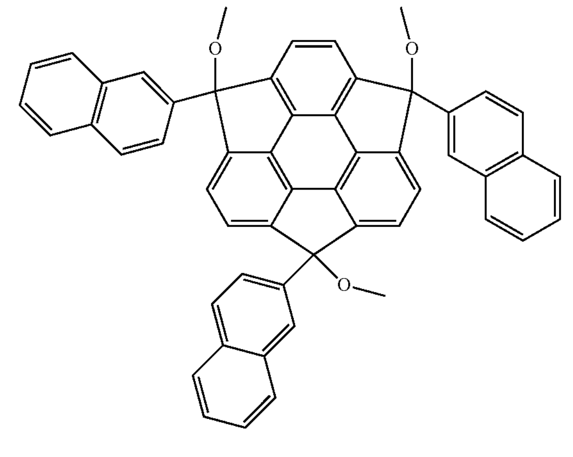

Under a nitrogen atmosphere, 1.0 g of the compound (A6) synthesized in Synthesis Example 8 and 20.0 g of methanol were added. Dropwise addition of 2.0 g of methanesulfonic acid was performed, and the mixture was stirred under reflux for 3 hours. Into the mixture, 150 ml of toluene was added, and washed with deionized water until the neutral. The obtained organic layer was condensed and dissolved in MIBK, and hexane was added for crystallization. The crystal was filtered and washed to obtain 0.93 g of (A7) (88%). Instrumental analysis data of this compound is shown below.

IR (ATR method): 3051, 2927, 2826, 1603, 1446, 1160, 1082 $cm^{-1}$ $^1$H-NMR (600 MHz in $CDCl_3$) 8.03-7.09 (21H, m), 7.04 (6H, s), 3.06 (9H, s)

$^{13}$C-NMR (150 MHz in $CDCl_3$) 161.293, 146.877, 146.221, 141.017, 140.778, 133.271, 132.649, 127.727, 126.384, 125.659, 124.357, 123.945, 120.913, 89.189, 51.445 ppm GPC: Mw/Mn=1.04

(Synthesis Example 10) Synthesis of Compound (A8)

(A1)

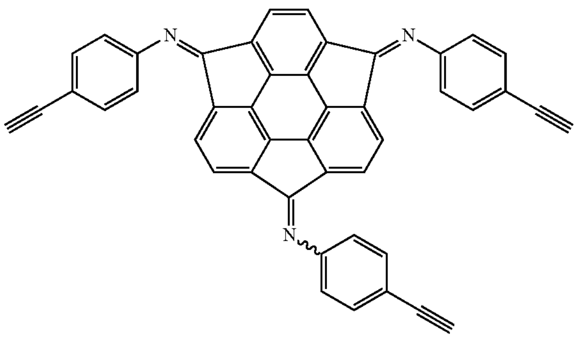

Under a nitrogen atmosphere, 1.5 g of trioxosumanene (B2), 5.3 g of 4-ethynylaniline (C7), 5.0 g of activated molecular sieve (MS4A), and 20 ml of dehydrated toluene were added, and the mixture was allowed to be reacted at 120° C. for 6 hours. Into the mixture, 5.3 g of 4-ethynylaniline (C7) and 5.0 g of activated molecular sieve (MS4A) were additionally added, and the reaction was proceeded for another 24 hours. The reaction solution was dried under a reduced pressure with an evaporator, and an impurity was removed by silica gel column chromatography. The product was dissolved in MIBK, crystallized with hexane, filtered, washed, and dried in vacuo at 70° C. to obtain 1.3 g of (A8) (39%). Instrumental analysis data of this compound is shown below.

IR (ATR method): 3339, 3021, 2911, 2850, 1888, 1717, 1651, 1611, 1553, 1499, 1388 $cm^{-1}$ $^1$H-NMR (600 MHz in $CDCl_3$): 6.08 (2H, d), 6.50 (2H, d), 6.92-7.30 (12H, m), 7.61 (2H, d) ppm $^{13}$C-NMR (150 MHz in $CDCl_3$): 163.186, 162.893, 148.965, 148.800, 148.466, 148.399, 148.365, 148.300, 148.286, 148.211, 148.191, 148.139, 147.941, 147.851, 136.213, 136.279, 136.173, 136.122, 130.235, 130.220, 130.099, 130.077, 126.801, 126.635, 126.603, 126.516, 124.900, 124.813, 124.644, 124.625, 120.961, 120.922, 120.744, 76.496, 56.092 ppm GPC: Mw/Mn=1.08

Comparative Synthesis Example (Comparative Synthesis Example 1) Synthesis of Compound (R1)

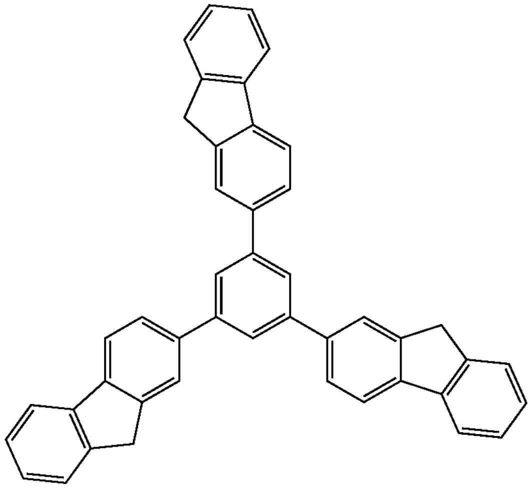

Under a nitrogen atmosphere, 120 g of 2-acetylfluorene and 120 g of m-xylene were added, and the mixture was heated to 110° C. to be a homogeneous solution. Into the solution, 21.0 g of dodecylbenzenesulfonic acid was added, and the mixture was heated to 140° C. to be reacted for 16 hours. The reaction liquid was added into methanol for crystallization, the crystal was filtered, washed, and dried in vacuo at 70° C. to obtain (R1). The weight-average molecular weight (Mw) and the dispersion degree (Mw/Mn) were determined by GPC, and Mw=620 and Mw/Mn=1.03.

(Comparative Synthesis Example 2) Synthesis of Compound (R2)

(R2)

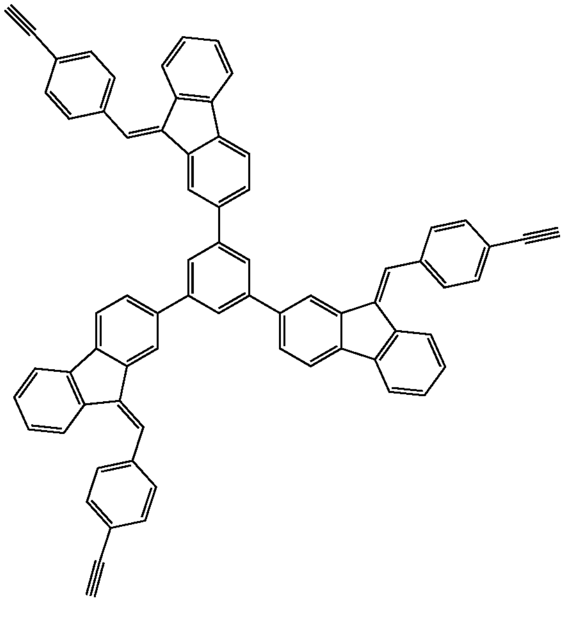

Under a nitrogen atmosphere, 10.0 g of the compound (R1) synthesized in Comparative Synthesis Example 1, 25.0 g of n-tetrabutylammonium bromide, 300 ml of a 30 wt % aqueous sodium hydroxide solution previously degassed with nitrogen bubbling, and 100 ml of THF were added. Thereafter, 14.0 g of 4-ethynylbenzaldehyde (C1) was added, and the mixture was stirred at a room temperature for 15 hours. Into the mixture, 150 ml of MIBK was added, and washed with deionized water until the neutral. The obtained organic layer was condensed and then dissolved in MIBK, and methanol was added for crystallization. The crystal was filtered, washed, and dried in vacuo at 70° C. to obtain (R2). The weight-average molecular weight (Mw) and the dispersion degree (Mw/Mn) were determined by GPC, and Mw=960 and Mw/Mn=1.04.

(Comparative Synthesis Example 3) Synthesis of Compound (R3)

(R3)

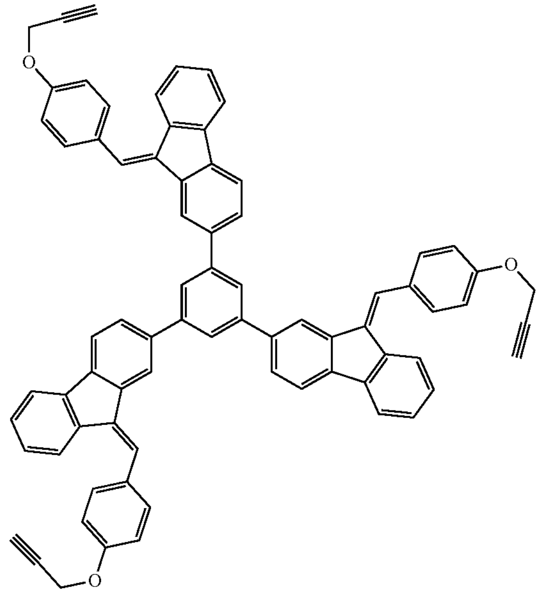

A compound (R3) was obtained in the same manner as of the compound (R2) except that 4-(propargyloxy)benzaldehyde (C3) was used instead of 4-ethynylbenzaldehyde (C1). The weight-average molecular weight (Mw) and the dispersion degree (Mw/Mn) were determined by GPC, and Mw=960 and Mw/Mn=1.04.

(Comparative Synthesis Example 4) Synthesis of Compound (R4)

(R4)

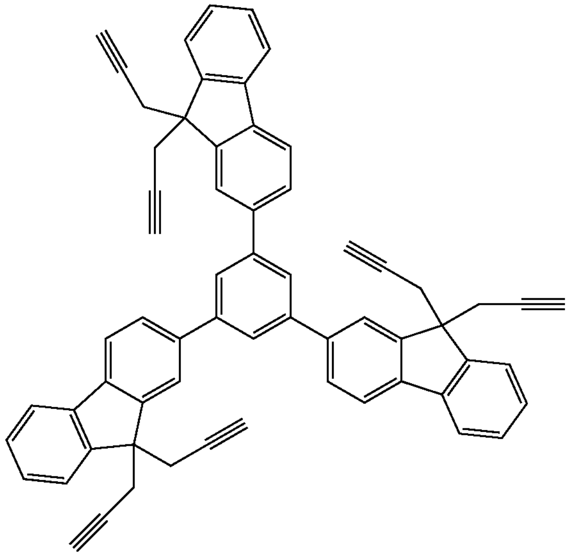

Under a nitrogen atmosphere, 10.0 g of the compound (R1) synthesized in Comparative Synthesis Example 1, 25.0 g of n-tetrabutylammonium bromide, 300 ml of a 30 wt % aqueous sodium hydroxide solution previously degassed with nitrogen bubbling, and 100 ml of THF were added. Thereafter, 100 g of a 80 wt % toluene solution of propargyl bromide (C4) was added, and the mixture was stirred at 90° C. for 48 hours. Into the mixture, 150 ml of MIBK was added, and washed with deionized water until the neutral. The obtained organic layer was condensed and then dissolved in MIBK, and hexane was added for crystallization. The crystal was filtered, washed, and dried in vacuo at 70° C. to obtain (R4). The weight-average molecular weight (Mw) and the dispersion degree (Mw/Mn) were determined by GPC, and Mw=820 and Mw/Mn=1.05.

(Comparative Synthesis Example 5) Synthesis of Compound (R5)

(R5)

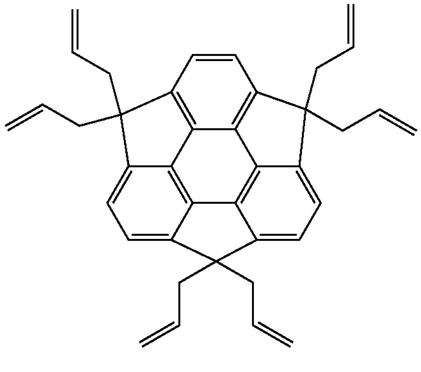

Under a nitrogen atmosphere, 1.0 g of sumanene (B1), 5.5 g of n-tetrabutylammonium bromide, 100 ml of a 30 wt % aqueous sodium hydroxide solution previously degassed with nitrogen bubbling, and 50 ml of THE were added. Thereafter, 10.0 g of allyl bromide was added, and the mixture was stirred at a room temperature for 45 hours. Into the mixture, 150 ml of MIBK was added, and washed with deionized water until the neutral. The obtained organic layer was condensed and then dissolved in MIBK, and hexane was added for crystallization. The crystal was filtered, washed, and dried in vacuo at 70° C. to obtain (R5). The weight-average molecular weight (Mw) and the dispersion degree (Mw/Mn) were determined by GPC, and Mw=520 and Mw/Mn=1.05.

Preparation of Composition for Forming Organic Film (UDL-1 to 15 and Comparative UDL-1 to 5)

The compounds (A1) to (A8), the comparative compounds (R1) to (R5), (S1) 1,6-diacetoxyhexane (boiling point: 260° C.), and (S2) tripropylene glycol monomethyl ether (boiling point: 242° C.) as the high boiling-point organic solvent were used to be dissolved at proportions shown in Table 1 using propylene glycol monomethyl ether acetate (PGMEA) and cyclohexanone (CyHO) containing 0.1 mass % of FC-4430 (manufactured by Sumitomo 3M Limited). The solution was filtered with a filter made of a fluororesin with 0.1 m to prepare each of compositions for forming an organic film (UDL-1 to 15 and Comparative UDL-1 to 5). For UDL-6, 8, and 10, a thermal acid generator (TAG) represented by the following formula was used.

TABLE 1

| Composition for forming organic film | Compound (parts by mass) | Additive (parts by mass) | High boiling-point organic solvent (parts by mass) | Organic solvent (parts by mass) |
|---|---|---|---|---|
| UDL-1 | A1 (10) | — | — | PGMEA (90) |
| UDL-2 | A2 (10) | — | — | PGMEA (90) |
| UDL-3 | A3 (10) | — | — | PGMEA (90) |
| UDL-4 | A4 (10) | — | — | PGMEA (90) |
| UDL-5 | A5 (10) | — | — | PGMEA/CyHO = 70/30 (90) |
| UDL-6 | A5 (10) | TAG (0.5) | — | PGMEA/CyHO = 70/30 (90) |
| UDL-7 | A6 (10) | — | — | PGMEA/CyHO = 70/30 (90) |
| UDL-8 | A6 (10) | TAG (0.5) | — | PGMEA/CyHO = 70/30 (90) |
| UDL-9 | A7 (10) | — | — | PGMEA/CyHO = 70/30 (90) |
| UDL-10 | A7 (10) | TAG (0.5) | — | PGMEA/CyHO = 70/30 (90) |
| UDL-11 | A8 (10) | — | — | PGMEA (90) |
| UDL-12 | A1 (10) | — | S1 (10) | PGMEA (80) |
| UDL-13 | A4 (10) | — | S1 (10) | PGMEA (80) |
| UDL-14 | A1 (10) | — | S2 (10) | PGMEA (80) |
| UDL-15 | A4 (10) | — | S2 (10) | PGMEA (80) |
| Comparative UDL-1 | R1 (10) | — | — | PGMEA/CyHO = 70/30 (90) |
| Comparative UDL-2 | R2 (10) | — | — | PGMEA (90) |
| Comparative UDL-3 | R3 (10) | — | — | PGMEA (90) |
| Comparative UDL-4 | R4 (10) | — | — | PGMEA/CyHO = 70/30 (90) |
| Comparative UDL-5 | R5 (10) | — | — | PGMEA/CyHO = 70/30 (90) |

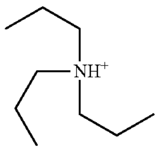

$CF_3CF_2CF_2SO_3^-$

TAG

Examples 1-1 to 1-15 and Comparative Examples 1-1 to 1-5

(Measurement of Solvent Resistance)

The above UDL-1 to 15 and Comparative UDL-1 to 5 were each applied on a silicon substrate, baked in the atmosphere at 350° C. for 60 seconds, and then the film thickness was measured. A PGMEA solvent was dispensed thereon, left to stand for 30 seconds, then spin-dried, baked at 100° C. for 60 seconds to evaporate PGMEA, and the film thicknesses before and after the PGMEA treatment were measured. Using the film thickness after the film formation and the film thickness after the PGMEA treatment, the film residual rate was determined. Table 2 shows the results.

TABLE 2

| | Composition for forming organic film | Film thickness after film formation: a (Å) | Film thickness after PGMEA treatment: b (Å) | b/a × 100 (%) |
|---|---|---|---|---|
| Example 1-1 | UDL-1 | 998 | 997 | 99.9 |
| Example 1-2 | UDL-2 | 1001 | 999 | 99.8 |
| Example 1-3 | UDL-3 | 1003 | 1001 | 99.8 |
| Example 1-4 | UDL-4 | 995 | 994 | 99.9 |
| Example 1-5 | UDL-5 | 1002 | 993 | 99.1 |
| Example 1-6 | UDL-6 | 1006 | 1004 | 99.8 |
| Example 1-7 | UDL-7 | 998 | 991 | 99.3 |
| Example 1-8 | UDL-8 | 999 | 996 | 99.7 |
| Example 1-9 | UDL-9 | 996 | 989 | 99.3 |
| Example 1-10 | UDL-10 | 1003 | 1002 | 99.9 |
| Example 1-11 | UDL-11 | 1000 | 997 | 99.7 |
| Example 1-12 | UDL-12 | 995 | 992 | 99.7 |
| Example 1-13 | UDL-13 | 998 | 997 | 99.9 |
| Example 1-14 | UDL-14 | 1003 | 1001 | 99.8 |
| Example 1-15 | UDL-15 | 1000 | 998 | 99.8 |
| Comparative Example 1-1 | Comparative UDL-1 | 999 | 928 | 92.9 |
| Comparative Example 1-2 | Comparative UDL-2 | 998 | 997 | 99.9 |
| Comparative Example 1-3 | Comparative UDL-3 | 997 | 996 | 99.9 |
| Comparative Example 1-4 | Comparative UDL-4 | 996 | 993 | 99.7 |
| Comparative Example 1-5 | Comparative UDL-5 | 1003 | 990 | 98.7 |

As shown in Table 2, the organic films (Examples 1-1 to 1-15) using the inventive compound have 99% or more of the film residual rate after the PGMEA treatment. It is found that the thermal treatment proceeds the crosslinking reaction to exhibit sufficient solvent resistance. From these results, it is found that the inventive compound having the specific partial structure has the thermal curability. Comparison between Examples 1-5, 1-7, and 1-9, and Examples 1-6, 1-8, and 1-10 finds that adding the thermal acid generator increases the film residual rate by 0.4 to 0.7% compared with the compound alone. It is found that an action of the acid catalyst forms a denser film, and the organic films (Comparative Examples 1-2 to 1-4) using the compounds having similar partial structures and the organic film (Comparative Example 1-5) using the compound having the sumanene skeleton also exhibit the solvent resistance.

Examples 2-1 to 2-15 and Comparative Examples 2-1 to 2-5

(Hardness Measurement)

The above UDL-1 to 15 and Comparative UDL-1 to 5 were each applied on a silicon substrate, and baked in the atmosphere at 350° C. for 60 seconds to form an organic film having a film thickness of 200 nm. These organic films were subjected to a nano-indentation test with Nano Indenter SA2-type device, manufactured by TOYO Corporation, to measure the hardness of the organic films. Table 3 shows the results.

TABLE 3

| | Composition for forming organic film | Hardness (GPa) |
|---|---|---|
| Example 2-1 | UDL-1 | 0.80 |
| Example 2-2 | UDL-2 | 0.78 |
| Example 2-3 | UDL-3 | 0.75 |
| Example 2-4 | UDL-4 | 0.73 |
| Example 2-5 | UDL-5 | 0.71 |
| Example 2-6 | UDL-6 | 0.75 |
| Example 2-7 | UDL-7 | 0.72 |
| Example 2-8 | UDL-8 | 0.76 |
| Example 2-9 | UDL-9 | 0.70 |
| Example 2-10 | UDL-10 | 0.77 |
| Example 2-11 | UDL-11 | 0.75 |
| Example 2-12 | UDL-12 | 0.79 |
| Example 2-13 | UDL-13 | 0.72 |
| Example 2-14 | UDL-14 | 0.80 |
| Example 2-15 | UDL-15 | 0.72 |
| Comparative Example 2-1 | Comparative UDL-1 | 0.63 |
| Comparative Example 2-2 | Comparative UDL-2 | 0.66 |
| Comparative Example 2-3 | Comparative UDL-3 | 0.64 |
| Comparative Example 2-4 | Comparative UDL-4 | 0.65 |
| Comparative Example 2-5 | Comparative UDL-5 | 0.69 |

As shown in Table 3, comparison between Examples 2-1 to 2-15 and Comparative Examples 2-1 to 2-4 finds that the compounds having the sumanene structure have excellent film hardness. In Examples 2-5 to 2-10, comparison between Examples 2-5, 2-7, and 2-9, and Examples 2-6, 2-8, and 2-10 finds that the hardness in Examples 2-6, 2-8, and 2-10 is higher, and thereby adding the thermal acid generator, similarly to Example 1, increases the hardness and forms the dense film. Comparison between Example 2-1 and Comparative Example 2-2, between Example 2-3 and Comparative Example 2-3, and between Example 2-4 and Comparative Example 2-4, which have the same substituent structure, find that the inventive compounds having the introduced sumanene-containing structure have higher hardness. This is because the film is densified by the sumanene structure, and presumably derived from the fact that the sumanene itself has a property of easily forming an aggregation. In addition, comparison between Example 2-4 and Comparative Example 2-5, which have the sumanene structure, has confirmed that the compound having the introduced propargyl group yields higher hardness than the compound having the introduced allyl group, and can form a denser film. The dense film can be similarly formed presumably because the propargyl group substitution has further excellent solvent resistance, as the result of the solvent resistance test in Example 1.

Example 3-1 to 3-15 and Comparative Example 3-1 to 3-5

(Etching Test)

[Etching Test with $CF_4$/$CHF_3$-Based Gas]

The above UDL-1 to 15 and Comparative UDL-1 to 5 were each applied on a silicon substrate, and baked in the atmosphere at 350° C. for 60 seconds to form an organic film so as to have a film thickness of 200 nm. Then, an etching test with $CF_4$/$CHF_3$-based gas was performed under the following condition, and the difference in film thickness of the organic film before and after the etching was determined. Table 4 shows the results. For the etching, a dry etching device TE-8500, manufactured by Tokyo Electron Ltd., was used.

The etching condition is as follows.

Chamber pressure: 40.0 Pa

RF power: 1,000 W $CHF_3$ gas flow rate: 10 ml/min $CF_4$ gas flow rate: 100 ml/min He gas flow rate: 200 ml/min Time: 20 sec

TABLE 4

| | | Etching test with $CF_4$/$CHF_3$-based gas | | Etching test with $O_2$-based gas | |
|---|---|---|---|---|---|
| | Composition for forming organic film | Reduction in film thickness (Å) | Reduction in film relative to Comparative UDL-1 being 100% | Reduction in film thickness (Å) | Reduction in film relative to Comparative UDL-1 being 100% |
| Example 3-1 | UDL-1 | 798 | 89% | 1276 | 90% |
| Example 3-2 | UDL-2 | 809 | 90% | 1289 | 91% |
| Example 3-3 | UDL-3 | 839 | 93% | 1334 | 94% |
| Example 3-4 | UDL-4 | 821 | 91% | 1301 | 92% |
| Example 3-5 | UDL-5 | 821 | 91% | 1340 | 95% |
| Example 3-6 | UDL-6 | 811 | 90% | 1311 | 93% |
| Example 3-7 | UDL-7 | 815 | 91% | 1313 | 93% |
| Example 3-8 | UDL-8 | 805 | 90% | 1299 | 92% |
| Example 3-9 | UDL-9 | 814 | 91% | 1310 | 93% |
| Example 3-10 | UDL-10 | 807 | 90% | 1301 | 92% |
| Example 3-11 | UDL-11 | 843 | 94% | 1336 | 95% |
| Example 3-12 | UDL-12 | 801 | 89% | 1277 | 90% |
| Example 3-13 | UDL-13 | 820 | 91% | 1301 | 92% |
| Example 3-14 | UDL-14 | 799 | 89% | 1280 | 91% |
| Example 3-15 | UDL-15 | 819 | 91% | 1301 | 92% |
| Comparative Example 3-1 | Comparative UDL-1 | 898 | 100% | 1413 | 100% |
| Comparative Example 3-2 | Comparative UDL-2 | 850 | 95% | 1343 | 95% |
| Comparative Example 3-3 | Comparative UDL-3 | 891 | 99% | 1396 | 99% |
| Comparative Example 3-4 | Comparative UDL-4 | 872 | 97% | 1356 | 96% |
| Comparative Example 3-5 | Comparative UDL-5 | 854 | 95% | 1332 | 94% |

Table 4 shows the reduction in film in each of Examples and Comparative Examples as proportions relative to the reduced film thickness of Comparative UDL-1 by the etching with $CF_4$/$CHF_3$-based gas being 100%. The smaller the proportion, the further excellent the etching resistance.

[Etching Test with $O_2$-Based Gas]

The above UDL-1 to 15 and Comparative UDL-1 to 5 were each applied on a silicon substrate, and baked in the atmosphere at 350° C. for 60 seconds to form an organic film so as to have a film thickness of 200 nm. Then, an etching test with $O_2$-based gas was performed under the following condition, and determined was the difference in film thickness of the organic film before and after the etching. Table 4 also shows the results. For the etching, a dry etching device TE-8500, manufactured by Tokyo Electron Ltd., was used.

The etching condition is as follows.

Chamber pressure: 40.0 Pa

RF power: 100 W $O_2$ gas flow rate: 30 ml/min $N_2$ gas flow rate: 70 ml/min

Time: 60 sec

Similarly to the etching test with $CF_4$/$CHF_3$-based gas, Table 4 shows the reduction in film in each of Examples and Comparative Examples as proportions relative to the reduced film thickness of Comparative UDL-1 by the etching with $O_2$-based gas being 100%. The smaller the proportion, the further excellent the etching resistance.

As shown in Table 4, with comparing Examples 3-1 to 3-15 and Comparative Examples 3-1 to 3-4, the reduction in the film of Examples after the etching is equal to or smaller than that of Comparative Examples in any of the etching tests with $CF_4$/$CHF_3$-based gas and 02-based gas. It is found that the organic film having excellent etching resistance is formed in Examples. In particular, Examples 3-1, 3-2, and 3-4, which have no heteroatom structure and Examples 3-5 to 3-10, which lose the heteroatom by curing, result in good etching resistance. Similarly to Example 2, comparison between Example 3-1 and Comparative Example 3-2, between Example 3-3 and Comparative Example 3-3, and between Example 3-4 and Comparative Example 3-4, which each have the same substituent structure, comparing the etching resistance using the same substituent structure finds that using the compounds having the sumanene structure forms an organic film having further excellent etching resistance. Similarly, comparing Example 3-4 and Comparative Example 3-5, which have the sumanene skeleton has been confirmed that Example 3-4 has better etching resistance, and the propargyl group further advantageously serves on the etching resistance than the allyl group. It is presumed that, as shown in Example 1 and Example 2, excellence in the solvent resistance and the hardness allows to form a denser film.

Examples 4-1 to 4-15 and Comparative Examples 4-1 to 4-5

(Pattern-Etching Test)

The above UDL-1 to 15 and Comparative UDL-1 to 5 were each applied on a Si wafer substrate with 300 mm in diameter having a formed $SiO_2$ film with 200 nm in film thickness to form an organic film so that the organic film had a film thickness of 200 nm after baking in the atmosphere at 350° C. for 60 seconds. A silicon-containing resist intermediate film material (SOG-1) was applied thereon, and baked at 220° C. for 60 seconds to form a resist intermediate film with 35 nm in film thickness. A resist upper layer film material (SL resist for ArF) was applied, and baked at 105° C. for 60 seconds to form a resist upper layer film with 100 nm in film thickness. An immersion protective film (TC-1) was applied on the resist upper layer film, and baked at 90° C. for 60 seconds to form a protective film with 50 nm in film thickness.

The resist upper layer film material (SL resist for ArF) was prepared by: dissolving 100 parts by mass of a polymer (RP 1) represented by the following formula, 6.6 parts by mass of an acid generator (PAG 1) represented by the following formula, and 0.8 parts by mass of a basic compound (Amine 1) represented by the following formula in 2500 parts by mass of PGMEA containing 0.1 mass % of FC-430 (manufactured by manufactured by Sumitomo 3M Limited); and filtering the solution with a filter made of a fluororesin with 0.1 μm.

RP1

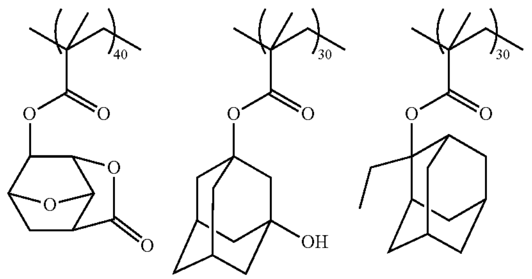

Mw 7,800

PAG1

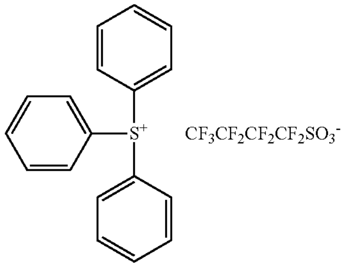

-continued

Amine1

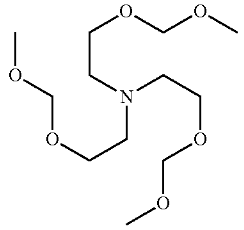

The immersion protective material (TC-1) was prepared by: dissolving 100 parts by mass of a protective film polymer (PP 1) represented by the following formula in an organic solvent composed of 2700 parts by mass of diisoamyl ether and 270 parts by mass of 2-methyl-1-butanol; and filtering the solution with a filter made of a fluororesin with 0.1 μm.

PP1

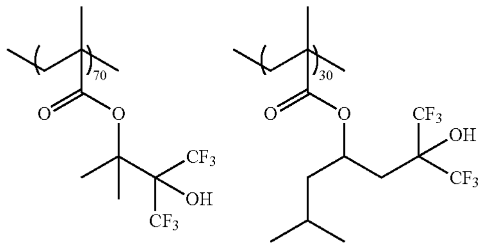

Mw 8,800

The silicon-containing resist intermediate film material (SOG-1) was prepared by: dissolving 100 parts by mass of a silicon-containing intermediate film polymer for ArF (SiP 1) represented by the following formula and 1 part by mass of a crosslinking catalyst (CAT 1) represented by the following formula in 4000 parts by mass of PGMEA containing 0.1 mass % of FC-4430 (manufactured by Sumitomo 3M Limited); and filtering the solution with a filter made of a fluororesin with 0.1 μm in pore diameter.

SiP1

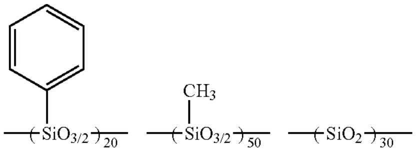

Mw 3,400

CAT1

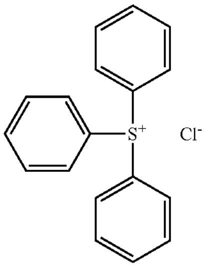

Then, the film was exposed by using an ArF immersion exposure device (manufactured by NIKON CORPORA- TION; NSR-S610C, NA 1.30, σ0.98/0.65, 35°-dipole s-polarized illumination, 6% halftone phase-shifting mask) with changing the exposure dose, baked at 100° C. for 60 seconds (PEB), and developed with a 2.38 mass % aqueous solution of tetramethylammonium hydroxide (TMAH) for 30 seconds to obtain a positive-type line-and-space pattern having resist line widths from 50 nm to 30 nm with a pitch of 100 nm.

Then, sequentially performed were: processing the silicon-containing resist intermediate film while using the resist pattern as a mask by dry etching using "Telius", manufactured by Tokyo Electron Ltd.; processing the organic film while using the silicon-containing resist intermediate film as a mask; and processing the $SiO_2$ film (body to be processed) while using the organic film as a mask.

The etching condition is as follows.

Transferring Condition of Resist Pattern to SOG Film (Silicon-Containing Resist Intermediate Film):

Chamber pressure: 10.0 Pa
RF power: 1,500 W
$CF_4$ gas flow rate: 15 sccm
$O_2$ gas flow rate: 75 sccm
Time: 15 sec Transferring Condition of SOG Film (Silicon-Containing Resist Intermediate Film) to Organic Film:

Chamber pressure: 2.0 Pa
RF power: 500 W
Ar gas flow rate: 75 sccm
$O_2$ gas flow rate: 45 sccm
Time: 120 sec Transferring Condition to $SiO_2$ Film (Body to be Processed)

Chamber pressure: 2.0 Pa
PF power: 2,200 W
$C_5F_{12}$ gas flow rate: 20 sccm
$C_2F_6$ gas flow rate: 10 sccm
Ar gas flow rate: 300 sccm
$O_2$ gas flow rate: 60 sccm
Time: 90 sec Observed with an electron microscope (S-4700), manufactured by Hitachi, Ltd., was each pattern cross section of: the pattern shape after the development; the shape of the silicon-containing resist intermediate film after the transferring etching; the shape of the organic film after the transferring etching; and the shape of the body to be processed after the transferring etching. In addition, the critical dimension (nm) without twisting of each pattern of the body to be processed after the transferring etching was measured. Table 5 summarizes the results.

TABLE 5

| | Composition for forming organic film | Pattern shape after development | Shape of silicon-containing resist intermediate film after transferring etching | Shape of organic film after transferring etching | Shape of body to be processed after transferring etching | Critical dimension of pattern of body to be processed after transferring etching (nm) |
|---|---|---|---|---|---|---|
| Example 4-1 | UDL-1 | Vertical | Vertical | Vertical | Vertical | 25.2 |
| Example 4-2 | UDL-2 | Vertical | Vertical | Vertical | Vertical | 26.0 |
| Example 4-3 | UDL-3 | Vertical | Vertical | Vertical | Vertical | 27.2 |
| Example 4-4 | UDL-4 | Vertical | Vertical | Vertical | Vertical | 28.1 |
| Example 4-5 | UDL-5 | Vertical | Vertical | Vertical | Vertical | 28.9 |
| Example 4-6 | UDL-6 | Vertical | Vertical | Vertical | Vertical | 27.2 |
| Example 4-7 | UDL-7 | Vertical | Vertical | Vertical | Vertical | 28.5 |
| Example 4-8 | UDL-8 | Vertical | Vertical | Vertical | Vertical | 26.8 |
| Example 4-9 | UDL-9 | Vertical | Vertical | Vertical | Vertical | 29.3 |
| Example 4-10 | UDL-10 | Vertical | Vertical | Vertical | Vertical | 26.4 |
| Example 4-11 | UDL-11 | Vertical | Vertical | Vertical | Vertical | 27.2 |
| Example 4-12 | UDL-12 | Vertical | Vertical | Vertical | Vertical | 25.6 |
| Example 4-13 | UDL-13 | Vertical | Vertical | Vertical | Vertical | 28.5 |
| Example 4-14 | UDL-14 | Vertical | Vertical | Vertical | Vertical | 25.2 |
| Example 4-15 | UDL-15 | Vertical | Vertical | Vertical | Vertical | 28.5 |
| Comparative Example 4-1 | Comparative UDL-1 | Vertical | Vertical | Vertical | Vertical | 32.2 |
| Comparative Example 4-2 | Comparative UDL-2 | Vertical | Vertical | Vertical | Vertical | 31.0 |
| Comparative Example 4-3 | Comparative UDL-3 | Vertical | Vertical | Vertical | Vertical | 31.8 |
| Comparative Example 4-4 | Comparative UDL-4 | Vertical | Vertical | Vertical | Vertical | 31.4 |
| Comparative Example 4-5 | Comparative UDL-5 | Vertical | Vertical | Vertical | Vertical | 30.1 |

From the results of Examples 4-1 to 4-15, it is found that using UDL-1 to 15 as the organic film of the three-layer resist for the immersion lithography yields good resist shape after the development in the pattern shape evaluation, and has useful effect as the anti-reflective film. Comparative Examples yield the similar results.

Of the pattern shape after the etching, both of: the resist shape after the development; and the organic film after the oxygen etching and after the substrate-processing etching were good in all the Examples and Comparative Examples. Meanwhile, the critical dimension without twisting of the pattern of the body to be processed after the transferring etching varies depending on the resist line width formed by the exposure. Although Comparative Example 4-1 causes pattern twisting with a line width of approximately 33 nm, Examples 4-1 to 4-15, which use the inventive compound, cause no twisting even with 30 nm or less in pattern size. Examples are found to have high twisting resistance. With the compounds having the substituent structure same as the present invention, comparison between Example 4-1 and Comparative Example 4-2, between Example 4-3 and Comparative Example 4-3, and between Example 4-4 and Comparative Example 4-4 finds that the organic film using the inventive compound having the sumanene structure has further excellent twisting resistance.

Examples 5-1 to 5-15 and Comparative Examples 5-1 to 5-5

(Embedding Ability)

On a stepped $SiO_2$ substrate in which a dense hole pattern with 500 nm in thickness and 160 nm in diameter was formed, UDL-1 to 15 were each applied to form an organic film under a condition such that the film thickness was 80 nm on a flat substrate by baking at 350° C. for 60 seconds. The substrate having the formed organic film was cut, and whether the organic film embedded the hole bottom was observed with a scanning electron microscope (SEM). Table 6 shows the results.

TABLE 6

| | Composition for forming organic film | Embedding ability |
|---|---|---|
| Example 5-1 | UDL-1 | Favorably embedding holes |
| Example 5-2 | UDL-2 | Favorably embedding holes |
| Example 5-3 | UDL-3 | Favorably embedding holes |
| Example 5-4 | UDL-4 | Favorably embedding holes |
| Example 5-5 | UDL-5 | Favorably embedding holes |
| Example 5-6 | UDL-6 | Favorably embedding holes |
| Example 5-7 | UDL-7 | Favorably embedding holes |
| Example 5-8 | UDL-8 | Favorably embedding holes |
| Example 5-9 | UDL-9 | Favorably embedding holes |
| Example 5-10 | UDL-10 | Favorably embedding holes |
| Example 5-11 | UDL-11 | Favorably embedding holes |
| Example 5-12 | UDL-12 | Favorably embedding holes |
| Example 5-13 | UDL-13 | Favorably embedding holes |
| Example 5-14 | UDL-14 | Favorably embedding holes |
| Example 5-15 | UDL-15 | Favorably embedding holes |
| Comparative Example 5-1 | Comparative UDL-1 | Favorably embedding holes |
| Comparative Example 5-2 | Comparative UDL-2 | Favorably embedding holes |
| Comparative Example 5-3 | Comparative UDL-3 | Favorably embedding holes |
| Comparative Example 5-4 | Comparative UDL-4 | Favorably embedding holes |
| Comparative Example 5-5 | Comparative UDL-5 | Favorably embedding holes |

As shown in Table 6, any of Examples 5-1 to 5-15, which form the organic film using the inventive UDL-1 to UDL-15, can favorably embed the hole bottom. It is found that the inventive UDL-1 to 15 are promising to have sufficient embedding ability even with a step on a body to be processed, and have useful properties as an organic film material for the multilayer process. Comparative Examples yield the similar results.

Examples 6-1 to 6-6 (Planarizing Ability)

Each of the compositions for forming an organic film (UDL-1, 4 and 12 to 15) was applied on a $SiO_2$ wafer substrate having a giant isolated trench pattern (trench width: 10 μm, trench depth: 0.10 μm). The composition was calcined in the atmosphere at 350° C. for 60 seconds. Then, a step on the organic film between the trenched portion and the non-trenched portion (delta in FIG. 2) was observed by using NX10 atomic force microscope (AFM), manufactured by Park Systems Corporation. Table 7 shows the results. In this evaluation, the smaller the step, the better the planarizing ability. In this evaluation, the trench pattern with 0.10 μm in depth is planarized by using the composition for forming an organic film with a typical film thickness of approximately 0.2 μm, which is a strict evaluation condition to evaluate relative planarizing ability.

TABLE 7

| | Composition for forming organic film | Step (nm) |
|---|---|---|
| Example 6-1 | UDL-1 | 80 |
| Example 6-2 | UDL-4 | 85 |
| Example 6-3 | UDL-12 | 75 |
| Example 6-4 | UDL-13 | 80 |
| Example 6-5 | UDL-14 | 75 |
| Example 6-6 | UDL-15 | 75 |

As shown in Table 7, with comparing Examples 6-3 to 6-6, which add the high boiling-point organic solvent, and Examples 6-1 to 6-2, which do not add the high boiling-point organic solvent, the steps in Examples 6-3 to 6-6 are same as or smaller than the steps in Examples 6-1 to 6-2. Thus, it is found that adding the high boiling-point organic solvent improves the planarizing ability. It has been confirmed that regulating the organic solvent composition of the inventive composition can also improve the planarizing ability.

Examples 7-1 to 7-15 and Comparative Examples 7-1 to 7-5

(Heat Resistance Test)

Each of the compositions for forming an organic film (UDL-1 to 15 and Comparative UDL-1 to 5) was applied on a Si substrate, baked in nitrogen at 350° C. for 60 seconds, and the film thickness was measured. Thereafter, the film was further baked at 450° C. for 60 seconds, and then the film thickness was measured again. Then, the reduction rate in film thickness (%) was measured by the following expression to use this reduction rate in film thickness as an indicator of the heat resistance.

$$ML=\{(m1-m2)/m1\}\times 100$$

In the expression, ML represents the reduction rate in film thickness (%), "m1" represents the film thickness (nm) after the backing at 350° C., and "m2" represents the film thickness (nm) after the backing at 450° C.

A smaller reduction rate in film thickness yields less sublimate and decomposed product of the organic film generated during the heating of the organic film, and the heat resistance is better. That is, it has been demonstrated that the smaller the reduction rate in film thickness, the higher the heat resistance. Table 8 shows the measurement results.

TABLE 8

| | Composition for forming organic film | Film thickness after baking at 350° C. (nm) | Film thickness after baking at 450° C. (nm) | Reduction rate in film thickness (%) |
|---|---|---|---|---|
| Example 7-1 | UDL-1 | 1938 | 1918 | 1.0 |
| Example 7-2 | UDL-2 | 1929 | 1915 | 0.7 |
| Example 7-3 | UDL-3 | 1942 | 1899 | 2.2 |
| Example 7-4 | UDL-4 | 1945 | 1903 | 2.2 |
| Example 7-5 | UDL-5 | 1856 | 1823 | 1.8 |
| Example 7-6 | UDL-6 | 1929 | 1910 | 1.0 |
| Example 7-7 | UDL-7 | 1847 | 1823 | 1.3 |
| Example 7-8 | UDL-8 | 1921 | 1905 | 0.8 |
| Example 7-9 | UDL-9 | 1882 | 1855 | 1.4 |

TABLE 8-continued

| | Composition for forming organic film | Film thickness after baking at 350° C. (nm) | Film thickness after baking at 450° C. (nm) | Reduction rate in film thickness (%) |
|---|---|---|---|---|
| Example 7-10 | UDL-10 | 1930 | 1912 | 0.9 |
| Example 7-11 | UDL-11 | 1940 | 1891 | 2.5 |
| Example 7-12 | UDL-12 | 1940 | 1917 | 1.2 |
| Example 7-13 | UDL-13 | 1944 | 1905 | 2.0 |
| Example 7-14 | UDL-14 | 1939 | 1918 | 1.1 |
| Example 7-15 | UDL-15 | 1944 | 1901 | 2.2 |
| Comparative Example 7-1 | Comparative UDL-1 | 1950 | 1764 | 9.5 |
| Comparative Example 7-2 | Comparative UDL-2 | 1920 | 1887 | 1.7 |
| Comparative Example 7-3 | Comparative UDL-3 | 1928 | 1865 | 3.3 |
| Comparative Example 7-4 | Comparative UDL-4 | 1932 | 1871 | 3.2 |
| Comparative Example 7-5 | Comparative UDL-5 | 1911 | 1849 | 3.2 |

As shown in Table 8, Examples 7-1 to 7-15, which use the inventive UDL-1 to 15 to form the organic film, reduce the reduction rate in film thickness to 3% or less, and the heat resistance is found to be excellent. With comparing Example 7-1 and Comparative Example 7-2, Example 7-3 and Comparative Example 7-3, and Example 7-4 and Comparative Example 7-4, which have the same substituent structure, comparison of the etching resistance using the same substituent structure finds that the compounds having the sumanene structure have further excellent heat resistance. As comparison between the sumanene compounds, comparing Example 7-4 and Comparative Example 7-5 demonstrates that Example 7-4 has further excellent heat resistance. It has been also confirmed that the propargyl group introduced in the present invention is effective.

Examples 8-1 to 8-15 and Comparative Examples 8-1 to 8-5

(Coatability Test)

Each of the compositions for forming an organic film (UDL-1 to 15 and Comparative UDL-1 to 5) was applied on a Bare-Si substrate, a hexamethyldisilazane (HMDS)-treated substrate, or a SiON-treated substrate, shown in Table 9. The composition was baked in the atmosphere at 350° C. for 60 seconds to form an organic film with 200 nm in film thickness. The formed organic film was observed by using an optical microscope (ECLIPSE L200, manufactured by NIKON CORPORATION) to check absence of abnormal coating. Table 9 shows the check results.

TABLE 9

| | Composition for forming organic film | Bare-Si substrate | HMDS-treated substrate | SiON substrate |
|---|---|---|---|---|
| Example 8-1 | UDL-1 | No abnormality | No abnormality | No abnormality |
| Example 8-2 | UDL-2 | No abnormality | No abnormality | No abnormality |
| Example 8-3 | UDL-3 | No abnormality | No abnormality | No abnormality |
| Example 8-4 | UDL-4 | No abnormality | No abnormality | No abnormality |
| Example 8-5 | UDL-5 | No abnormality | No abnormality | No abnormality |
| Example 8-6 | UDL-6 | No abnormality | No abnormality | No abnormality |
| Example 8-7 | UDL-7 | No abnormality | No abnormality | No abnormality |
| Example 8-8 | UDL-8 | No abnormality | No abnormality | No abnormality |
| Example 8-9 | UDL-9 | No abnormality | No abnormality | No abnormality |
| Example 8-10 | UDL-10 | No abnormality | No abnormality | No abnormality |
| Example 8-11 | UDL-11 | No abnormality | No abnormality | No abnormality |
| Example 8-12 | UDL-12 | No abnormality | No abnormality | No abnormality |
| Example 8-13 | UDL-13 | No abnormality | No abnormality | No abnormality |
| Example 8-14 | UDL-14 | No abnormality | No abnormality | No abnormality |
| Example 8-15 | UDL-15 | No abnormality | No abnormality | No abnormality |
| Comparative Example 8-1 | Comparative UDL-1 | No abnormality | Pinhole defect | Pinhole defect |
| Comparative Example 8-2 | Comparative UDL-2 | No abnormality | Pinhole defect | Pinhole defect |
| Comparative Example 8-3 | Comparative UDL-3 | No abnormality | Pinhole defect | Pinhole defect |
| Comparative Example 8-4 | Comparative UDL-4 | No abnormality | Pinhole defect | Pinhole defect |
| Comparative Example 8-5 | Comparative UDL-5 | No abnormality | No abnormality | No abnormality |

As shown in Table 9, Examples 8-1 to 8-15, which use the inventive UDL-1 to UDL-15 to form the organic film, can form a uniform organic film having no coating abnormality without substrate dependency. In Comparative Examples 8-1 to 8-4, a pinhole defect occurs except for the Bare-Si substrate. Comparative Example 8-5 can form a film without the substrate dependency, and the effect of improving the film formability by introducing the sumanene structure can be confirmed.

As above, the inventive resist organic material film material has high etching resistance and excellent twisting resistance during etching, and is thereby extremely useful as the organic film for the multilayer resist process, particularly the three-layer resist process, for ultrafine pattern processing with high precision.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A composition for forming an organic film, comprising:

a compound represented by the following general formula (1); and an organic solvent, (1)

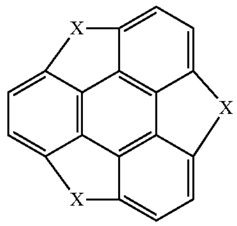

wherein in the general formula (1), X represents any one group of X1 to X3 represented by the following general formulae (2), (3), and (5), and two or more kinds of X are optionally used in combination, (2)

X1 = 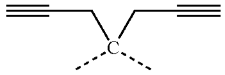

(3)

X2 = 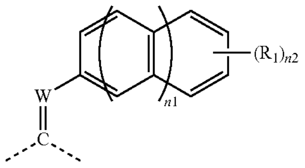

wherein in the general formula (3), W represents a carbon atom or a nitrogen atom; "n1" represents 0 or 1; "n2" represents an integer of 1 to 3; and $R_1$ independently represents any one of groups represented by the following general formula (4), and (4)

$R_1$ = 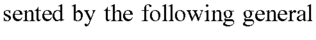

-continued

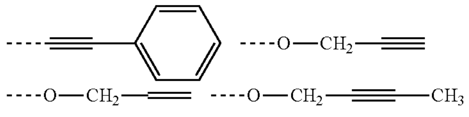

(5)

X3 = 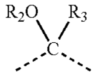

wherein in the general formula (5), $R_2$ represents a hydrogen atom or an alkyl group having 1 to 4 carbon atoms; and $R_3$ represents any one of the following groups.

$R_3$ = 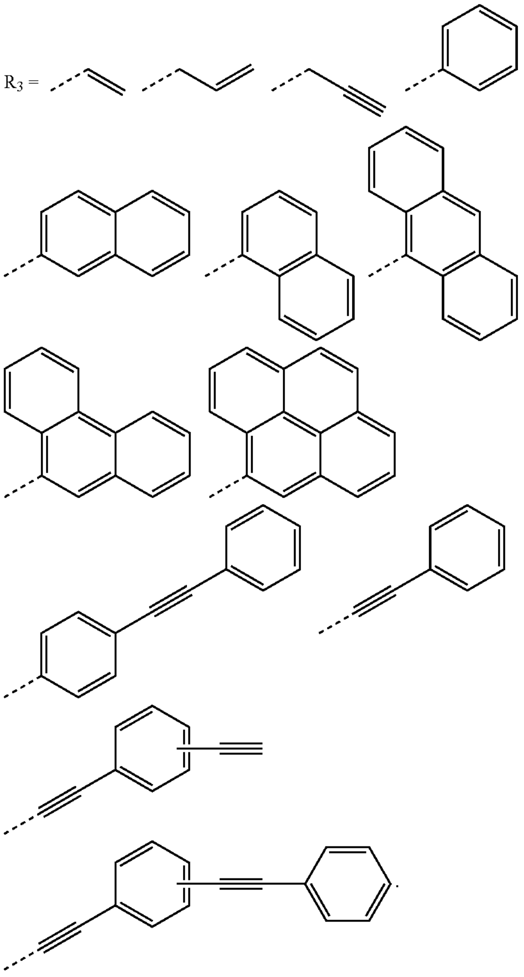

2. The composition for forming an organic film according to claim 1, wherein the compound represented by the general formula (1) satisfies 1.00≤Mw/Mn≤1.15 where Mw is a weight-average molecular weight and Mn is a number-average molecular weight measured by gel permeation chromatography in terms of polystyrene.

3. The composition for forming an organic film according to claim 1, wherein the organic solvent is a mixture of: one or more kinds of organic solvent having a boiling point of lower than 180° C.; and one or more kinds of organic solvent having a boiling point of 180° C. or higher.

4. The composition for forming an organic film according to claim 2, wherein the organic solvent is a mixture of: one or more kinds of organic solvent having a boiling point of lower than 180° C.; and one or more kinds of organic solvent having a boiling point of 180° C. or higher.

5. The composition for forming an organic film according to claim 1, further comprising at least one of a surfactant and a plasticizer.

6. The composition for forming an organic film according to claim 2, further comprising at least one of a surfactant and a plasticizer.

7. The composition for forming an organic film according to claim 3, further comprising at least one of a surfactant and a plasticizer.

8. The composition for forming an organic film according to claim 4, further comprising at least one of a surfactant and a plasticizer.

9. A patterning process, comprising:

forming an organic film on a body to be processed by using the composition for forming an organic film according to claim 1;

forming a silicon-containing resist intermediate film on the organic film by using a silicon-containing resist intermediate film material;

forming a resist upper layer film on the silicon-containing resist intermediate film by using a photoresist composition;

forming a circuit pattern in the resist upper layer film;

transferring the pattern to the silicon-containing resist intermediate film by etching while using the resist upper layer film having the formed pattern as a mask;

transferring the pattern to the organic film by etching while using the silicon-containing resist intermediate film having the transferred pattern as a mask; and further forming a pattern to the body to be processed by etching while using the organic film having the transferred pattern as a mask.

10. A patterning process, comprising:

forming an organic film on a body to be processed by using the composition for forming an organic film according to claim 1;

forming a silicon-containing resist intermediate film on the organic film by using a silicon-containing resist intermediate film material;

forming an organic anti-reflective film, BARC, on the silicon-containing resist intermediate film;

forming a resist upper layer film on the BARC by using a photoresist composition to form a four-layer film structure;

forming a circuit pattern in the resist upper layer film;

transferring the pattern to the BARC film and the silicon-containing resist intermediate film by etching while using the resist upper layer film having the formed pattern as a mask;

transferring the pattern to the organic film by etching while using the silicon-containing resist intermediate film having the transferred pattern as a mask; and further forming a pattern to the body to be processed by etching the body to be processed while using the organic film having the transferred pattern as a mask.

11. A patterning process, comprising:

forming an organic film on a body to be processed by using the composition for forming an organic film according to claim 1;

forming an inorganic hard mask selected from a silicon oxide film, a silicon nitride film, and a silicon oxynitride film on the organic film;

forming a resist upper layer film on the inorganic hard mask by using a photoresist composition;

forming a circuit pattern in the resist upper layer film;

transferring the pattern to the inorganic hard mask by etching while using the resist upper layer film having the formed pattern as a mask;

transferring the pattern to the organic film by etching while using the inorganic hard mask having the transferred pattern as a mask; and further forming a pattern to the body to be processed by etching the body to be processed while using the organic film having the transferred pattern as a mask.

12. A patterning process, comprising:

forming an organic film on a body to be processed by using the composition for forming an organic film according to claim 1;

forming an inorganic hard mask selected from a silicon oxide film, a silicon nitride film, and a silicon oxynitride film on the organic film;

forming an organic anti-reflective film, BARC, on the inorganic hard mask;

forming a resist upper layer film on the BARC by using a photoresist composition to form a four-layer film structure;

forming a circuit pattern in the resist upper layer film;

transferring the pattern to the BARC film and the inorganic hard mask by etching while using the resist upper layer film having the formed pattern as a mask;

transferring the pattern to the organic film by etching while using the inorganic hard mask having the transferred pattern as a mask; and further forming a pattern to the body to be processed by etching the body to be processed while using the organic film having the transferred pattern as a mask.

13. The patterning process according to claim 11, wherein the inorganic hard mask is formed by a CVD method or an ALD method.

14. The patterning process according to claim 12, wherein the inorganic hard mask is formed by a CVD method or an ALD method.

15. The patterning process according to claim 9, wherein the circuit pattern is formed by a photolithography using light having a wavelength of 10 nm or more and 300 nm or less, a direct writing with electron beam, nanoimprinting, or a combination thereof.

16. The patterning process according to claim 10, wherein the circuit pattern is formed by a photolithography using light having a wavelength of 10 nm or more and 300 nm or less, a direct writing with electron beam, nanoimprinting, or a combination thereof.

17. The patterning process according to claim 9, wherein the circuit pattern is developed with an alkaline development or an organic solvent.

18. The patterning process according to claim 9, wherein the body to be processed is a semiconductor device substrate, a metal film, a metal carbide film, a metal oxide film, a metal nitride film, a metal oxycarbide film, or a metal oxynitride film.

19. The patterning process according to claim 18, wherein the metal is silicon, titanium, tungsten, hafnium, zirconium, chromium, germanium, copper, silver, gold, aluminum, indium, gallium, arsenic, palladium, iron, tantalum, iridium, molybdenum, or an alloy thereof.

20. A compound represented by the following general formula (1), (1)

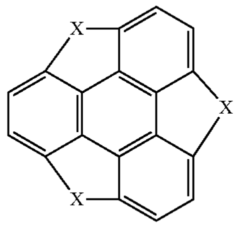

wherein in the general formula (1), X represents any one group of X1 to X3 represented by the following general formulae (2), (3), and (5), and two or more kinds of X are optionally used in combination, (2)

X1 = 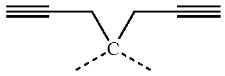

(3)

X2 = 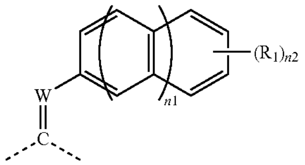

wherein in the general formula (3), W represents a carbon atom or a nitrogen atom; "n1" represents 0 or 1; "n2" represents an integer of 1 to 3; and $R_1$ independently represents any one of groups represented by the following general formula (4), and (4)

$R_1$ = 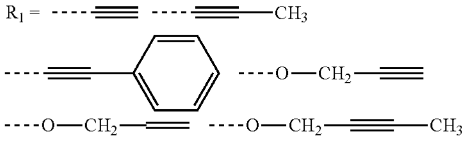

(5)

X3 = 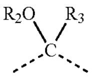

wherein in the general formula (5), $R_2$ represents a hydrogen atom or an alkyl group having 1 to 4 carbon atoms; and $R_3$ represents any one of the following groups $R_3$ = 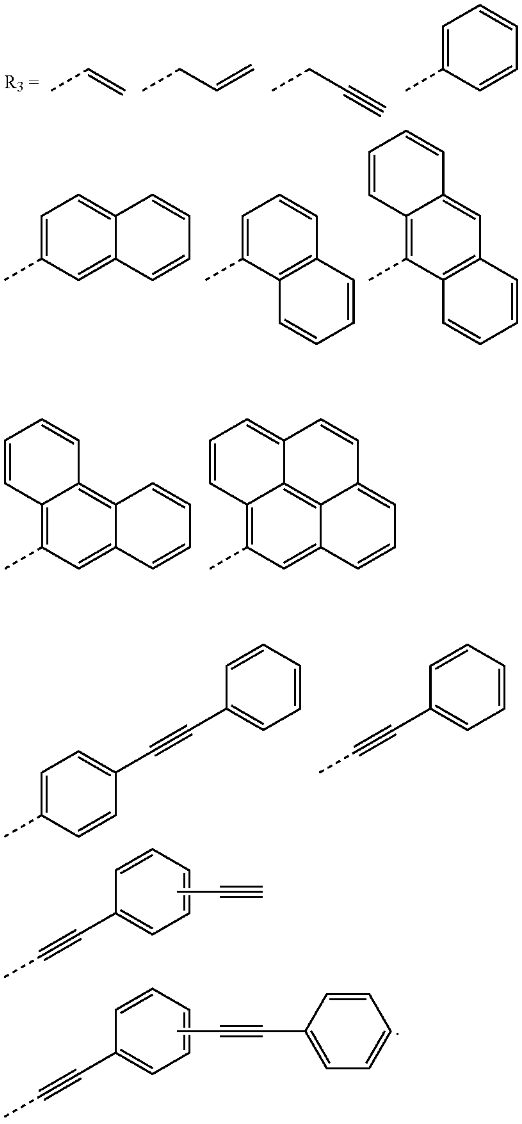

* * * * *